(12) United States Patent
Bae et al.

(10) Patent No.: US 12,369,463 B2
(45) Date of Patent: Jul. 22, 2025

(54) DISPLAY DEVICE AND METHOD OF MANUFACTURING THE DISPLAY DEVICE

(71) Applicant: SAMSUNG DISPLAY CO., LTD., Yongin-si (KR)

(72) Inventors: Subin Bae, Yongin-si (KR); Dawoon Jung, Yongin-si (KR); Yugwang Jeong, Yongin-si (KR); Sungwon Cho, Yongin-si (KR); Myounggeun Cha, Yongin-si (KR); Sanggun Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 591 days.

(21) Appl. No.: 17/690,129

(22) Filed: Mar. 9, 2022

(65) Prior Publication Data
US 2023/0023524 A1     Jan. 26, 2023

(30) Foreign Application Priority Data

Jul. 26, 2021   (KR) .................. 10-2021-0098111

(51) Int. Cl.
*H01L 27/32*     (2006.01)
*H10K 59/121*    (2023.01)
(Continued)

(52) U.S. Cl.
CPC ......... *H10K 59/126* (2023.02); *H10K 59/121* (2023.02); *H10K 59/1213* (2023.02);
(Continued)

(58) Field of Classification Search
CPC ....... H10K 59/121; H10K 59/65; H10K 71/00
(Continued)

(56) References Cited

U.S. PATENT DOCUMENTS

| 8,822,999 B2 | 9/2014 | Choi et al. |
| 9,634,074 B2 | 4/2017 | Son et al. |

(Continued)

FOREIGN PATENT DOCUMENTS

| KR | 1020160096760 A | 8/2016 |
| KR | 1020170055587 A | 5/2017 |

(Continued)

*Primary Examiner* — Dzung Tran
(74) *Attorney, Agent, or Firm* — CANTOR COLBURN LLP

(57) ABSTRACT

A display device includes: a substrate including a display area including a first pixel area, a component area adjacent to the display area, and a non-display area adjacent to the display area, where the component area includes a second pixel area and a transmission area, and the non-display area includes a bending area; a first inorganic layer continuously arranged in the transmission area on the substrate, where a lower opening overlapping the bending area is defined through the first inorganic layer; a blocking layer on the first inorganic layer, a blocking layer opening overlapping the transmission area and an intermediate opening overlapping the lower opening are defined through the blocking layer; and a display element layer on the blocking layer, where the display element layer includes a first display element overlapping the first pixel area and a second display element overlapping the second pixel area.

11 Claims, 42 Drawing Sheets

(51) Int. Cl.
  *H10K 59/126* (2023.01)
  *H10K 59/65* (2023.01)
  *H10K 71/00* (2023.01)
  *H10D 30/67* (2025.01)
  *H10D 86/40* (2025.01)
  *H10D 86/60* (2025.01)
  *H10K 59/12* (2023.01)

(52) U.S. Cl.
  CPC ............ *H10K 59/65* (2023.02); *H10K 71/00* (2023.02); *H10D 30/6723* (2025.01); *H10D 30/6731* (2025.01); *H10D 30/6745* (2025.01); *H10D 30/6755* (2025.01); *H10D 86/423* (2025.01); *H10D 86/471* (2025.01); *H10D 86/481* (2025.01); *H10D 86/60* (2025.01); *H10K 59/1201* (2023.02)

(58) Field of Classification Search
  USPC .......................................................... 257/40
  See application file for complete search history.

(56) References Cited

U.S. PATENT DOCUMENTS

| | | | |
|---|---|---|---|
| 10,170,525 | B2 | 1/2019 | Lee et al. |
| 10,236,309 | B2 | 3/2019 | Kim |
| 10,672,802 | B2 | 6/2020 | Lee et al. |
| 11,594,587 | B2 | 2/2023 | Son et al. |
| 2012/0267611 | A1* | 10/2012 | Chung ................. H10K 59/126 257/E27.118 |
| 2014/0232956 | A1* | 8/2014 | Kwon ................... H01L 27/124 349/12 |
| 2014/0306348 | A1* | 10/2014 | Ahn ..................... H05K 1/0281 257/773 |
| 2020/0273927 | A1* | 8/2020 | Oh ....................... H10K 59/121 |
| 2020/0303479 | A1 | 9/2020 | Kim et al. |
| 2020/0365674 | A1 | 11/2020 | Jeon et al. |
| 2021/0066421 | A1* | 3/2021 | Son ..................... H01L 27/1237 |
| 2021/0091157 | A1 | 3/2021 | Oh et al. |
| 2021/0167156 | A1* | 6/2021 | Sun ................... H01L 29/78633 |
| 2021/0280658 | A1* | 9/2021 | Chae .................... H10K 59/131 |
| 2021/0390905 | A1 | 12/2021 | Kim |

FOREIGN PATENT DOCUMENTS

| | | |
|---|---|---|
| KR | 101810047 B1 | 12/2017 |
| KR | 1020180041796 A | 4/2018 |
| KR | 1020190064716 A | 6/2019 |
| KR | 1020200102580 A | 9/2020 |
| KR | 1020200113055 A | 10/2020 |
| KR | 1020200131397 A | 11/2020 |
| KR | 1020210027654 A | 3/2021 |
| KR | 1020210155038 A | 12/2021 |

* cited by examiner

DISPLAY DEVICE AND METHOD OF MANUFACTURING THE DISPLAY DEVICE

This application claims priority to Korean Patent Application No. 10-2021-0098111, filed on Jul. 26, 2021, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

Recently, display devices are widely used in various fields, as display devices have become thinner and more lightweight.

In display devices, various functions have been connected or linked to the display devices by increasing the area occupied by a display area thereof. Accordingly, studies have been conducted into a display device having a component area for performing various functions while displaying an image to further increase the area and add various functions.

SUMMARY

One or more embodiments include a display device in which a light transmittance of a transmission area included in a component area is improved and reliability of the display device is improved, and a method of manufacturing the display device.

According to one or more embodiments, a display device includes a substrate including a display area including a first pixel area, a component area adjacent to the display area, and a non-display area adjacent to the display area, where the component area includes a second pixel area and a transmission area, and the non-display area includes a bending area, a first inorganic layer continuously arranged in the transmission area on the substrate, where a lower opening overlapping the bending area is defined through the first inorganic layer, a blocking layer on the first inorganic layer, where a blocking layer opening overlapping the transmission area and an intermediate opening overlapping the lower opening are defined through the blocking layer, and a display element layer on the blocking layer, where the display element layer includes a first display element overlapping the first pixel area and a second display element overlapping the second pixel area.

In an embodiment, the blocking layer may include amorphous silicon.

In an embodiment, a thickness of the first inorganic layer overlapping the transmission area may be less than a thickness of the first inorganic layer overlapping the second pixel area.

In an embodiment, the display device may further include a pixel circuit layer between the blocking layer and the display element layer. In such an embodiment, the pixel circuit layer may include a first semiconductor layer on the blocking layer, where the first semiconductor layer may include a silicon semiconductor, a first inorganic insulating layer on the first semiconductor layer, where a first insulating layer opening overlapping the blocking layer opening may be defined through the first inorganic insulating layer, a second semiconductor layer on the first inorganic insulating layer, where the second semiconductor layer may include an oxide semiconductor, and a second inorganic insulating layer on the second semiconductor layer, where a second insulating layer opening overlapping the blocking layer opening may be defined through the second inorganic insulating layer.

In an embodiment, the pixel circuit layer may further include a semiconductor pattern between the blocking layer and the first inorganic insulating layer and overlapping the transmission area, and the semiconductor pattern and the first semiconductor layer may include a same material as each other.

In an embodiment, the pixel circuit layer may further include a semiconductor pattern between the first inorganic insulating layer and the second inorganic insulating layer and overlapping the transmission area, and the semiconductor pattern and the second semiconductor layer may include a same material as each other.

In an embodiment, the second insulating layer opening may include an upper insulating layer opening and a lower insulating layer opening closer to the first inorganic layer than the upper insulating layer opening, and a size of the upper insulating layer opening may be less than a size of the lower insulating layer opening.

In an embodiment, the display device may further include a pixel circuit layer between the blocking layer and the display element layer. In such an embodiment, the pixel circuit layer may include a first metal layer overlapping the first pixel area and having a first thickness, a second metal layer overlapping the second pixel area and having a second thickness which is different from the first thickness, a lower blocking layer under the second metal layer, and a second inorganic layer through which an inorganic layer opening overlapping the transmission area is defined, one of the first metal layer and the second metal layer may be between the blocking layer and the second inorganic layer, and the other of the first metal layer and the second metal layer may be on the second inorganic layer.

In an embodiment, the first metal layer may be on the second inorganic layer, the second metal layer may be between the blocking layer and the second inorganic layer, and the lower blocking layer and the blocking layer may be provided as a single unitary body.

In an embodiment, the pixel circuit layer may further include a lower inorganic layer between the lower blocking layer and the second metal layer, a lower inorganic layer opening overlapping the transmission area may be defined through the lower inorganic layer, and the lower inorganic layer may be between the blocking layer and the second inorganic layer in the first pixel area.

In an embodiment, the display device may further include a component overlapping the component area.

According to one or more embodiments, a display device includes a substrate including a display area including a first pixel area, and a component area adjacent to the display area, where the component area includes a second pixel area and a transmission area, a first inorganic layer on the substrate and continuously in the transmission area, a blocking layer on the first inorganic layer, where a blocking layer opening overlapping the transmission area is defined through the blocking layer, a pixel circuit layer on the blocking layer, where the pixel circuit layer includes a semiconductor pattern overlapping the transmission area, and a display element layer on the pixel circuit layer, where the display element layer includes a first display element overlapping the first pixel area, and a second display element overlapping the second pixel area.

In an embodiment, the pixel circuit layer may further include a first semiconductor layer on the blocking layer, where the first semiconductor layer may include a silicon semiconductor, a first inorganic insulating layer on the first semiconductor layer, where a first insulating layer opening overlapping the blocking layer opening may be defined through the first inorganic insulating layer, a second semiconductor layer on the first inorganic insulating layer, where the second semiconductor layer may include an oxide semiconductor, and a second inorganic insulating layer on the second semiconductor layer, where a second inorganic layer opening overlapping the blocking layer opening may be defined through the second inorganic insulating layer, the semiconductor pattern may be between the blocking layer and the first inorganic insulating layer, and the semiconductor pattern and the first semiconductor layer may include a same material as each other.

In an embodiment, the pixel circuit layer may further include a first semiconductor layer on the blocking layer, where the first semiconductor layer may include a silicon semiconductor, a first inorganic insulating layer on the first semiconductor layer, where a first insulating layer opening overlapping the blocking layer opening may be defined through the first inorganic insulating layer, a second semiconductor layer on the first inorganic insulating layer, where the second semiconductor layer may include an oxide semiconductor, and a second inorganic insulating layer on the second semiconductor layer, where a second inorganic layer opening overlapping the blocking layer opening may be defined through the second inorganic insulating layer, the semiconductor pattern may be between the first inorganic insulating layer and the second inorganic insulating layer, and the semiconductor pattern and the second semiconductor layer may include a same material as each other.

According to one or more embodiments, a method of manufacturing a display device includes preparing a display substrate including a substrate and a first inorganic layer on the substrate, where the substrate includes a display area including a first pixel area, a component area including a second pixel area and a transmission area, and a non-display area including a bending area, providing a blocking layer on the first inorganic layer, and forming a blocking layer opening overlapping the transmission area and an intermediate opening overlapping the bending area through the blocking layer, and forming a lower opening through the first inorganic layer, where the lower opening overlaps the intermediate opening, and the first inorganic layer remains in the transmission area.

In an embodiment, the method may further include providing a first semiconductor layer on the blocking layer, the first semiconductor layer including a silicon semiconductor, providing a first inorganic insulating layer on the first semiconductor layer, providing a second semiconductor layer on the first inorganic insulating layer, where the second semiconductor layer may include an oxide semiconductor, providing a second inorganic insulating layer on the second semiconductor layer, providing an interlayer insulating layer on the second inorganic insulating layer, and forming an interlayer insulating layer opening through the interlayer insulating layer, where the interlayer insulating layer may overlap the transmission area. In such an embodiment, the forming the interlayer insulating layer opening may include exposing at least a portion of the first semiconductor layer by removing at least a portion of each of the first inorganic insulating layer, the second inorganic insulating layer, and the interlayer insulating layer.

In an embodiment, the method may further include providing a semiconductor pattern on the blocking layer, where the semiconductor pattern may overlap the transmission area. In such an embodiment, the semiconductor pattern and the first semiconductor layer may be formed in a same process, the forming the interlayer insulating layer opening may further include exposing at least a portion of the semiconductor pattern by removing at least a portion of each of the first inorganic insulating layer, the second inorganic insulating layer, and the interlayer insulating layer and the forming of blocking layer opening and the intermediate opening through the blocking layer and the forming of the lower opening through the first inorganic layer may include removing at least a portion of the semiconductor pattern.

In an embodiment, the method may further include providing a semiconductor pattern on the blocking layer, where the semiconductor pattern may overlap the transmission area. In such an embodiment, the semiconductor pattern and the second semiconductor layer may be formed in a same process.

In an embodiment, the method may further include removing at least a portion of the semiconductor pattern by wet etching.

In an embodiment, the forming the blocking layer opening and the intermediate opening through the blocking layer and the forming the lower opening through the first inorganic layer may include exposing at least a portion of the second semiconductor layer by removing at least a portion of the interlayer insulating layer.

In an embodiment, the method may further include providing a first metal layer on the blocking layer, where the first metal layer may overlap the first pixel area, providing a lower blocking layer on the blocking layer, where the lower blocking layer may overlap the second pixel area, providing a lower inorganic layer on the lower blocking layer, and providing a second metal layer on the lower inorganic layer.

In an embodiment, the method may further include providing a second inorganic layer covering the second metal layer, where the first metal layer may be formed after the second inorganic layer is formed, and the blocking layer and the lower blocking layer may be formed in a same process.

In an embodiment, the providing the second metal layer may include providing a metal material-containing layer on the lower inorganic layer, and removing at least a portion of the metal material-containing layer, and after the second metal layer is formed, at least a portion of an upper surface of the lower inorganic layer may be exposed.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1A:
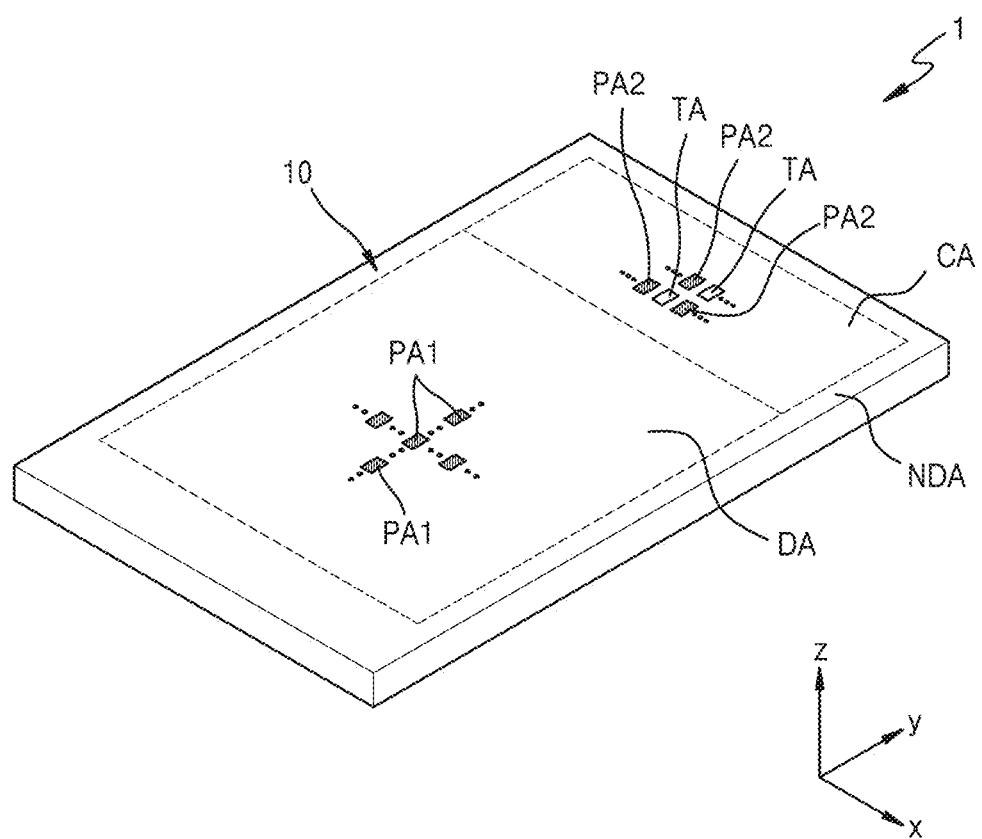
FIG. 1A is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be further understood that, when a layer, region, or element is referred to as being "on" another layer, region, or element, it can be directly or indirectly on the other layer, region, or element. That is, for example, intervening layers, regions, or elements may be present. In contrast, when an element is referred to as being "directly on" another element, there are no intervening elements present.

Also, sizes of elements in the drawings may be exaggerated or reduced for convenience of explanation. For example, because sizes and thicknesses of elements in the drawings are arbitrarily illustrated for convenience of illustration, the disclosure is not limited thereto.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

Hereinafter, embodiments will be described in detail with reference to the accompanying drawings. When describing embodiments with reference to the accompanying drawings, the same or corresponding elements are denoted by the same reference numerals and redundant descriptions thereof are omitted.

In embodiments of the invention, a display device is configured to display an image, and may be a portable mobile device such as a game console, a multimedia device, or an ultra-compact personal computer ("PC"). A display device to be described below may include a liquid crystal display, an electrophoretic display, an organic light-emitting display, an inorganic electroluminescence ("EL") display (inorganic light-emitting display), a field emission display, a surface-conduction electron-emitter display, a quantum dot display, a plasma display, a cathode ray display, and the like.

Figure 1B:
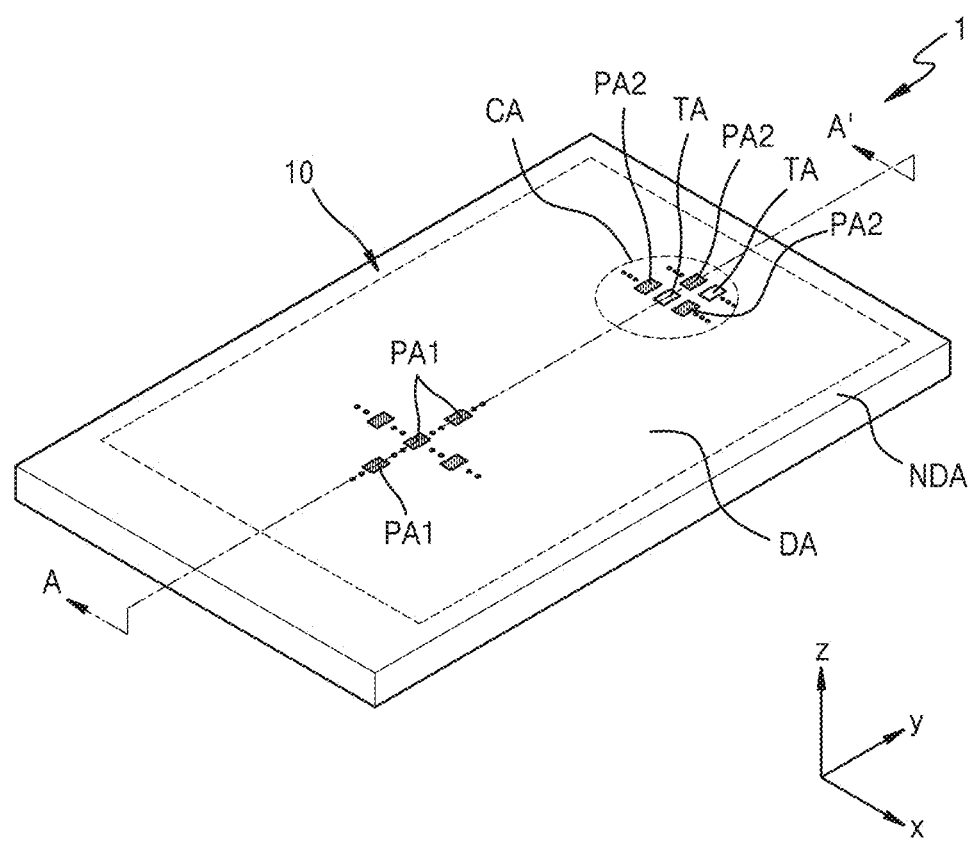
FIG. 1B is a perspective view schematically illustrating a display device according to an alternative embodiment.

FIG. 1A is a perspective view schematically illustrating a display device 1 according to an embodiment. FIG. 1B is a perspective view schematically illustrating a display device 1 according to an alternative embodiment.

Referring to FIG. 1A, an embodiment of the display device 1 may include a display panel 10. The display panel 10 may include a display area DA, a component area CA, and a non-display area NDA.

The display device 1 may display an image in the display area DA. The display area DA may be defined on a plane defined by an x-axis direction (or a first direction) and an y-axis direction (or a second direction). Here, a z-axis direction may be a direction perpendicular to the x-axis direction and the y-axis direction, or a thickness direction of the display device 1. The display area DA may include a first pixel area PA1. A plurality of first pixel areas PA1 may be provided in the display area DA. A display element may be in the first pixel area PA1. In an embodiment, one display element may be in the first pixel area PA1. In an alternative embodiment, a plurality of display elements may be in the first pixel area PA1.

The display device 1 may display an image in the component area CA which components (not illustrated) overlap. In an embodiment, the component area CA may be at least partially surrounded by the display area DA. In such an embodiment, the component area CA may be adjacent to the display area DA. Although FIG. 1A illustrates an embodiment where the component area CA is in a bar type at one side of the display area DA, the component area CA may be in a notch type at one side of the display area DA. In an alternative embodiment, the component area CA may be variously defined inside the display area DA.

The component area CA may include a second pixel area PA2 and a transmission area TA. The component is under the display panel 10 as described below, and may include a sensor or a camera using infrared rays, visible rays, or sound. A plurality of second pixel areas PA2 and a plurality of transmission areas TA may be provided in the component area CA. A display element may be in the second pixel area PA2. In an embodiment, one display element may be in the second pixel area PA2. In an alternative embodiment, a plurality of display elements may be in the second pixel area PA2. The transmission area TA may be an area in which a display element is not arranged. Therefore, the light transmittance or sound transmittance in the component area CA may be greater than the light transmittance or sound transmittance in the display area DA.

The display device 1 may display a first image in the display area DA and may display a second image in the component area CA. In such an embodiment, the first image and the second image may be portions of one image provided by the display device 1. Alternatively, the first image and the second image may be images independent of each other.

The display device 1 may not display an image in the non-display area NDA. The non-display area NDA may be adjacent to the display area DA and/or the component area CA. In an embodiment, the non-display area NDA may completely surround the display area DA and the component area CA. A driver configured to provide an electric signal or power to the display element, etc. may be in the non-display area NDA. The non-display area NDA may include a pad area, which is an area to which an electronic element, a printed circuit board, or the like is electrically connected.

Referring to FIG. 1B, in an alternative embodiment, the component area CA may be completely surrounded by the display area DA. In such an embodiment, the component area CA may have a circular shape or an elliptical shape in a plan view. In an alternative embodiment, the component area CA may have a polygonal shape such as a rectangular shape in a plan view. In an alternative embodiment, the component area CA may include a curvature portion. In such embodiments, the positions and number of component areas CA may be variously changed. In an embodiment, for example, the display panel 10 may include a plurality of component areas CA spaced apart from each other.

Figure 2:
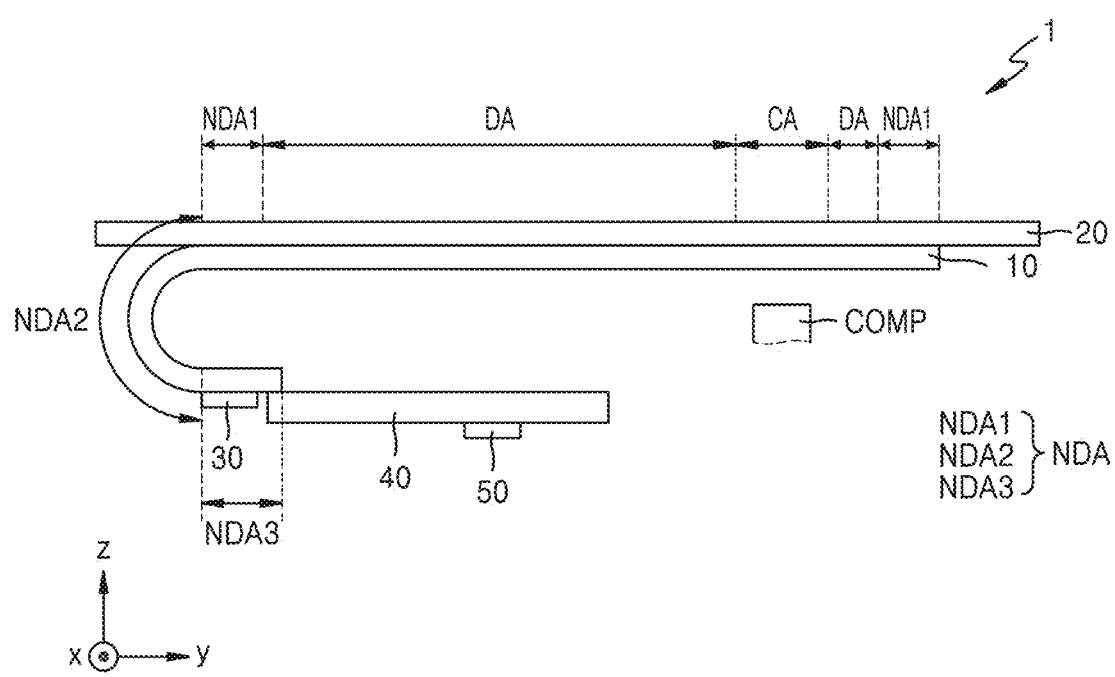
FIG. 2 is a schematic cross-sectional view of the display device taken along line A-A' of FIG. 1B, according to an embodiment.

FIG. 2 is a schematic cross-sectional view of the display device 1 taken along line A-A' of FIG. 1B, according to an embodiment. In FIG. 2, the same reference numerals as those of FIG. 1B denote the same elements, and thus, any repetitive detailed descriptions thereof may be omitted.

Referring to FIG. 2, an embodiment of the display device 1 may include a display panel 10, a cover window 20, a display driver 30, a display circuit board 40, a touch sensor driver 50, and a component COMP.

The display panel 10 may include a display area DA, a component area CA, and a non-display area NDA. The display device 1 may display an image in the display area DA and the component area CA. The component area CA may overlap the component COMP in a plan view or in the z-axis direction.

The non-display area NDA may include a first non-display area NDA1, a second non-display area NDA2, and a third non-display area NDA3. The first non-display area NDA1 may be adjacent to the display area DA. The second non-display area NDA2 may be adjacent to the first non-display area NDA1. The second non-display area NDA2 may extend from the first non-display area NDA1. The second non-display area NDA2 may be a bending area, and the display panel 10 may be bent in the second non-display area NDA2. Therefore, a portion of the display panel 10 may face another portion of the display panel 10. The third non-display area NDA3 may be a pad area in which the display driver 30 and/or the display circuit board 40 are arranged. In an alternative embodiment, the second non-display area NDA2 may be omitted. In such an embodiment, the display panel 10 may not include a bending area, and the display panel 10 may not be bent.

The cover window 20 may be on the display panel 10. The cover window 20 may protect the display panel 10. The cover window 20 may include at least one selected from glass, sapphire, and plastic. The cover window 20 may include, for example, ultra thin glass ("UTG") or colorless polyimide ("CPI").

The display driver 30 may be in the third non-display area NDA3. The display driver 30 may be configured to receive control signals and power supply voltages and generate and output signals and voltages for driving the display panel 10. The display driver 30 may include an integrated circuit ("IC").

The display circuit board 40 may be electrically connected to the display panel 10. In an embodiment, for example, in the third non-display area NDA3, the display circuit board 40 may be electrically connected to the display panel 10 by an anisotropic conductive film. The display circuit board 40 may be a flexible printed circuit board ("FPCB") that is bendable or a rigid printed circuit board ("PCB") that is hard and not easily bent. Alternatively, the display circuit board 40 may be a composite PCB including both the rigid PCB and the FPCB.

The touch sensor driver 50 may be on the display circuit board 40. The touch sensor driver 50 may include an IC. The touch sensor driver 50 may be bonded on the display circuit board 40. The touch sensor driver 50 may be electrically connected to sensor electrodes of a touch sensor layer included in the display panel 10 through the display circuit board 40.

The component COMP may overlap the component area CA. The component COMP may include an electronic element. In an embodiment, for example, the electronic element may include a sensor (e.g., an infrared sensor) configured to receive and use light, a camera configured to receive light to capture an image, a sensor configured to output and sense light or sound to measure a distance or recognize a fingerprint, a small lamp configured to output light, and/or a speaker configured to output sound. In an embodiment where the electronic element uses light, light of various wavelength bands, such as visible rays, infrared rays, and/or ultraviolet rays, may be used.

In an embodiment, the component COMP may include sub-components such as a light emitter and a light receiver. The light emitter and the light receiver may have an integrated structure or a physically separated structure so that a pair of light emitter and light receiver constitute or collectively define a single component COMP.

FIGS. 3A to 3D are cross-sectional views schematically illustrating a portion of a display device 1, according to an embodiment.

Referring to FIGS. 3A to 3D, an embodiment of the display device 1 may include a display panel 10 and a component COMP. The component COMP may overlap the display panel 10. The display panel 10 may include a substrate 100, a first inorganic layer 101, a blocking layer 103, a display layer DSL, an encapsulation layer ENL, a touch sensor layer TSL, and an optical function layer OFL, and a lower protective film PB. The display layer DSL, the encapsulation layer ENL, the touch sensor layer TSL, and the optical function layer OFL may be on the substrate 100. The lower protective film PB may be under the substrate 100.

Areas of the display panel 10 may be defined in the substrate 100 and/or a multilayer film. In an embodiment, for example, the substrate 100 may include a display area DA, a component area CA, and a non-display area NDA. Hereinafter, an embodiment in which the display area DA, the component area CA, and the non-display area NDA are defined in the substrate 100 will be described in detail.

The display area DA may include a first pixel area PA1. The component area CA may be adjacent to the display area DA. The component area CA may include a second pixel area PA2 and a transmission area TA.

In an embodiment, the substrate 100 may include an organic material. In such an embodiment, the substrate 100 may include an organic layer. The substrate 100 may include a polymer resin such as polyethersulfone, polyacrylate, polyetherimide, polyethylene naphthalate, polyethylene terephthalate, polyphenylene sulfide, polyimide, polycarbonate, or cellulose acetate propionate. In an alternative embodiment, the substrate 100 may include glass.

The first inorganic layer 101 may be on the substrate 100. The first inorganic layer 101 may overlap the first pixel area PA1, the second pixel area PA2, and the transmission area TA. In an embodiment, the first inorganic layer 101 may be continuously arranged in the first pixel area PA1, the second pixel area PA2, and the transmission area TA. In such an embodiment, the first inorganic layer 101 may not include an opening in the transmission area TA, that is, no opening is defined through the first inorganic layer 101. Therefore, infiltration of moisture or foreign material into the second pixel area PA2 through the transmission area TA may be effectively prevented or substantially reduced. In an embodiment, where the substrate 100 includes an organic material, deterioration of a second display element DPE2 due to outgassing of the substrate 100 may be effectively prevented or substantially reduced.

In an embodiment, a thickness 101t1 of a portion of the first inorganic layer 101 overlapping the transmission area TA may be less than a thickness 101t2 of another portion of the first inorganic layer 101 overlapping the second pixel area PA2. The thickness of the first inorganic layer 101 may be a distance from the lower surface of the first inorganic layer 101 facing the substrate 100 to the upper surface of the first inorganic layer 101 opposite to the lower surface of the first inorganic layer 101. Therefore, the first inorganic layer 101 may have a groove in the transmission area TA. The first inorganic layer 101 may include an inorganic material such as silicon nitride ($SiN_x$), silicon oxynitride (SiON), and/or silicon oxide ($SiO_2$), and may have a single layer structure or a multiple layer structure, each layer therein including at least selected from the above-described inorganic materials.

The blocking layer 103 may be on the first inorganic layer 101. The blocking layer 103 may include a material having an absorbance of about 90% or more (or a transmittance of about 10% or less) in the vicinity of a wavelength of about 300 nanometers (nm). The blocking layer 103 may include at least one selected from amorphous silicon ("a-Si"), polysilicon ("poly-Si"), crystalline silicon ("crystalline-Si"), zinc oxide (ZnO), and indium zinc oxide ("IZO").

In an embodiment, a semiconductor layer of a thin-film transistor TFT included in a pixel circuit layer PCL may include polysilicon. The polysilicon may be formed by forming an amorphous silicon-containing layer and then performing a laser crystallization process, for example, an excimer laser annealing ("ELA") process, on the amorphous silicon-containing layer. If the blocking layer 103 is not provided, foreign material may be on the amorphous silicon-containing layer, and ultraviolet rays are radiated to the foreign material, the substrate 100 under the amorphous silicon-containing layer may be damaged. In an embodiment, the blocking layer 103 is on the substrate 100, such that the arrival of the ultraviolet rays at the substrate 100 may be effectively prevented or substantially reduced even when foreign material is on the amorphous silicon-containing layer.

The blocking layer 103 may include a blocking layer opening 103OP, that is, the blocking layer opening 103OP is defined through the blocking layer 103. The blocking layer opening 103OP may overlap the transmission area TA. In an embodiment, the blocking layer opening 103OP may overlap the groove of the first inorganic layer 101. If the blocking layer 103 does not include the blocking layer opening 103OP, light transmittance of the display panel 10 in the transmission area TA may be reduced. In an embodiment, the blocking layer 103 includes the blocking layer opening 103OP overlapping the transmission area TA, such that the light transmittance of the display panel 10 in the transmission area TA may be increased.

The display layer DSL may be on the blocking layer 103. The display layer DSL may include the pixel circuit layer PCL including a plurality of pixel circuits and a display element layer DEL including a plurality of display elements DPE. The pixel circuit may include at least one thin-film transistor TFT. In an embodiment, the pixel circuits may be respectively connected to the display elements DPE.

The pixel circuit layer PCL may be between the blocking layer 103 and the display element layer DEL. The pixel circuit layer PCL may include a first metal layer BML1, a second inorganic layer 201, a second metal layer BML2, an insulating layer IL, and the thin-film transistor TFT.

The first metal layer BML1 may overlap the first pixel area PA1. The first metal layer BML1 may have a first thickness t1. The first thickness t1 may be a distance from the lower surface of the first metal layer BML1 facing the substrate 100 to the upper surface of the first metal layer BML1 opposite to the lower surface of the first metal layer BML1.

The first metal layer BML1 may prevent external light from reaching the thin-film transistor TFT. In an embodiment, a constant voltage or a signal may be applied to the first metal layer BML1, and the first metal layer BML1 may prevent or reduce damage to the pixel circuit due to electrostatic discharge. The first metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The first metal layer BML1 may have a single layer structure or a multiple layer structure, each layer therein including at least selected from the above-described materials.

The second metal layer BML2 may overlap the second pixel area PA2. The second metal layer BML2 may have a second thickness t2. The second thickness t2 may be a distance from the lower surface of the second metal layer BML2 facing the substrate 100 to the upper surface of the second metal layer BML2 opposite to the lower surface of the second metal layer BML2. In an embodiment, the second thickness t2 may be different from the first thickness t1. In an embodiment, for example, the second thickness t2 may be greater than the first thickness t1. In an alternative embodiment, the second thickness t2 may be less than the first thickness t1. In an alternative embodiment, the second thickness t2 may be equal to the first thickness t1.

The second metal layer BML2 may prevent external light from reaching the thin-film transistor TFT. In an embodiment, a constant voltage or a signal may be applied to the second metal layer BML2, and the second metal layer BML2 may prevent or reduce damage to the pixel circuit due to electrostatic discharge. The second metal layer BML2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The second metal layer BML2 may have a single layer structure or a multiple layer structure, each layer therein including at least selected from the above-described materials.

The second inorganic layer 201 may be on the blocking layer 103. The second inorganic layer 201 may overlap the first pixel area PA1 and the second pixel area PA2. In an embodiment, the second inorganic layer 201 may include an inorganic layer opening 201OP overlapping the transmission area TA, that is, the inorganic layer opening 201OP is defined through the second inorganic layer 201. The inorganic layer opening 201OP may overlap the blocking layer opening 103OP. The second inorganic layer 201 may include an inorganic material such as silicon nitride ($SiN_x$), silicon oxynitride (SiON), and/or silicon oxide ($SiO_2$), and may have a single layer structure or a multiple layer structure, each layer therein including at least selected from the above-described inorganic materials.

In an embodiment, one of the first metal layer BML1 and the second metal layer BML2 may be between the blocking layer 103 and the second inorganic layer 201. In such an embodiment, the other of the first metal layer BML1 and the second metal layer BML2 may be on the second inorganic layer 201. In an embodiment, for example, the first metal layer BML1 may be between the blocking layer 103 and the second inorganic layer 201. In such an embodiment, the second metal layer BML2 may be on the second inorganic layer 201. In an alternative embodiment, for example, the first metal layer BML1 may be on the second inorganic layer 201. In such an embodiment, the second metal layer BML2 may be between the blocking layer 103 and the second inorganic layer 201.

In an embodiment, the first metal layer BML1 and the second metal layer BML2 may be on a same plane or in a same layer as each other. In an embodiment, for example, the first metal layer BML1 and the second metal layer BML2 may be between the blocking layer 103 and the second inorganic layer 201. In an alternative embodiment, for example, the first metal layer BML1 and the second metal layer BML2 may be on the second inorganic layer 201.

The thin-film transistor TFT and the insulating layer IL may be on the second inorganic layer 201. In an embodiment, the thin-film transistor TFT may be provided in plural, that is, a plurality of thin-film transistors TFT may be provided on the second inorganic layer 201. The plurality of thin-film transistors TFT may overlap the first pixel area PA1 and the second pixel area PA2. The thin-film transistor TFT may not overlap the transmission area TA. In an embodiment, the insulating layer IL may include an inorganic insulating layer including an inorganic material and/or an organic insulating layer including an organic material.

The display element layer DEL may be on the pixel circuit layer PCL. In an embodiment, the display element layer DEL may be on the blocking layer 103. The display element layer DEL may include the display element DPE. The display element DPE may include an organic light-emitting diode including an organic emission layer. Alternatively, the display element DPE may include a light-emitting diode ("LED"). The size of the LED may be on a micro scale or a nano scale. In an embodiment, for example, the LED may include a micro LED. Alternatively, the LED may include a nanorod LED. The nanorod LED may include gallium nitride (GaN). In an embodiment, a color conversion layer may be on the nanorod LED. The color conversion layer may include quantum dots. Alternatively, the display element DPE may include a quantum dot LED including a quantum dot emission layer. Alternatively, the display element DPE may include an inorganic LED including an inorganic semiconductor. Hereinafter, embodiments in which the display element DPE is an organic LED will be described in detail.

The display element layer DEL may include a first display element DPE1 overlapping the first pixel area PA1 and a second display element DPE2 overlapping the second pixel area PA2. The thin-film transistor TFT and the first display element DPE1 in the first pixel area PA1 may implement or define a first pixel P1. The thin-film transistor TFT and the second display element DPE2 in the second pixel area PA2 may implement or define a second pixel P2.

The encapsulation layer ENL may be on the display layer DSL. The encapsulation layer ENL may be on the display element DPE and may cover the display element DPE.

Figure 3A:
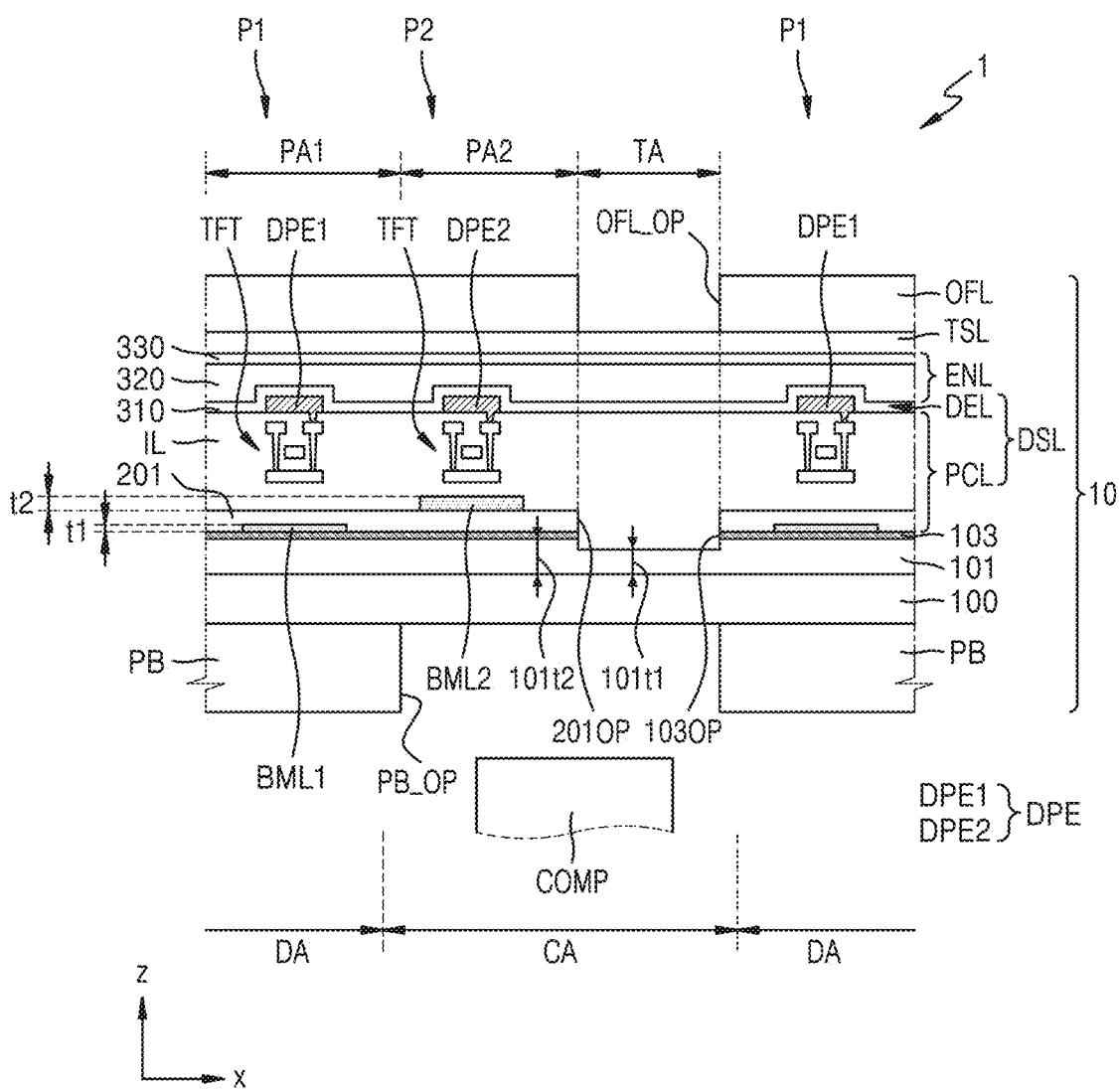
FIGS. 3A to 3D are cross-sectional views schematically illustrating a portion of a display device, according to an embodiment.

Referring to FIG. 3A, in an embodiment, the encapsulation layer ENL may include at least one inorganic encapsulation layer and at least one organic encapsulation layer. In an embodiment, the encapsulation layer ENL may include a first inorganic encapsulation layer 310, an organic encapsulation layer 320, and a second inorganic encapsulation layer 330, which are sequentially stacked one on another.

Figure 3B:
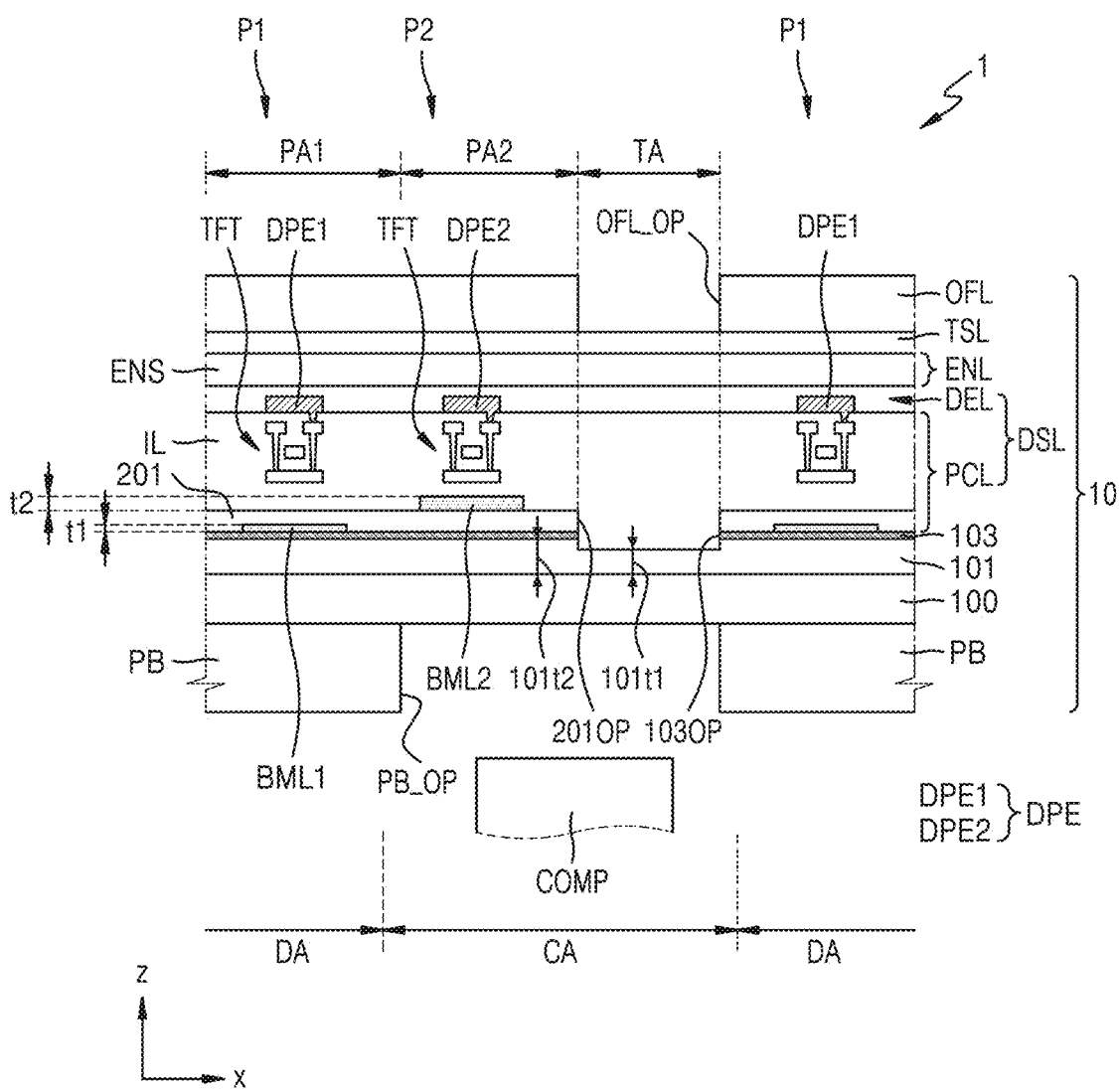

Referring to FIG. 3B, in an alternative embodiment, the encapsulation layer ENL may include an encapsulation substrate ENS. The encapsulation substrate ENS may be arranged to face the substrate 100 with the display element layer DEL therebetween. A gap may exist between the encapsulation substrate ENS and the display element layer DEL. The encapsulation substrate ENS may include glass. A sealant including a frit or the like may be between the substrate 100 and the encapsulation substrate ENS. The sealant may be in the non-display area NDA illustrated in FIG. 1A. The sealant in the non-display area NDA may prevent infiltration of moisture through the lateral side thereof while surrounding the display area DA. In an embodiment, the encapsulation layer ENL may include the first inorganic encapsulation layer 310, the organic encapsulation layer 320, and the second inorganic encapsulation layer 330 illustrated in FIG. 3A and also include the encapsulation substrate ENS illustrated in FIG. 3B.

The touch sensor layer TSL may be on the encapsulation layer ENL. The touch sensor layer TSL may be configured to sense coordinate information corresponding to an external input, for example, a touch event. The touch sensor layer TSL may include a sensor electrode and touch lines connected to the sensor electrode. The touch sensor layer TSL may sense an external input by using a self capacitance method or a mutual capacitance method. The touch sensor layer TSL may be on the encapsulation layer ENL. Alternatively, the touch sensor layer TSL may be separately formed on a touch substrate and then bonded to the encapsulation layer ENL through an adhesive layer such as an optically clear adhesive. In an embodiment, the touch sensor layer TSL may be formed directly on the encapsulation layer ENL. In such an embodiment, the adhesive layer may not be between the touch sensor layer TSL and the encapsulation layer ENL.

The optical function layer OFL may include an anti-reflective layer. The anti-reflective layer may reduce the reflectance of light (e.g., external light) incident from the outside to the display device 1. In an embodiment, the optical function layer OFL may include a polarizing film. The optical function layer OFL may include an opening OFL_OP overlapping the transmission area TA, that is, the opening OFL_OP is defined through the optical function layer OFL. Therefore, the light transmittance of the transmission area TA may be substantially increased. The opening OFL_OP overlapping the transmission area TA may be filled with a transparent material such as an optically clear resin ("OCR").

Figure 3C:
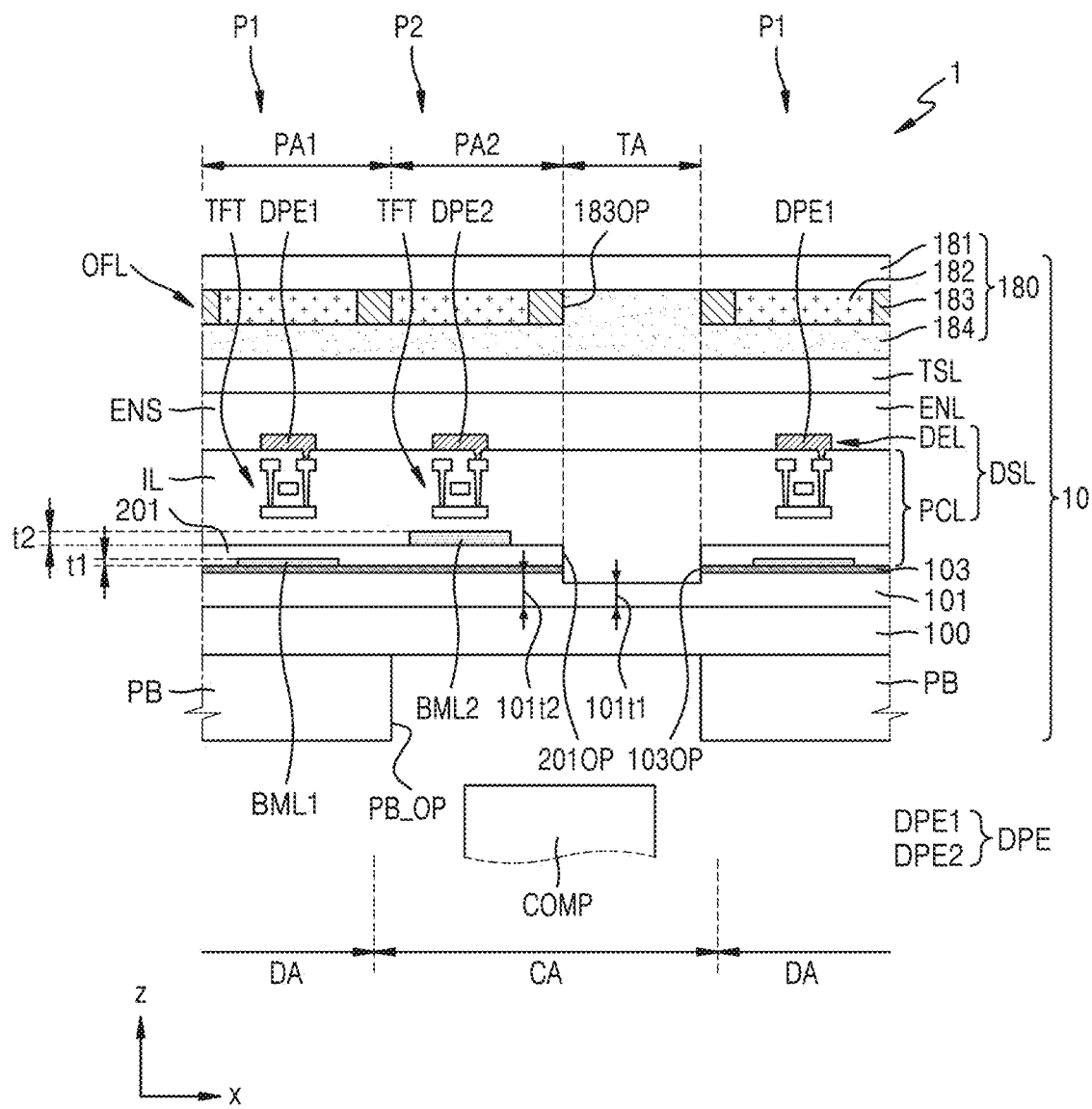

Referring to FIG. 3C, in an alternative embodiment, the optical function layer OFL may include a filter plate 180 including a black matrix and color filters. The filter plate 180 may include a base layer 181, and color filters 182, a black matrix 183, and an overcoat layer 184 on the base layer 181.

The color filters 182 may be arranged in consideration of the color of light emitted from each of the pixels of the display panel 10. In an embodiment, for example, the color filter 182 may have red, green, or blue color according to the color of light emitted from the first display element DPE1 and/or the second display element DPE2. The transmission area TA may not overlap the color filter 182 and the black matrix 183. In an embodiment, for example, a layer including the color filter 182 and the black matrix 183 may include an opening 1830P overlapping the transmission area TA, that is, the opening 1830P is defined through the layer including the color filter 182 and the black matrix 183. The opening 1830P may be at least partially filled with a portion of the overcoat layer 184. The overcoat layer 184 may include an organic material such as a resin, and the organic material may be transparent.

The component COMP may overlap the component area CA. In an embodiment, the component COMP may be apart from the display panel 10, as illustrated in FIGS. 3A to 3C. In such an embodiment, the component COMP may be fixedly bonded to a lower cover of the display device 1 or the like.

Figure 3D:
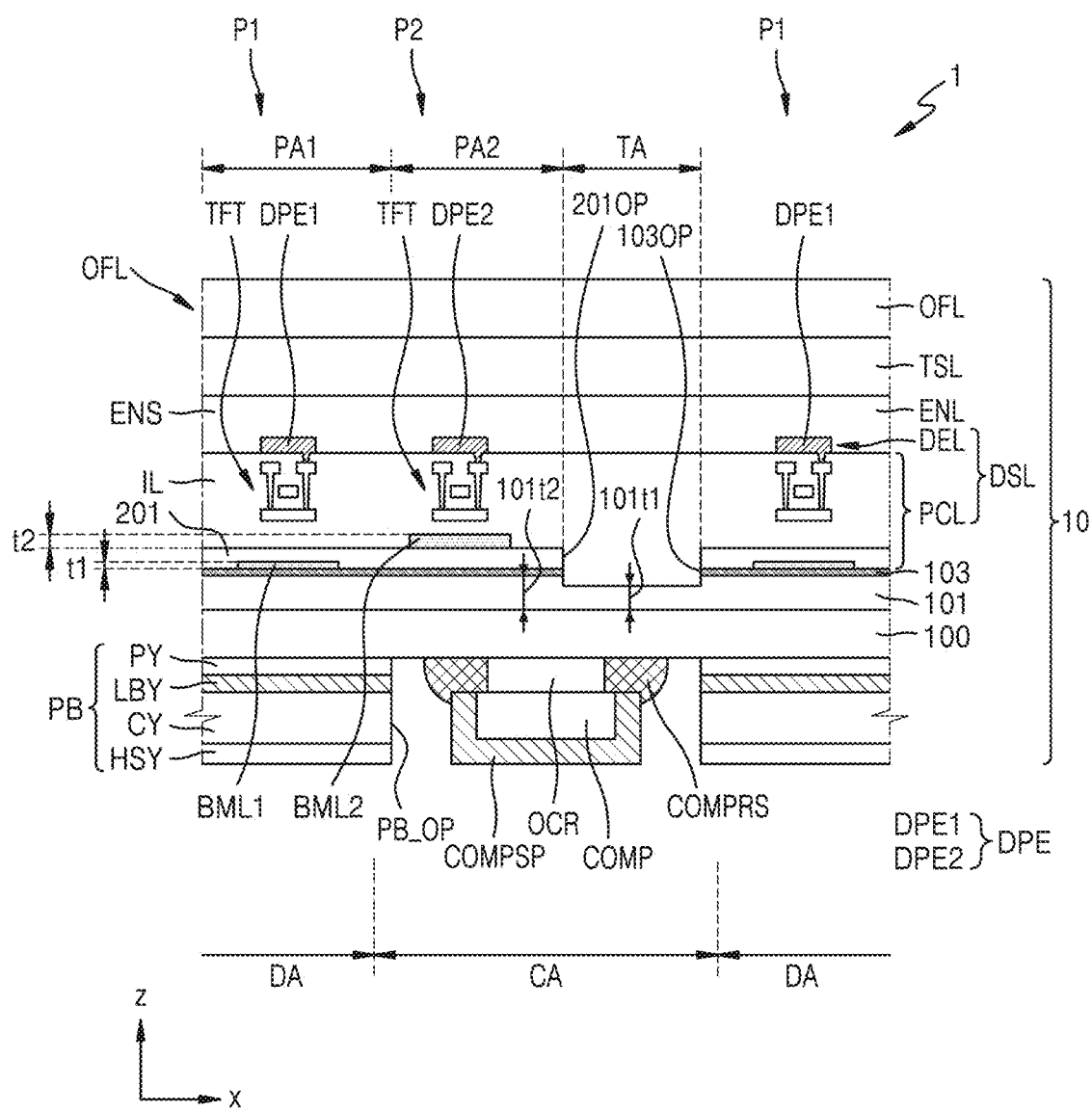

Referring to FIG. 3D, in an alternative embodiment, the component COMP may be bonded to the lower portion of the display panel 10. In such an embodiment, the lower protective film PB may include a protective layer PY, a light blocking layer LBY, a cushion layer CY, and a heat sink layer HSY. The protective layer PY may be on the lower surface of the substrate 100 and may protect the substrate 100 from the outside. In an embodiment, for example, the protective layer PY may be configured to absorb physical impact from the outside or prevent infiltration of foreign material or moisture into the display layer DSL. The protective layer PY may be coated on the lower surface of the substrate 100 or may be bonded in the form of a film.

In an embodiment, the protective layer PY may include a material that blocks ultraviolet rays ("UV"). In an embodiment, for example, the protective layer PY may include a base resin, a UV absorber, and inorganic particles. The UV absorber and the inorganic particles may be dispersed in the base resin. The base resin may include an acrylate resin, for example, urethane acrylate. However, the embodiment is not limited thereto, and any base resin that is optically transparent and is capable of dispersing the UV absorber and the inorganic particles may be used for the protective layer PY without limitation.

In an embodiment, for example, the protective layer PY may include, as the UV absorber, at least one selected from benzotriazole, benzophenone, salicylic acid, salicylate, cyanoacrylate, cinnamate, oxanilide, polystyrene, azomethine, and triazine compounds.

The light blocking layer LBY may be on the lower surface of the protective layer PY, and the cushion layer CY may be on the lower surface of the light blocking layer LBY. The light blocking layer LBY may be a double-sided adhesive between the protective layer PY and the cushion layer CY. Also, the light blocking layer LBY may be provided as a black layer configured to absorb external light. As such, the light blocking layer LBY may include various materials capable of absorbing external light.

The cushion layer CY may be bonded to the lower surface of the light blocking layer LBY to protect the display panel 10 from the outside. The cushion layer CY may include an elastic material, for example, a sponge or a rubber.

The heat sink layer HSY may be under the cushion layer CY. The heat sink layer HSY may include a first heat sink layer and a second heat sink layer. The first heat sink layer may include graphite, carbon nanotubes, etc. The second heat sink layer may include a metal thin-film, such as copper, nickel, ferrite, or silver, which is capable of shielding electromagnetic waves and has high heat conductivity.

The lower protective film PB may include an opening PB_OP overlapping the component area CA, that is, the opening PB_OP is defined through the lower protective film PB, and the component COMP may be in the opening PB_OP.

The component COMP may be mounted on a package COMPSP, and the package COMPSP may be bonded to the lower surface of the display panel 10 by an adhesive member COMPRS. The package COMPSP may include a control circuit electrically connected to the component COMP.

In an embodiment, the optically clear resin OCR may be filled between the component COMP and the lower surface of the display panel 10. In such an embodiment, because the optically clear resin OCR has optical transparency, the loss of light incident on the component COMP may be minimized.

The adhesive member COMPRS may fix the package COMPSP to the lower surface of the display panel 10. The adhesive member COMPRS may include a resin. That is, after the resin is arranged in contact with the package COMPSP and the lower surface of the display panel 10, UV curing may be performed thereon. The adhesive member COMPRS may include a light-absorbing material.

Figure 4:
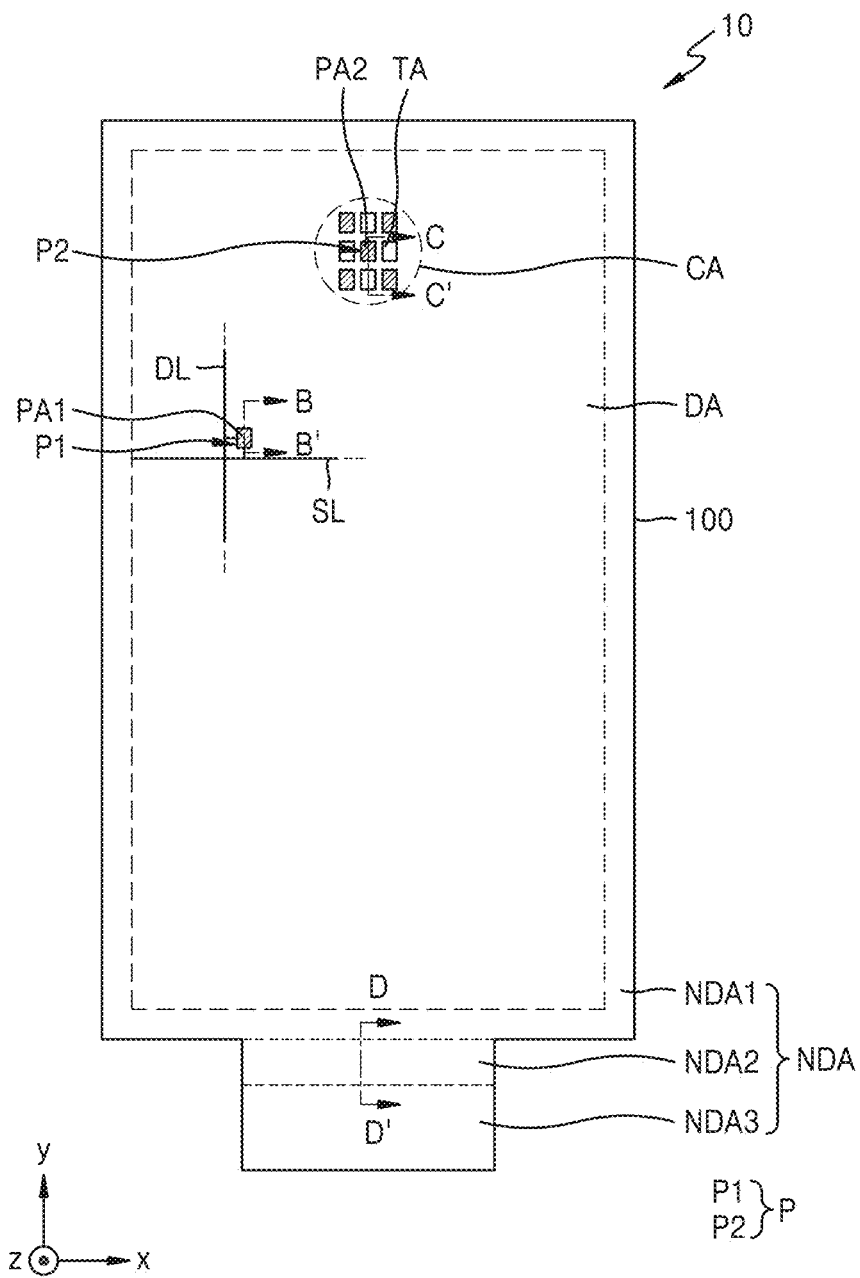
FIG. 4 is a plan view schematically illustrating a display panel according to an embodiment.
Figure 5:
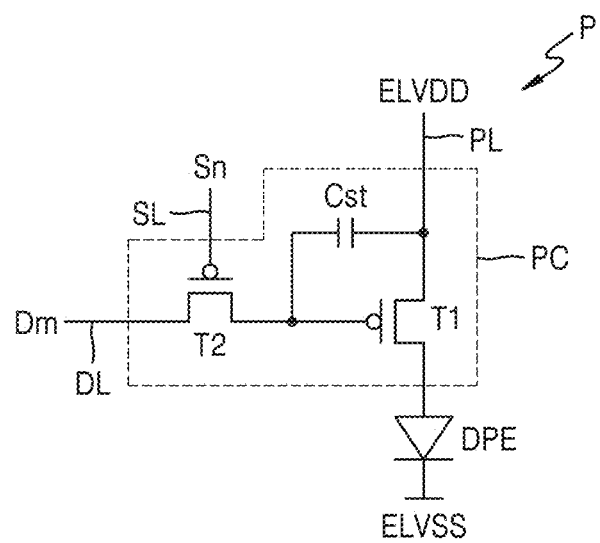
FIG. 5 is an equivalent circuit diagram schematically illustrating a pixel of a display panel.

FIG. 4 is a plan view schematically illustrating a display panel 10 according to an embodiment. FIG. 5 is an equivalent circuit diagram schematically illustrating a pixel P of the display panel.

Referring to FIGS. 4 and 5, an embodiment of the display panel 10 may include a display area DA, a component area CA, and a non-display area NDA. In this case, the display area DA, the component area CA, and the non-display area NDA may be defined in a substrate 100 of the display panel 10. In such an embodiment, the substrate 100 may include the display area DA, the component area CA, and the non-display area NDA.

The display panel 10 may include a pixel P in the display area DA and the component area CA. The pixel P may include a pixel circuit PC and a display element DPE connected to the pixel circuit PC. The pixel circuit PC may include a driving thin-film transistor T1, a switching thin-film transistor T2, and a storage capacitor Cst. In an embodiment, for example, the pixel P may emit red light, green light, or blue light from the display element DPE, or may emit red light, green light, blue light, or white light from the display element DPE.

The switching thin-film transistor T2 may be connected to a scan line SL and a data line DL, and may be configured to transmit, to the driving thin-film transistor T1, a data voltage or a data signal Dm input from the data line DL in response to a scan voltage or a scan signal Sn input from the scan line SL.

The storage capacitor Cst may be connected to the switching thin-film transistor T2 and a driving voltage line PL, and may be configured to store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may be configured to control a driving current flowing from the driving voltage line PL to the display element DPE in response to a voltage value stored in the storage capacitor Cst. The display element DPE may emit light having a certain luminance corresponding to the driving current. An opposite electrode (e.g., a cathode) of the display element DPE may be configured to receive a second power supply voltage ELVSS.

Although FIG. 5 illustrates an embodiment where the pixel circuit PC includes two thin-film transistors and one storage capacitor, the pixel circuit PC may include three or more thin-film transistors.

The display area DA may include a first pixel area PA1, and a first pixel P1 may be in the first pixel area PA1. A plurality of first pixels P1 may be provided in the display area DA.

The component area CA may be adjacent to the display area DA. In an embodiment, the component area CA may be at least partially surrounded by the display area DA. In an embodiment, for example, the component area CA may be completely surrounded by the display area DA. The component area CA may include a second pixel area PA2 and a transmission area TA, and a second pixel P2 may be in the second pixel area PA2. A plurality of second pixel areas PA2 and a plurality of transmission areas TA may be provided in the component area CA. The second pixel P2 may not be in the transmission area TA. A plurality of second pixels P2 may be provided in the component area CA.

The non-display area NDA may include a first non-display area NDA1, a second non-display area NDA2, and a third non-display area NDA3. The first non-display area NDA1 may be adjacent to the display area DA. The first non-display area NDA1 may at least partially surround the display area DA and the component area CA. A scan driver (not illustrated) configured to provide the scan signal Sn to each of the pixels P, a data driver (not illustrated) configured to provide the data signal Dm to each of the pixels P, a main power line (not illustrated) configured to provide the first power supply voltage ELVDD and/or the second power supply voltage ELVSS may be provided in the first non-display area NDA1.

The second non-display area NDA2 may be adjacent to the first non-display area NDA1. The second non-display area NDA2 may be a bending area. FIG. 4 illustrates the second non-display area NDA2 in an unbent state. In an alternative embodiment, the second non-display area NDA2 may be omitted. In such an embodiment, the display panel 10 may not be bent.

The third non-display area NDA3 may be adjacent to the second non-display area NDA2. The second non-display area NDA2 may be between the first non-display area NDA1 and the third non-display area NDA3. The third non-display area NDA3 may be a pad area. The display driver (see 30 of FIG. 2) and/or the display circuit board (see 40 of FIG. 2) may be in the third non-display area NDA3. In an embodiment where the second non-display area NDA2 is omitted, the third non-display area NDA3 may be adjacent to the first non-display area NDA1.

Figure 6:
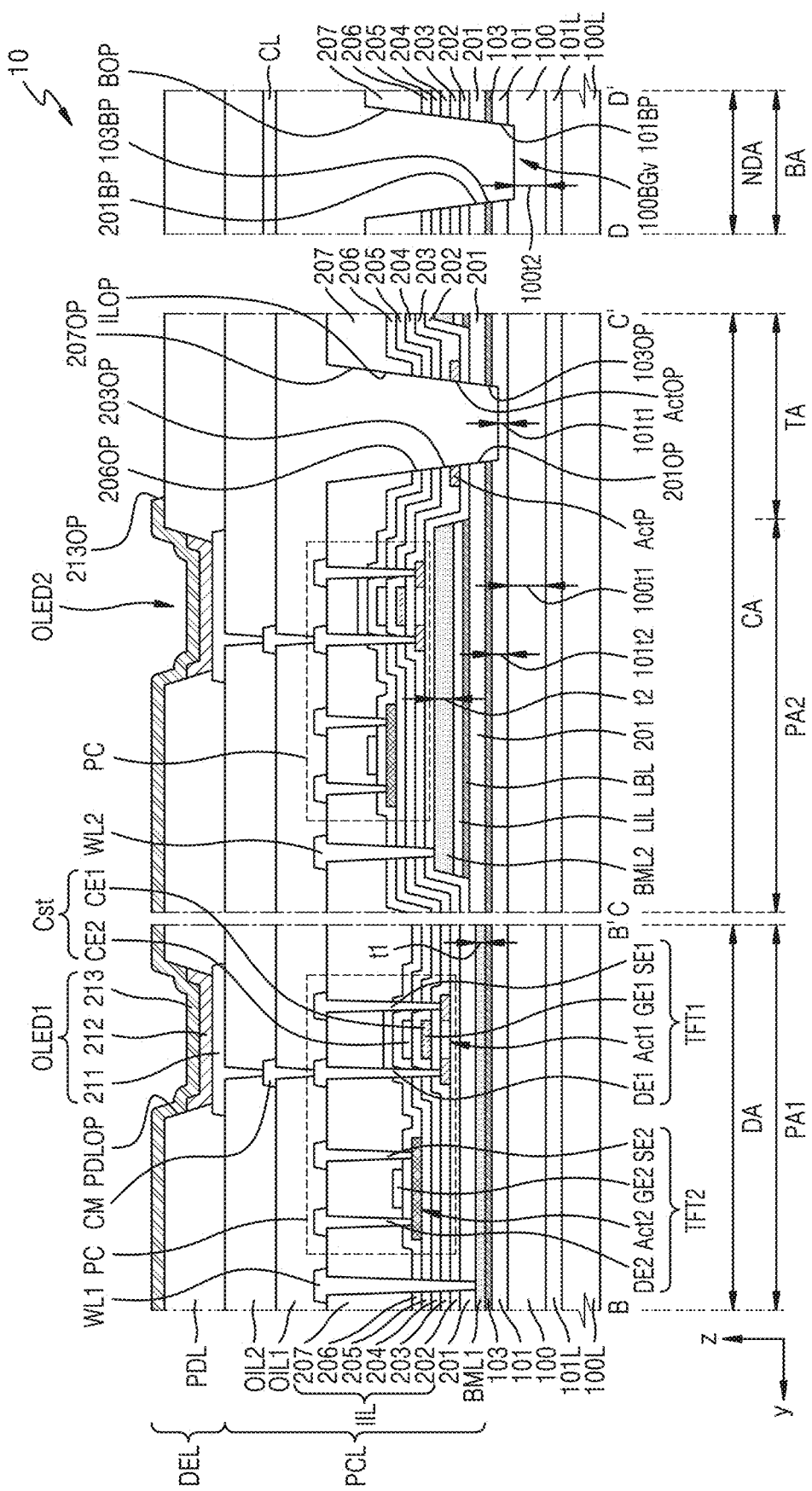
FIG. 6 is a schematic cross-sectional view of the display panel taken along lines B-B', C-C', and D-D' of FIG. 4, according to an embodiment.

FIG. 6 is a schematic cross-sectional view of the display panel 10 taken along lines B-B', C-C', and D-D' of FIG. 4, according to an embodiment. In FIG. 6, the same reference numerals as those of FIG. 3A denote the same elements, and thus, any repetitive detailed descriptions thereof may be omitted.

Referring to FIG. 6, the display panel 10 may include a substrate 100, a first inorganic layer 101, an additional organic layer 100L, a first additional inorganic layer 101L, a blocking layer 103, a pixel circuit layer PCL, and a display element layer DEL.

The substrate 100 may include a display area DA, a component area CA, and a non-display area NDA. The display area DA may include a first pixel area PA1. The component area CA may be adjacent to the display area DA. The component area CA may include a second pixel area PA2 and a transmission area TA.

The first inorganic layer 101 may be on the substrate 100. The first inorganic layer 101 may overlap the first pixel area PA1, the second pixel area PA2, and the transmission area TA. In an embodiment, the first inorganic layer 101 may be continuously arranged in the first pixel area PA1, the second pixel area PA2, and the transmission area TA. In such an embodiment, the first inorganic layer 101 may not include an opening in the transmission area TA. Therefore, infiltration of moisture or foreign material into the second pixel area PA2 through the transmission area TA may be prevented or reduced.

A thickness 101t1 of a portion of the first inorganic layer 101 overlapping the transmission area TA may be less than a thickness 101t2 of another portion of the first inorganic layer 101 overlapping the second pixel area PA2. The thickness of the first inorganic layer 101 may be a distance from the lower surface of the first inorganic layer 101 facing the substrate 100 to the upper surface of the first inorganic layer 101 opposite to the lower surface of the first inorganic layer 101. In such an embodiment, the first inorganic layer 101 may have a groove in the transmission area TA.

In an embodiment, the first additional inorganic layer 101L may be under the substrate 100. In such an embodiment, the substrate 100 may be between the first inorganic layer 101 and the first additional inorganic layer 101L. The first additional inorganic layer 101L may include a same inorganic material as that of the first inorganic layer 101, or the first additional inorganic layer 101L may include a similar inorganic material to that of the first inorganic layer 101.

The additional organic layer 100L may be under the first additional inorganic layer 101L. In such an embodiment, the first additional inorganic layer 101L may be between the substrate 100 and the additional organic layer 100L. In an embodiment where the substrate 100 includes an organic material, the additional organic layer 100L may include a same organic material as that of the substrate 100, or the additional organic layer 100L may include a similar organic material to that of the substrate 100. In an alternative embodiment, the additional organic layer 100L and the first additional inorganic layer 101L may be omitted. In an alternative embodiment, a plurality of layers including the organic material and a plurality of layers including the inorganic material may be alternately stacked one on another.

The blocking layer 103 may be on the first inorganic layer 101. The blocking layer 103 may include at least one selected from a-Si, poly-Si, crystalline-Si, zinc oxide (ZnO), and IZO. The blocking layer 103 may prevent transmission of light such as ultraviolet rays.

The blocking layer 103 may include a blocking layer opening 103OP overlapping the transmission area TA. In an embodiment, the blocking layer opening 103OP may overlap the groove of the first inorganic layer 101. Because the blocking layer 103 includes the blocking layer opening 103OP overlapping the transmission area TA, the light transmittance of the display panel 10 in the transmission area TA may be increased.

The pixel circuit layer PCL may be on the blocking layer 103. In an embodiment, the pixel circuit layer PCL may be between the blocking layer 103 and the display element layer DEL. The pixel circuit layer PCL may include a first metal layer BML1, a second inorganic layer 201, a lower blocking layer LBL, a lower inorganic layer LIL, a second metal layer BML2, a pixel circuit PC, a first line WL1, a second line WL2, a semiconductor pattern ActP, a connection electrode CM, and a plurality of insulating layers. The pixel circuit PC may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a first electrode CE1 and a second electrode CE2. The insulating layers may include an inorganic insulating layer IIL, a first organic insulating layer OIL1, and a second organic insulating layer OIL2. The inorganic insulating layer IIL may include a buffer layer 202, a first inorganic insulating layer 203, a gate insulating layer 204, an intermediate insulating layer 205, a second inorganic insulating layer 206, and an interlayer insulating layer 207.

The first metal layer BML1 may overlap the first pixel area PA1. The first metal layer BML1 may have a first thickness t1. The first thickness t1 may be a distance from the lower surface of the first metal layer BML1 facing the substrate 100 to the upper surface of the first metal layer BML1 opposite to the lower surface of the first metal layer BML1. FIG. 6 illustrates an embodiment where the first metal layer BML1 overlaps the first thin-film transistor TFT1 and the second thin-film transistor TFT2, but in an alternative embodiment, the first metal layer BML1 may overlap the first thin-film transistor TFT1 and may not overlap the second thin-film transistor TFT2.

The first metal layer BML1 may prevent external light from reaching the thin-film transistor TFT. In an embodiment, a constant voltage or a signal may be applied to the first metal layer BML1, and the first metal layer BML1 may prevent or reduce damage to the pixel circuit PC due to electrostatic discharge.

The second metal layer BML2 may overlap the second pixel area PA2. In an embodiment, the transmission area TA may be defined as a portion of the component area CA in which the second metal layer BML2 is not arranged. The second metal layer BML2 may have a second thickness t2. The second thickness t2 may be a distance from the lower surface of the second metal layer BML2 facing the substrate 100 to the upper surface of the second metal layer BML2 opposite to the lower surface of the second metal layer BML2. In an embodiment, the second thickness t2 may be different from the first thickness t1. In an embodiment, for example, the second thickness t2 may be greater than the first thickness t1. In an alternative embodiment, the second thickness t2 may be less than the first thickness t1. In an alternative embodiment, the second thickness t2 may be equal to the first thickness t1.

The second metal layer BML2 may prevent external light from reaching the thin-film transistor TFT. In an embodiment, a constant voltage or a signal may be applied to the second metal layer BML2, and the second metal layer BML2 may prevent or reduce damage to the pixel circuit PC due to electrostatic discharge.

The second inorganic layer 201 may be on the blocking layer 103. The second inorganic layer 201 may overlap the first pixel area PA1 and the second pixel area PA2. In an embodiment, the second inorganic layer 201 may include an inorganic layer opening 201OP overlapping the transmission area TA. The inorganic layer opening 201OP may overlap the blocking layer opening 103OP.

In an embodiment, one of the first metal layer BML1 and the second metal layer BML2 may be between the blocking layer 103 and the second inorganic layer 201. In such an embodiment, the other of the first metal layer BML1 and the second metal layer BML2 may be on the second inorganic layer 201. In an embodiment, for example, the first metal layer BML1 may be between the blocking layer 103 and the second inorganic layer 201. In such an embodiment, the second metal layer BML2 may be on the second inorganic layer 201.

A lower blocking layer LBL may be under the second metal layer BML2. The lower blocking layer LBL may overlap the second pixel area PA2 and may not overlap the transmission area TA. The lower blocking layer LBL may include a material capable of blocking light. The lower blocking layer LBL may include at least one selected from a-Si, poly-Si, crystalline-Si, zinc oxide (ZnO), and IZO.

The lower inorganic layer LIL may be between the lower blocking layer LBL and the second metal layer BML2. In an embodiment, the lower blocking layer LBL may overlap the second pixel area PA2 and may not overlap the transmission area TA. In an alternative embodiment, the lower blocking layer LBL may overlap the first pixel area PA1, the second pixel area PA2, and the transmission area TA. The lower inorganic layer LIL may include an inorganic material such as silicon nitride (SiN$_x$), silicon oxynitride (SiON), and/or silicon oxide (SiO$_2$), and may have a single layer structure or a multiple layer structure, each layer therein including at least selected from the above-described inorganic material.

The lower blocking layer LBL, the lower inorganic layer LIL, and the second metal layer BML2 may be formed by patterning in the same process. The lower blocking layer LBL, the lower inorganic layer LIL, and the second metal layer BML2 may prevent or reduce light reflection or scattering in the component area CA.

The buffer layer 202 may be on the first metal layer BML1 and the second metal layer BML2. In an embodiment, the buffer layer 202 may be on the second inorganic layer 201 in the first pixel area PA1. The buffer layer 202 may be on the second metal layer BML2 in the second pixel area PA2. In an embodiment, the buffer layer 202 may include a buffer layer opening overlapping the transmission area TA.

The first semiconductor layer Act1 may be on the blocking layer 103. In an embodiment, the first semiconductor layer Act1 may be on the buffer layer 202. The first semiconductor layer Act1 may be in the first pixel area PA1 and the second pixel area PA2. The first semiconductor layer Act1 may include a silicon semiconductor. In an embodiment, the first semiconductor layer Act1 may include poly-silicon. The first semiconductor layer Act1 may include a channel region, and a drain region and a source region on both sides of the channel region.

The first semiconductor layer Act1 may be formed by forming an amorphous silicon-containing layer and then performing a laser crystallization process, for example, an ELA process, on the amorphous silicon-containing layer. If the blocking layer 103 is omitted, foreign material is on the amorphous silicon-containing layer, and ultraviolet rays are radiated to the foreign material, the substrate 100 under the amorphous silicon-containing layer may be damaged. In an embodiment, because the blocking layer 103 is on the substrate 100, the arrival of the ultraviolet rays at the substrate 100 may be prevented or reduced even when foreign material is on the amorphous silicon-containing layer. Therefore, the blocking layer 103 may protect the substrate 100.

The first inorganic insulating layer 203 may be on the first semiconductor layer Act1. The first inorganic insulating layer 203 may include a first insulating layer opening 203OP overlapping the transmission area TA. The first insulating layer opening 203OP may overlap the blocking layer opening 103OP. The first inorganic insulating layer 203 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO).

The first gate electrode GE1 may be on the first inorganic insulating layer 203. The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), and the like, and may have a single layer structure or a multiple layer structure, each layer therein including at least selected from the above-described materials.

The gate insulating layer 204 may be on the first gate electrode GE1. The gate insulating layer 204 may include a gate insulating layer opening overlapping the transmission area TA. The gate insulating layer 204 may include an inorganic insulating material such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO).

The second electrode CE2 may be on the gate insulating layer 204. In an embodiment, the second electrode CE2 may overlap the first gate electrode GE1. The second electrode CE2 may constitute the storage capacitor Cst with the first gate electrode GE1 overlapping the second electrode CE2 with the gate insulating layer 204 therebetween. In such an embodiment, the first gate electrode GE1 may function as the first electrode CE1 of the storage capacitor Cst. As such, the storage capacitor Cst may overlap the first thin-film transistor TFT1. In an alternative embodiment, the storage capacitor Cst may not overlap the first thin-film transistor TFT1. The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multiple layer structure, each layer therein including at least selected from the above-described materials.

The intermediate insulating layer 205 may be on the second electrode CE2. The intermediate insulating layer 205 may include an intermediate insulating layer opening overlapping the transmission area TA. The intermediate insulating layer 205 may include silicon oxide (SiO$_2$), silicon nitride (SiN$_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second semiconductor layer Act2 may be on the intermediate insulating layer 205. In an embodiment, the second semiconductor layer Act2 may be on the first inorganic insulating layer 203. The second semiconductor layer Act2 may include a channel region, and a source region and a drain region on both sides of the channel region. The second semiconductor layer Act2 may include an oxide semiconductor. In an embodiment, for example, the second semiconductor layer Act2 may include a Zn oxide-based material such as Zn oxide, In—Zn oxide, or Ga—In—Zn oxide. Alternatively, the second semiconductor layer Act2 may include In—Ga—Zn—O ("IGZO"), In—Sn—Zn—O ("ITZO"), or In—Ga—Sn—Zn—O ("IGTZO") semiconductor, in which a metal such as indium (In), gallium (Ga), or tin (Sn) is included in zinc oxide (ZnO).

The source region and the drain region of the second semiconductor layer Act2 may be formed by controlling a carrier concentration of an oxide semiconductor so that the oxide semiconductor is made conductive. In an embodiment, for example, the source region and the drain region of the second semiconductor layer Act2 may be formed by increasing the carrier concentration of the oxide semiconductor through plasma treatment using hydrogen-based gas, fluorine-based gas, or any combination thereof.

The second inorganic insulating layer 206 may be on the second semiconductor layer Act2. The second inorganic insulating layer 206 may include a second insulating layer opening 206OP overlapping the transmission area TA. In an embodiment, the second insulating layer opening 206OP may overlap the blocking layer opening 103OP. The second inorganic insulating layer 206 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate electrode GE2 may be on the second inorganic insulating layer 206. The second gate electrode GE2 may overlap the second semiconductor layer Act2. The second gate electrode GE2 may overlap the channel region of the second semiconductor layer Act2. The second gate electrode GE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multiple layer structure, each layer therein including at least selected from the above-described materials.

The interlayer insulating layer 207 may be on the second gate electrode GE2. The interlayer insulating layer 207 may include an interlayer insulating layer opening 207OP overlapping the transmission area TA. The interlayer insulating layer 207 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The interlayer insulating layer 207 may have a single layer structure or a multiple layer structure, each layer therein including at least selected from the above-described inorganic insulating materials.

The buffer layer 202, the first inorganic insulating layer 203, the gate insulating layer 204, the intermediate insulating layer 205, the second inorganic insulating layer 206, and the interlayer insulating layer 207 may include openings overlapping the blocking layer opening 103OP, respectively.

In such an embodiment, the inorganic insulating layer IIL may include a transmission opening ILOP overlapping the transmission area TA. In an embodiment, the transmission opening ILOP may not have a step structure. In an alternative embodiment, the transmission opening ILOP may have a step structure. The transmission opening ILOP may overlap the blocking layer opening 103OP and the inorganic layer opening 201OP. Therefore, the light transmittance or sound transmittance in the transmission area TA may be increased.

In an embodiment, the transmission opening ILOP, the inorganic layer opening 201OP, and the blocking layer opening 103OP may not have a step structure. In an alternative embodiment, one of the transmission opening ILOP, the inorganic layer opening 201OP, and the blocking layer opening 103OP and a remaining one of the transmission opening ILOP, the inorganic layer opening 201OP, and the blocking layer opening 103OP may have a step structure.

The first source electrode SE1 and the first drain electrode DE1 may be on the interlayer insulating layer 207. The first source electrode SE1 and the first drain electrode DE1 may be connected to the first semiconductor layer Act1. In an embodiment, the first source electrode SE1 and the first drain electrode DE1 may be connected to the first semiconductor layer Act1 through contact holes of the insulating layers. In an embodiment, for example, the first source electrode SE1 and the first drain electrode DE1 may be connected to the first semiconductor layer Act1 through the contact hole of the first inorganic insulating layer 203, the contact hole of the gate insulating layer 204, the contact hole of the intermediate insulating layer 205, the contact hole of the second inorganic insulating layer 206, and the contact hole of the interlayer insulating layer 207. The contact hole of the first inorganic insulating layer 203, the contact hole of the gate insulating layer 204, the contact hole of the intermediate insulating layer 205, the contact hole of the second inorganic insulating layer 206, and the contact hole of the interlayer insulating layer 207 may overlap each other.

The second source electrode SE2 and the second drain electrode DE2 may be on the interlayer insulating layer 207. The second source electrode SE2 and the second drain electrode DE2 may be connected to the second semiconductor layer Act2. The second source electrode SE2 and the second drain electrode DE2 may be connected to the second semiconductor layer Act2 through the contact hole of the second inorganic insulating layer 206 and the contact hole of the interlayer insulating layer 207.

The first source electrode SE1, the first drain electrode DE1, the second source electrode SE2, and the second drain electrode DE2 may include a material having high conductivity. The first source electrode SE1, the first drain electrode DE1, the second source electrode SE2, and the second drain electrode DE2 may include a conductive material including molybdenum (Mo), aluminum (Al), copper (Cu), and/or titanium (Ti), and may have a single layer structure or a multiple layer structure, each layer therein including at least selected from the above-described materials. In an embodiment, the first source electrode SE1, the first drain electrode DE1, the second source electrode SE2, and the second drain electrode DE2 may have a multilayer structure of Ti/Al/Ti.

Because the first thin-film transistor TFT1 that includes the first semiconductor layer Act1 including the silicon semiconductor has high reliability, the first thin-film transistor TFT1 may be employed as a driving thin-film transistor to implement a high-quality display panel 10.

Because the oxide semiconductor has high carrier mobility and low leakage current, voltage drop may not be great even when driving time is long. That is, because the color change of the image due to the voltage drop is not great even during low-frequency driving, low-frequency driving is possible. As such, because the oxide semiconductor has low leakage current, the oxide semiconductor may be employed in at least one of the thin-film transistors other than the driving thin-film transistor, so that leakage current is prevented and power consumption is reduced. In an embodiment, for example, the second thin-film transistor TFT2 may include the second semiconductor layer Act2 including the oxide semiconductor.

The first line WL1 may be in the first pixel area PA1. The first line WL1 may be connected to the first metal layer BML1 and may be configured to apply a signal or a constant voltage to the first metal layer BML1. In an embodiment, the first line WL1 may be connected to the first metal layer BML1 through the contact hole of the second inorganic layer 201, the contact hole of the buffer layer 202, the contact hole of the first inorganic insulating layer 203, the contact hole of the gate insulating layer 204, the contact hole of the intermediate insulating layer 205, the contact hole of the second inorganic insulating layer 206, and the contact hole of the interlayer insulating layer 207.

The second line WL2 may be in the second pixel area PA2. The second line WL2 may be connected to the second metal layer BML2 and may be configured to apply a signal or a constant voltage to the second metal layer BML2. In an embodiment, the second line WL2 may be connected to the second metal layer BML2 through the contact hole of the buffer layer 202, the contact hole of the first inorganic insulating layer 203, the contact hole of the gate insulating layer 204, the contact hole of the intermediate insulating layer 205, the contact of the second inorganic insulating layer 206, and the contact hole of the interlayer insulating layer 207.

The first line WL1 and/or the second line WL2 may include a material having high conductivity. The first line WL1 and/or the second line WL2 may include a conductive material including molybdenum (Mo), aluminum (Al), copper (Cu), titanium (Ti), and the like, and may have a single layer structure or a multiple layer structure, each layer therein including at least selected from the above-described materials. In an embodiment, the first line WL1 and/or the second line WL2 may have a multilayer structure of Ti/Al/Ti.

The semiconductor pattern ActP may overlap the transmission area TA. In an embodiment, the semiconductor pattern ActP may be between the blocking layer 103 and the first inorganic insulating layer 203. In an embodiment, the semiconductor pattern ActP may be between the buffer layer 202 and the first inorganic insulating layer 203. In such an embodiment, the semiconductor pattern ActP and the first semiconductor layer Act1 may be in or directly on a same layer as each other.

In an embodiment, the semiconductor pattern ActP may include a semiconductor pattern opening ActOP. The semiconductor pattern opening ActOP may overlap the blocking layer opening 103OP.

The semiconductor pattern ActP and the first semiconductor layer Act1 may include the same material. In an embodiment, the semiconductor pattern ActP may include a silicon semiconductor. In an embodiment, for example, the semiconductor pattern ActP may include polysilicon. The semiconductor pattern ActP and the first semiconductor layer Act1 may be formed in a same process. When the transmission opening ILOP is formed in the inorganic insulating layer IIL arranged in the transmission area TA, the blocking layer 103 is etched to form the blocking layer opening 103OP. The semiconductor pattern ActP may reduce an etch rate so that the first inorganic layer 101 does not include an opening.

The first organic insulating layer OIL1 may be arranged to cover the first source electrode SE1, the first drain electrode DE1, the second source electrode SE2, and the second drain electrode DE2. The first organic insulating layer OIL1 may include an organic material. In an embodiment, the first organic insulating layer OIL1 may fill the transmission opening ILOP. In an embodiment, for example, the first organic insulating layer OIL1 may include an organic insulating material such as a general-purpose polymer (e.g., polymethylmethacrylate ("PMMA") or polystyrene ("PS")), a polymer derivative having a phenol-based group, an acrylic polymer, an imide-based polymer, an aryl ether polymer, an amide-based polymer, a fluorine-based polymer, a p-xylene-based polymer, a vinyl alcohol-based polymer, or any blend thereof.

The connection electrode CM may be on the first organic insulating layer OIL1. The connection electrode CM may be connected to the first drain electrode DE1 or the first source electrode SE1 through the contact hole of the first organic insulating layer OIL1.

The connection electrode CM may include a material having high conductivity. The connection electrode CM may include a conductive material including molybdenum (Mo), aluminum (Al), copper (Cu), titanium (Ti), and the like, and may have a single layer structure or a multiple layer structure, each layer therein including at least selected from the above-described materials. In an embodiment, the connection electrode CM may have a multilayer structure of Ti/Al/Ti.

The second organic insulating layer OIL2 may be on the connection electrode CM. The second organic insulating layer OIL2 may include an organic material. In an embodiment, for example, the second organic insulating layer OIL2 may include an organic insulating material such as a general-purpose polymer (e.g., PMMA or PS), a polymer derivative having a phenol-based group, an acrylic polymer, an imide-based polymer, an aryl ether polymer, an amide-based polymer, a fluorine-based polymer, a p-xylene-based polymer, a vinyl alcohol-based polymer, or any blend thereof.

The display element layer DEL may be on the pixel circuit layer PCL. The display element layer DEL may include a display element, for example, an organic light-emitting diode. The display element layer DEL may include a first organic light-emitting diode OLED1 as a first display element overlapping the first pixel area PA1, a second organic light-emitting diode OLED2 as a second display element overlapping the second pixel area PA2, and a pixel defining layer PDL. Because the first organic light-emitting diode OLED1 and the second organic light-emitting diode OLED2 are similar to each other, the first organic light-emitting diode OLED1 will be mainly described in detail for convenience of description. The first organic light-emitting diode OLED1 may include a pixel electrode 211, an emission layer 212, and an opposite electrode 213.

The pixel electrode 211 may be on the second organic insulating layer OIL2. The pixel electrode 211 may be connected to the connection electrode CM through the contact hole of the second organic insulating layer OIL2. The pixel electrode 211 may include a conductive oxide such as ITO, IZO, zinc oxide (ZnO), indium oxide ($In_2O_3$), indium gallium oxide ("IGO"), and/or aluminum zinc oxide ("AZO"). In an embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or any compound thereof. In an alternative embodiment, the pixel electrode 211 may further include layers including ITO, IZO, ZnO, and/or $In_2O_3$ above/below the reflective layer.

The pixel defining layer PDL including an opening PDLOP exposing the central portion of the pixel electrode 211 may be on the pixel electrode 211. The pixel defining layer PDL may include an organic insulating material and/or an inorganic insulating material. The opening PDLOP of the pixel defining layer PDL may define an emission area of light emitted from the first organic light-emitting diode OLED1.

An emission layer 212 may be in the opening PDLOP of the pixel defining layer PDL. The emission layer 212 may include a high molecular weight organic material or a low molecular weight organic material that emits light of a certain color.

Although not illustrated, a first functional layer and a second functional layer may be respectively below and above the emission layer 212. The first functional layer may include, for example, a hole transport layer ("HTL"), or may include an HTL and a hole injection layer ("HIL"). The second functional layer is on the emission layer 212 and is optional. The second functional layer may include an electron transport layer ("ETU") and/or an electron injection layer ("EIL"). The first functional layer and/or the second functional layer may be a common layer that completely covers the substrate 100, like the opposite electrode 213 to be described below.

The opposite electrode 213 may be on the emission layer 212. In an embodiment, the opposite electrode 213 may include an opposite electrode opening 213OP overlapping the transmission area TA. The opposite electrode 213 may include a conductive material having a low work function. In an embodiment, for example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer such as ITO, IZO, ZnO, or $In_2O_3$ on the (semi)transparent layer including at least one selected from the above-described materials.

In an embodiment, a capping layer (not illustrated) may be further on the opposite electrode 213. The capping layer may include LiF, an inorganic material, and/or an organic material.

The non-display area NDA may be adjacent to the display area DA. The non-display area NDA may include a bending area BA. In an embodiment, the substrate 100 may include a bending groove 100BGv in the bending area BA. In such an embodiment, a thickness 100t2 of a portion of the substrate 100 in the bending area BA may be less than a thickness 100t1 of another portion of the substrate 100 in the component area CA. Alternatively, the thickness 100t2 of the substrate 100 in the bending area BA may be less than the thickness 100t1 of the substrate 100 in the transmission area TA.

The first inorganic layer 101 may be on the substrate 100. The first inorganic layer 101 may have a lower opening 101BP overlapping the bending area BA. The lower opening 101BP may overlap the bending groove 100BGv. Therefore, the display panel 10 may be flexible in the bending area BA.

The blocking layer 103 may be on the first inorganic layer 101. The blocking layer 103 may include an intermediate opening 103BP overlapping the bending area BA. The intermediate opening 103BP may overlap the lower opening 101BP.

The second inorganic layer 201 may include an upper opening 201BP overlapping the bending area BA. The upper opening 201BP may overlap the intermediate opening 103BP.

The buffer layer 202, the first inorganic insulating layer 203, the gate insulating layer 204, the intermediate insulating layer 205, the second inorganic insulating layer 206, and the interlayer insulating layer 207 may include openings overlapping the bending area BA, respectively. In such an embodiment, the inorganic insulating layer IIL may include a bending opening BOP overlapping the bending area BA. In an embodiment, the bending opening BOP may not have a step structure. In an alternative embodiment, the bending opening BOP may have a step structure.

In an embodiment, the lower opening 101BP, the intermediate opening 103BP, the upper opening 201BP, and the bending opening BOP may not have a step structure. In an alternative embodiment, one of the lower opening 101BP, the intermediate opening 103BP, the upper opening 201BP, and the bending opening BOP and a remaining one of the lower opening 101BP, the intermediate opening 103BP, the upper opening 201BP, and the bending opening BOP may have a step structure.

The first organic insulating layer OIL1 may be on the interlayer insulating layer 207. The first organic insulating layer OIL1 may fill the bending opening BOP.

The connection line CL may be configured to transmit a signal or a power supply voltage to the display area DA and/or the component area CA. The connection line CL may be on the first organic insulating layer OIL1. In such an embodiment, the connection line CL may be between the first organic insulating layer OIL1 and the second organic insulating layer OIL2. In an embodiment, the connection line CL may be between the second organic insulating layer OIL2 and the pixel defining layer PDL.

In an embodiment, the first inorganic layer 101, the blocking layer 103, the second inorganic layer 201, and the inorganic insulating layer IIL may include openings in the bending area BA, respectively. Therefore, the display panel 10 may be flexible in the bending area BA. In such an embodiment, the first inorganic layer 101 may be continuously arranged in the transmission area TA, and the blocking layer 103 may include the blocking layer opening 103OP. Therefore, because infiltration of moisture or foreign material into the transmission area TA is prevented or reduced, the light transmittance or sound transmittance of the display panel 10 may be increased in the transmission area TA.

FIGS. 7A to 7L are cross-sectional views schematically illustrating a display device that is manufactured by a method of manufacturing a display device, according to an embodiment. In FIGS. 7A to 7L, the same reference numerals as those of FIG. 6 denote the same elements, and thus, any repetitive detailed descriptions thereof may be omitted.

Figure 7A:
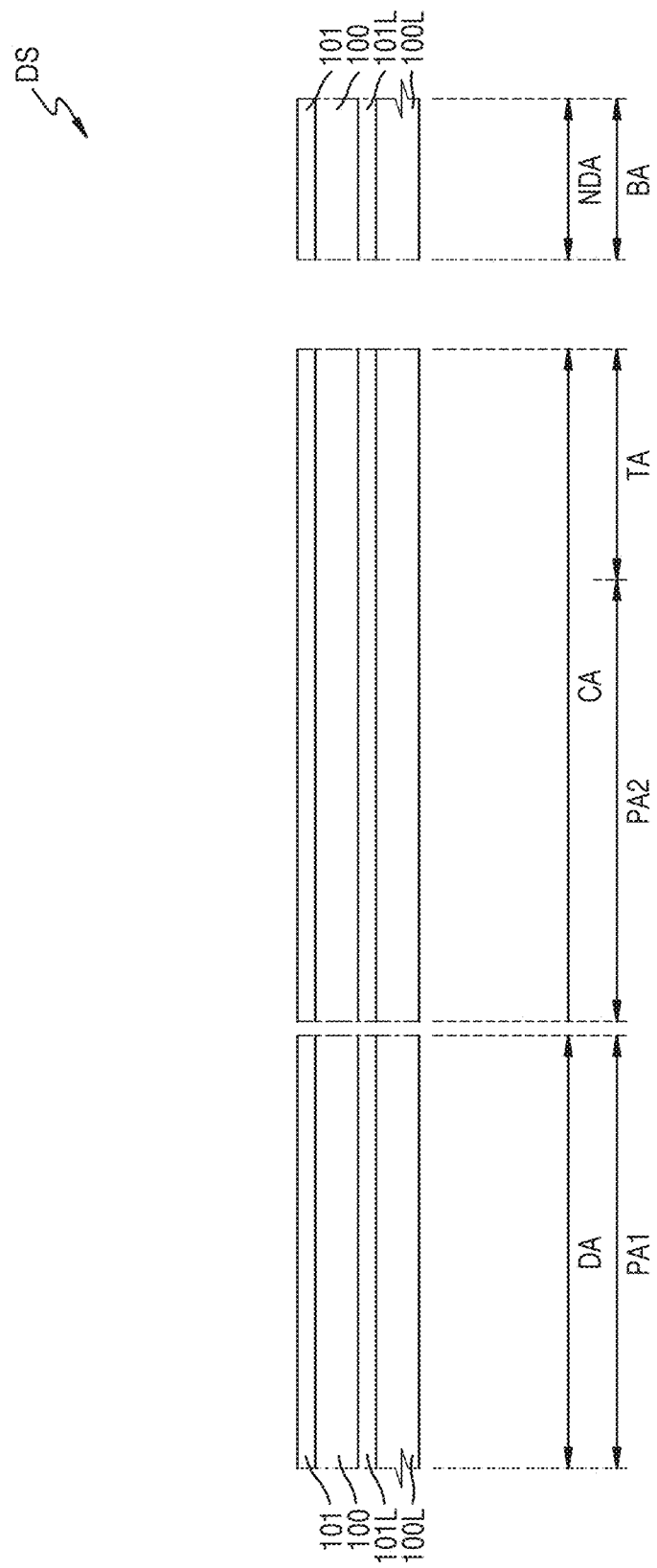
FIGS. 7A to 7L are cross-sectional views schematically illustrating a display device that is manufactured by a method of manufacturing a display device, according to an embodiment.

Referring to FIG. 7A, a display substrate DS may be prepared. The display substrate DS may include a substrate 100, a first inorganic layer 101, an additional organic layer 100L, and a first additional inorganic layer 101L. In an embodiment, the additional organic layer 100L, the first additional inorganic layer 101L, the substrate 100, and the first inorganic layer 101 may be sequentially stacked one on another. In an alternative embodiments, the additional organic layer 100L and the first additional inorganic layer 101L may be omitted.

The substrate 100 may include a display area DA, a component area CA, and a non-display area NDA. The display area DA may include a first pixel area PA1. The component area CA may include a second pixel area PA2 and a transmission area TA. The non-display area NDA may include a bending area BA. In an embodiment, the substrate 100 may include an organic material.

The first inorganic layer 101 may be on the substrate 100. The first inorganic layer 101 may be continuously arranged in the first pixel area PA1, the second pixel area PA2, the transmission area TA, and the bending area BA. The first inorganic layer 101 may include an inorganic material such as silicon nitride ($SiN_x$), silicon oxynitride (SiON), and/or silicon oxide ($SiO_2$), and may have a single layer structure or a multiple layer structure, each layer therein including at least selected from the above-described inorganic materials.

Figure 7B:
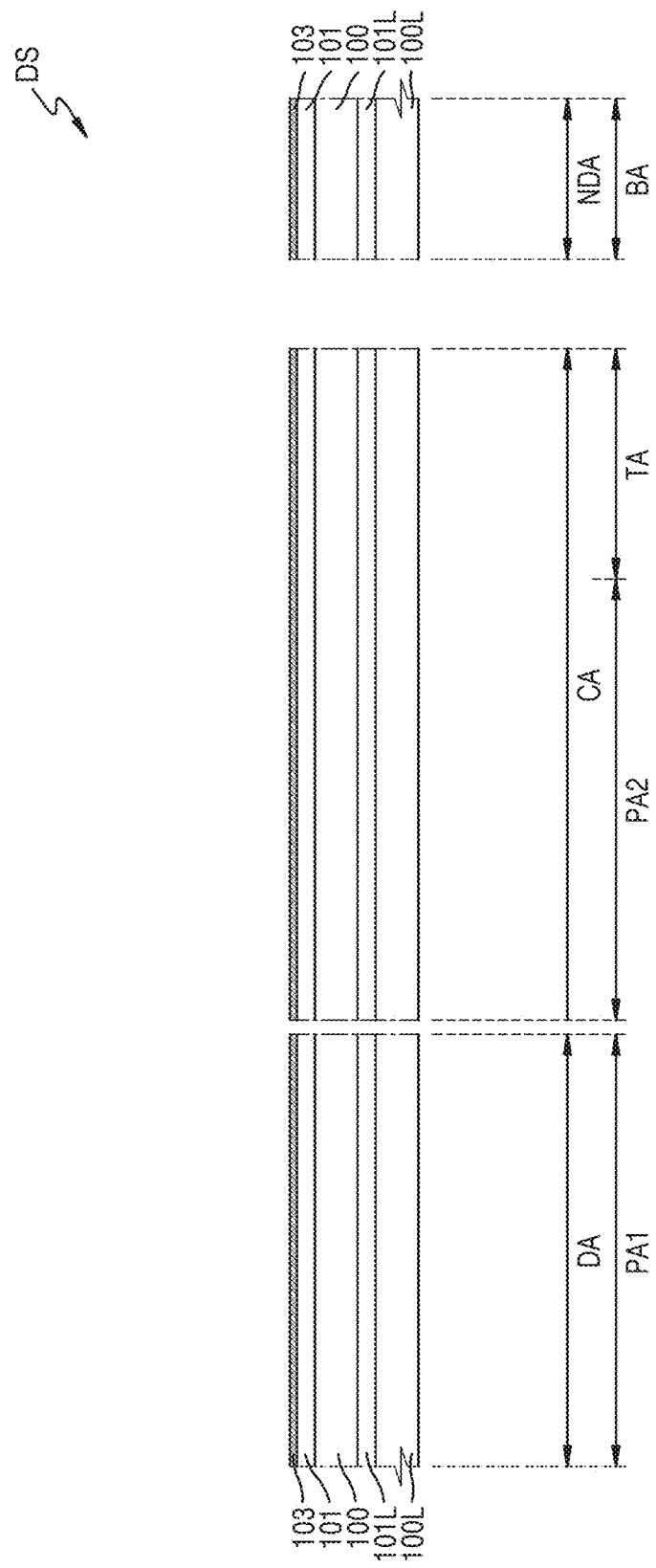

Referring to FIG. 7B, a blocking layer 103 may be provided or formed on the first inorganic layer 101. The blocking layer 103 may be on the first inorganic layer 101. The blocking layer 103 may include a material capable of blocking light. The blocking layer 103 may include at least one selected from a-Si, poly-Si, crystalline-Si, zinc oxide (ZnO), and IZO.

Figure 7C:
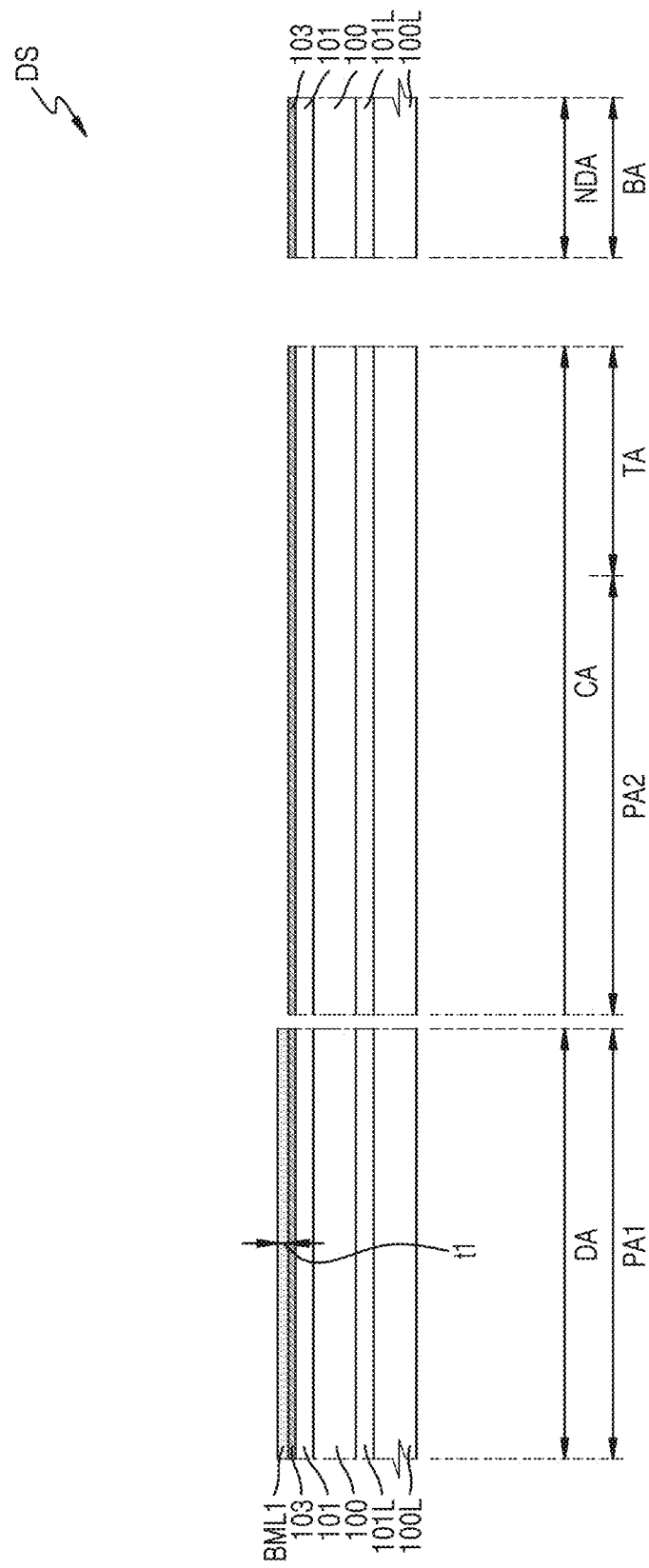

Referring to FIG. 7C, a first metal layer BML1 may be provided or formed on the blocking layer 103. The first metal layer BML1 may overlap the first pixel area PA1. The first metal layer BML1 may have a first thickness t1. The first metal layer BML1 may include a metal material. In an embodiment, the first metal layer BML1 may be formed by completely forming a metal material-containing layer on the display substrate DS and then performing patterning thereon. FIG. 7C illustrates an embodiment where the first metal layer BML1 is completely in the display area DA, but in an alternative embodiment, the first metal layer BML1 may be only in a portion of the display area DA.

Figure 7D:
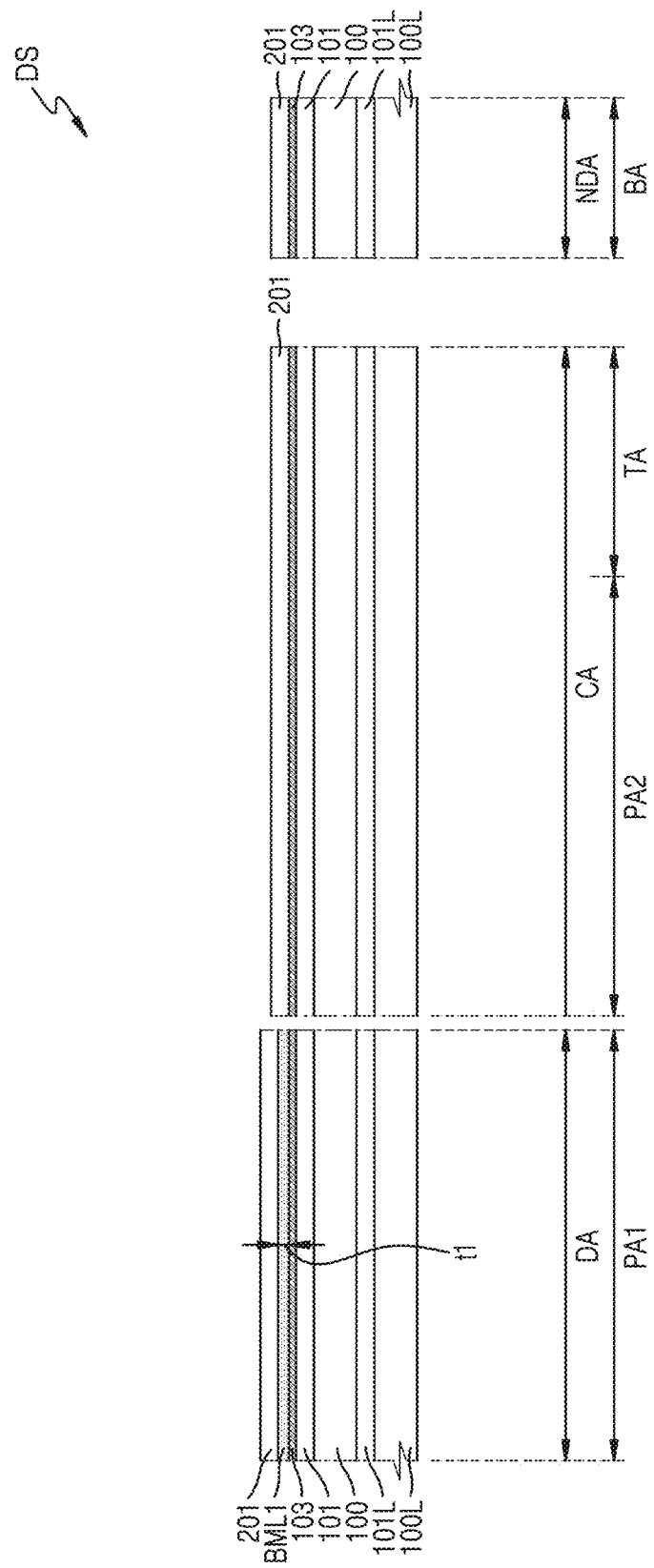

Referring to FIG. 7D, a second inorganic layer 201 may be provided or formed on the blocking layer 103. The second inorganic layer 201 may be completely formed in the first pixel area PA1, the second pixel area PA2, the transmission area TA, and the bending area BA. In an embodiment, after the first metal layer BML1 is formed, the second inorganic layer 201 may be formed. Therefore, the second inorganic layer 201 may cover the first metal layer BML1. The second inorganic layer 201 may include an inorganic material such as silicon nitride ($SiN_x$), silicon oxynitride (SiON), and/or silicon oxide ($SiO_2$), and may have a single layer structure or a multiple layer structure, each layer therein including at least selected from the above-described inorganic materials.

Figure 7E:
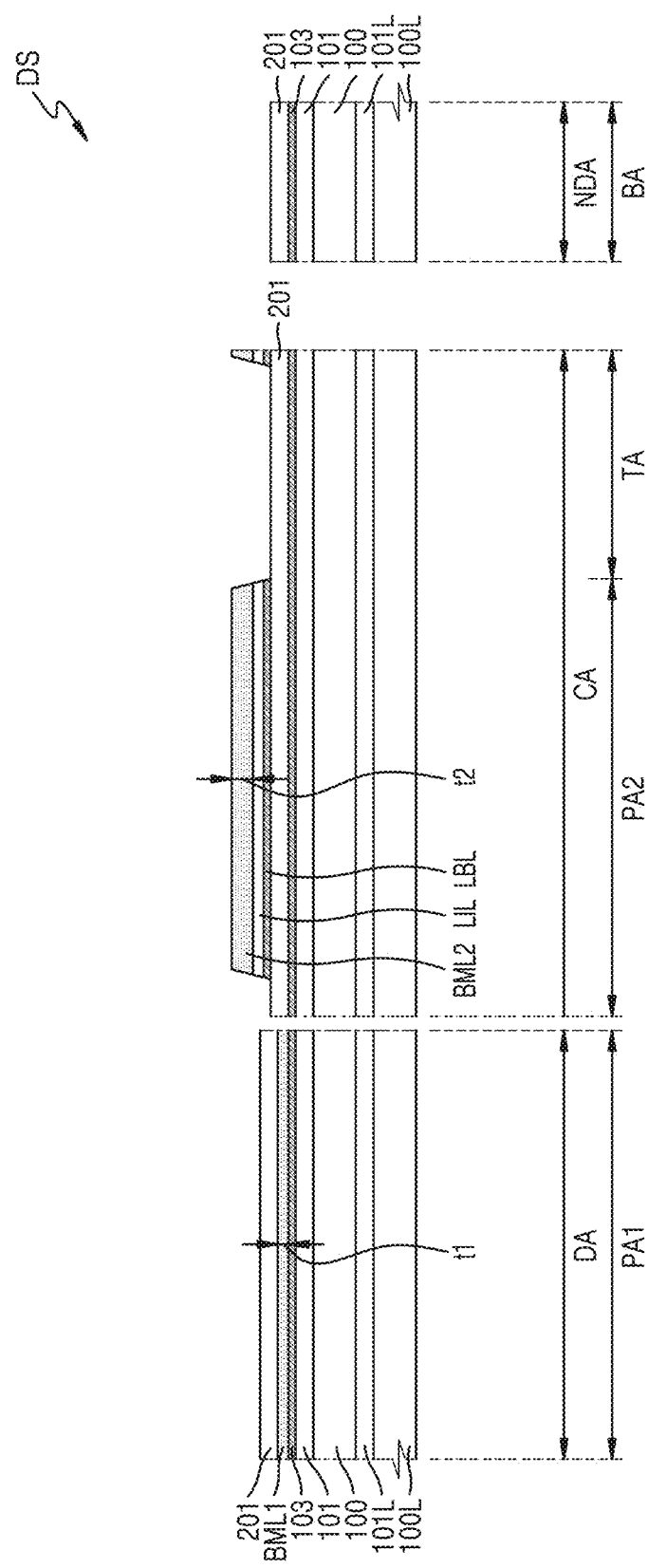

Referring to FIG. 7E, a lower blocking layer LBL may be provided or formed on the second inorganic layer 201. The lower blocking layer LBL may overlap the second pixel area PA2. The lower blocking layer LBL may not overlap the transmission area TA. The lower blocking layer LBL may include a material capable of blocking light. The lower blocking layer LBL may include at least one selected from a-Si, poly-Si, crystalline-Si, zinc oxide (ZnO), and IZO.

A lower inorganic layer LIL may be provided or formed on the lower blocking layer LBL. The lower inorganic layer LIL may overlap the second pixel area PA2. The lower inorganic layer LIL may not overlap the transmission area TA. The lower inorganic layer LIL may include an inorganic material such as silicon nitride ($SiN_x$), silicon oxynitride (SiON), and/or silicon oxide ($SiO_2$), and may have a single layer structure or a multiple layer structure, each layer therein including at least selected from the above-described inorganic materials.

A second metal layer BML2 may be provided or formed on the lower inorganic layer LIL. In an embodiment, after the second inorganic layer 201 is formed, the second metal layer BML2 may be formed. The second metal layer BML2 may overlap the second pixel area PA2. The second metal layer BML2 may not overlap the transmission area TA. The second metal layer BML2 may have a second thickness t2. In an embodiment, the second thickness t2 may be different from the first thickness t1. In an embodiment, for example, the second thickness t2 may be greater than the first thickness t1. In an alternative embodiment, the second thickness t2 may be less than the first thickness t1. In an alternative embodiment, the second thickness t2 may be equal to the first thickness t1. The second metal layer BML2 may include a metal material. In an embodiment, the lower blocking layer LBL, the lower inorganic layer LIL, and the second metal layer BML2 may be patterned in a same process. The lower blocking layer LBL, the lower inorganic layer LIL, and the second metal layer BML2 may prevent or reduce light reflection or scattering in the component area CA.

Figure 7F:
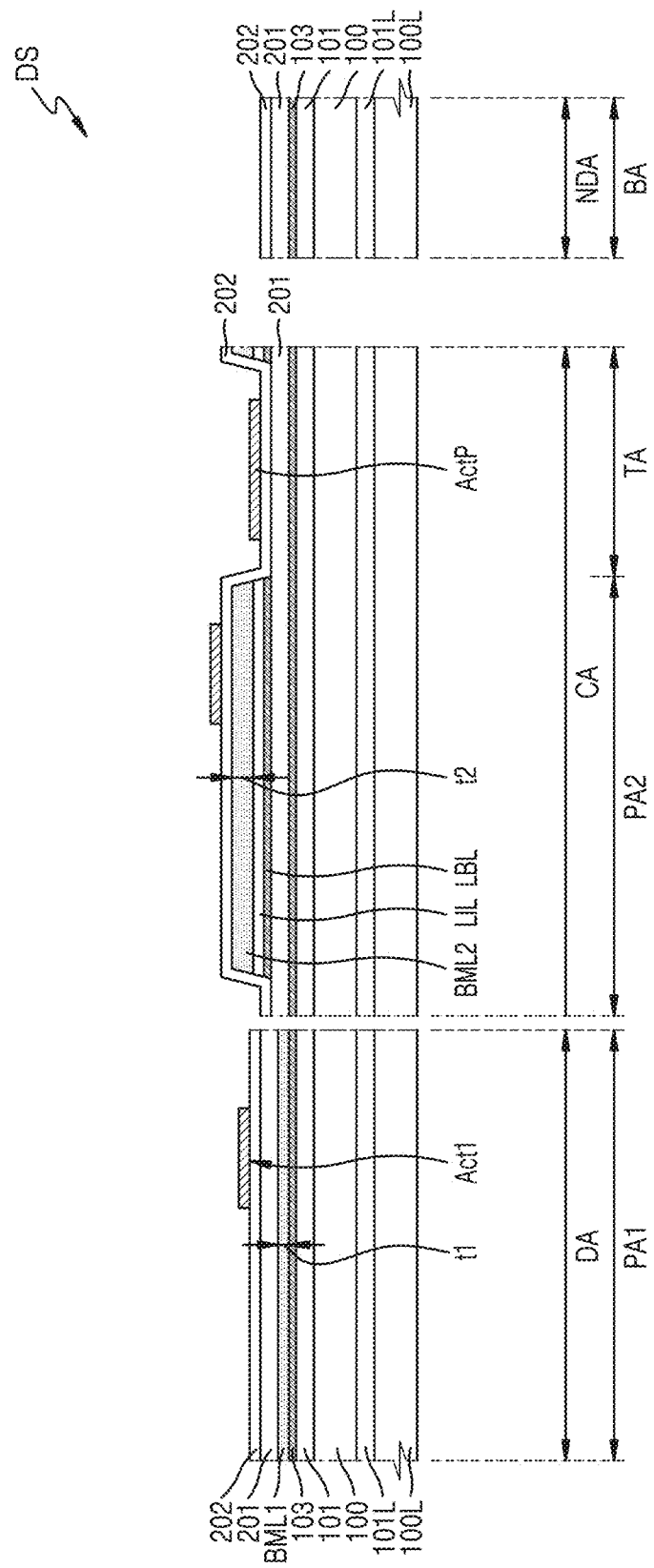

Referring to FIG. 7F, a buffer layer 202 may be provided or formed. The buffer layer 202 may be formed on the first metal layer BML1 and the second metal layer BML2. In an embodiment, the buffer layer 202 may be formed on the second inorganic layer 201 in the first pixel area PA1. The buffer layer 202 may be formed on the second metal layer BML2 in the second pixel area PA2. The buffer layer 202 may be formed on the second inorganic layer 201 in the transmission area TA. The buffer layer 202 may be formed on the second inorganic layer 201 in the bending area BA.

A first semiconductor layer Act1 may be provided or formed. The first semiconductor layer Act1 may be formed on the blocking layer 103. In an embodiment, the first semiconductor layer Act1 may be formed on the buffer layer 202. The first semiconductor layer Act1 may include a silicon semiconductor.

The first semiconductor layer Act1 may be formed by forming an amorphous silicon-containing layer and then performing a laser crystallization process, for example, an ELA process, on the amorphous silicon-containing layer. If the blocking layer 103 is omitted, foreign material is on the amorphous silicon-containing layer, and ultraviolet rays are radiated to the foreign material, the substrate 100 under the amorphous silicon-containing layer may be damaged. In an embodiment, because the blocking layer 103 is on the substrate 100, the arrival of the ultraviolet rays at the substrate 100 may be prevented or reduced even when foreign material is on the amorphous silicon-containing layer. Therefore, the blocking layer 103 may protect the substrate 100.

A semiconductor pattern ActP may be provided or formed on the blocking layer 103. In an embodiment, the semiconductor pattern ActP may be formed on the buffer layer 202. The semiconductor pattern ActP may overlap the transmission area TA. The semiconductor pattern ActP may be formed in a same process as the first semiconductor layer Act1 without performing an additional process. The semiconductor pattern ActP and the first semiconductor layer Act1 may include a same material as each other. The semiconductor pattern ActP may include a silicon semiconductor. In an embodiment, for example, the semiconductor pattern ActP may include polysilicon.

Figure 7G:
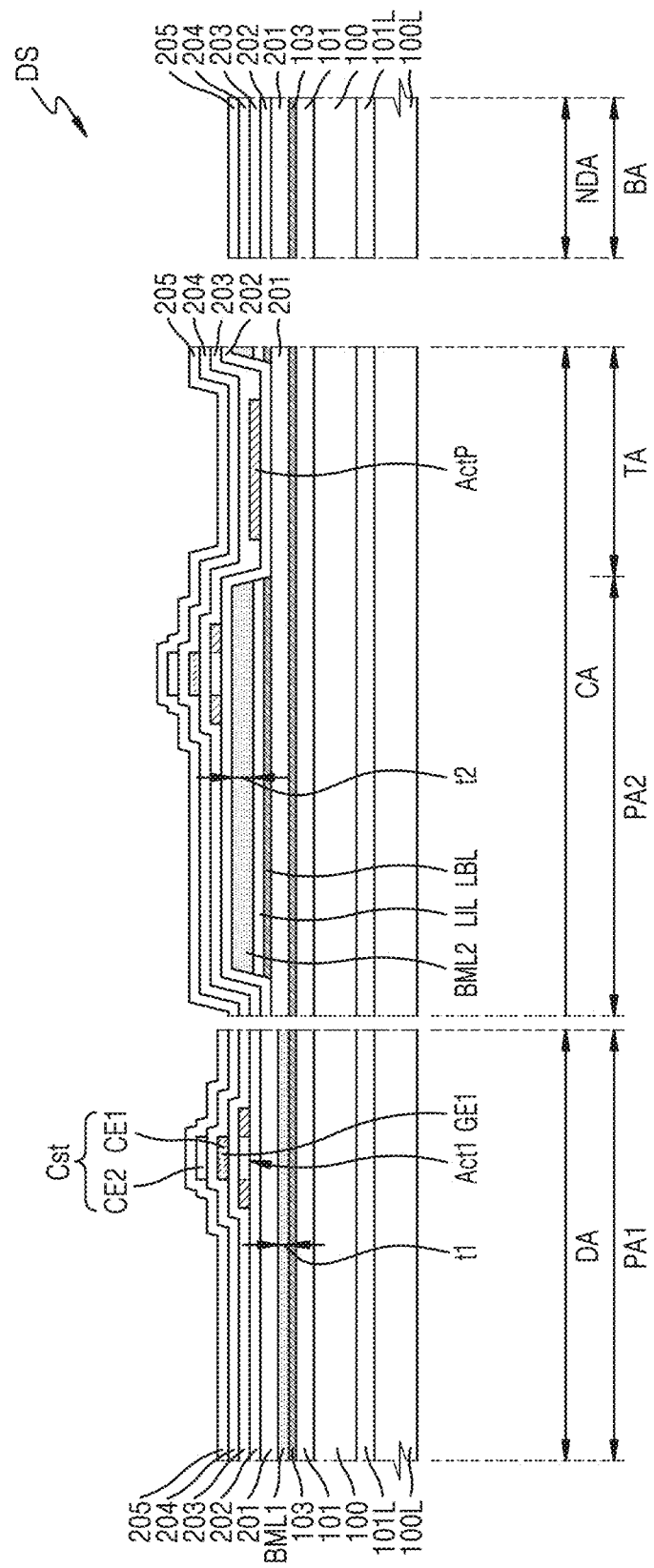

Referring to FIG. 7G, a first inorganic insulating layer 203 may be provided or formed on the first semiconductor layer Act1. The first inorganic insulating layer 203 may be continuously or commonly formed in the first pixel area PA1, the second pixel area PA2, the transmission area TA, and the bending area BA. The first inorganic insulating layer 203 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

A first gate electrode GE1 may be provided or formed on the first inorganic insulating layer 203. The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), and the like, and may have a single layer structure or a multiple layer structure, each layer therein including at least selected from the above-described materials.

A gate insulating layer 204 may be provided or formed on the first gate electrode GE1. The gate insulating layer 204 may be continuously or commonly formed in the first pixel area PA1, the second pixel area PA2, the transmission area TA, and the bending area BA. The gate insulating layer 204 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

A second electrode CE2 may be provided or formed on the gate insulating layer 204. The second electrode CE2 may overlap the first gate electrode GE1. The second electrode CE2 may constitute a storage capacitor Cst with the first gate electrode GE1 overlapping the second electrode CE2 with the gate insulating layer 204 therebetween. That is, the first gate electrode GE1 may function as a first electrode CE1 of the storage capacitor Cst.

An intermediate insulating layer 205 may be provided or formed on the second electrode CE2. The intermediate insulating layer 205 may be continuously or commonly formed in the first pixel area PA1, the second pixel area PA2, the transmission area TA, and the bending area BA. The intermediate insulating layer 205 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

Figure 7H:
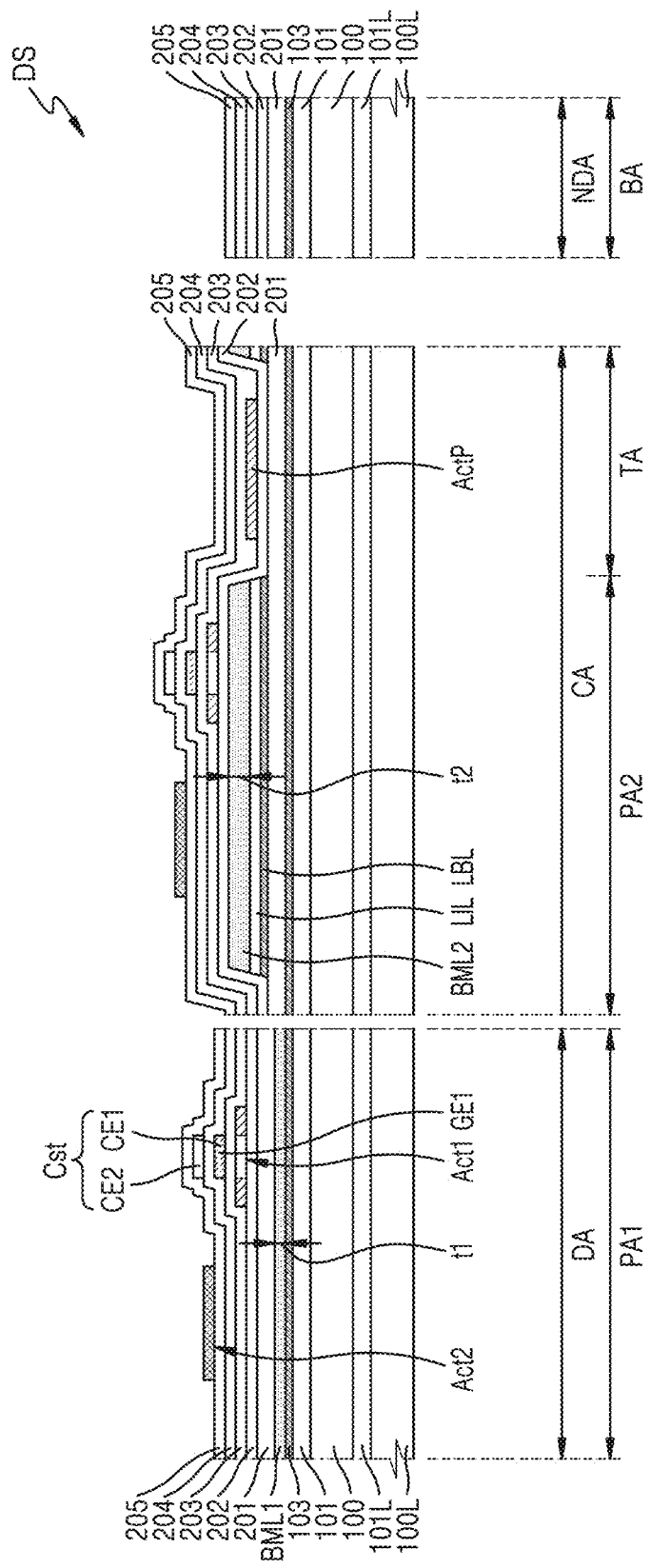

Referring to FIG. 7H, a second semiconductor layer Act2 may be formed. The second semiconductor layer Act2 may be formed on the first inorganic insulating layer 203. In an embodiment, the second semiconductor layer Act2 may be formed on the intermediate insulating layer 205. The second semiconductor layer Act2 may include an oxide semiconductor. In an embodiment, for example, the second semiconductor layer Act2 may include a Zn oxide-based material such as Zn oxide, In—Zn oxide, or Ga—In—Zn oxide. Alternatively, the second semiconductor layer Act2 may include IGZO, ITZO, or IGTZO semiconductor, in which a metal such as indium (In), gallium (Ga), or tin (Sn) is included in zinc oxide (ZnO).

Figure 7I:
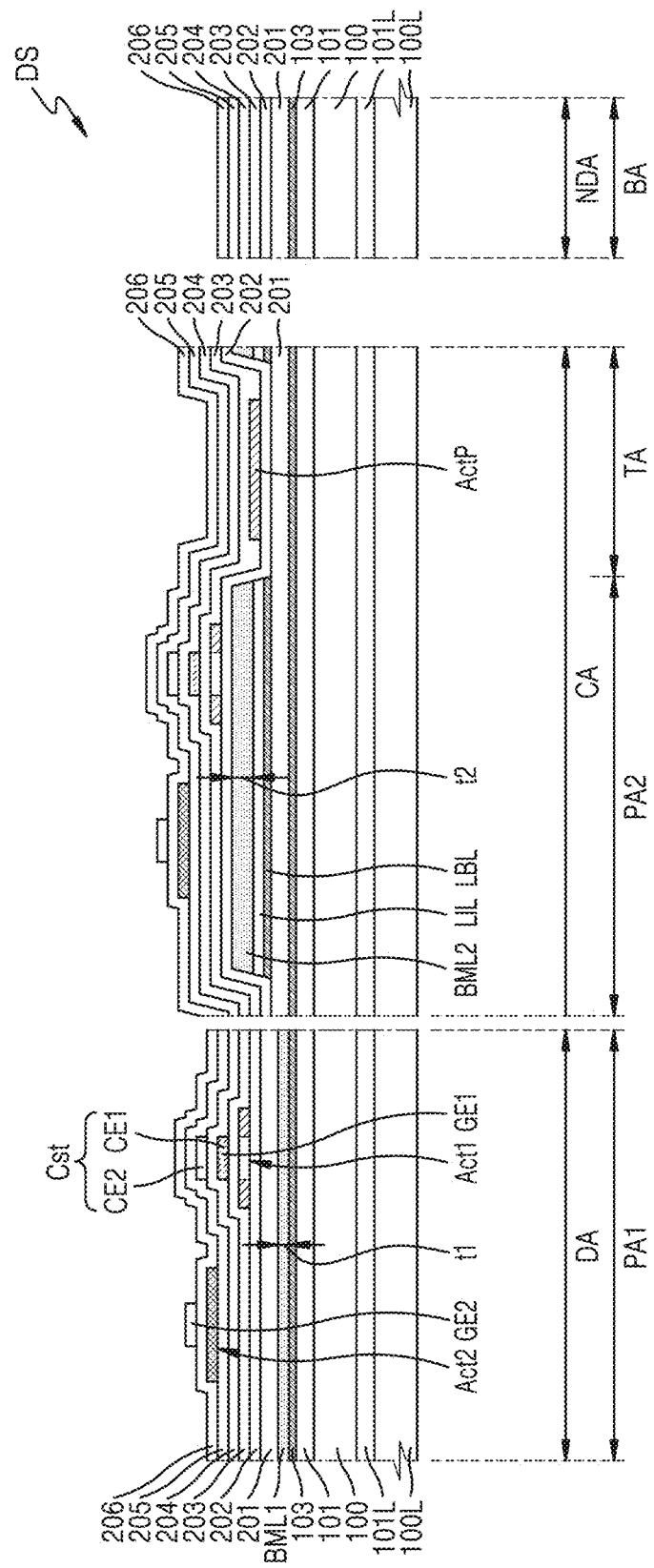

Referring to FIG. 7I, a second inorganic insulating layer 206 may be provided or formed on the second semiconductor layer Act2. The second inorganic insulating layer 206 may be continuously or commonly formed in the first pixel area PA1, the second pixel area PA2, the transmission area TA, and the bending area BA. The second inorganic insulating layer 206 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

A second gate electrode GE2 may be provided or formed on the second inorganic insulating layer 206. The second gate electrode GE2 may overlap the second semiconductor layer Act2. The second gate electrode GE2 may include a low-resistance metal material. The second gate electrode GE2 may include a conductive material including molybdenum (Mo), aluminum (Al), copper (Cu), titanium (Ti), and the like, and may have a single layer structure or a multiple layer structure, each layer therein including at least selected from the above-described materials.

Figure 7J:
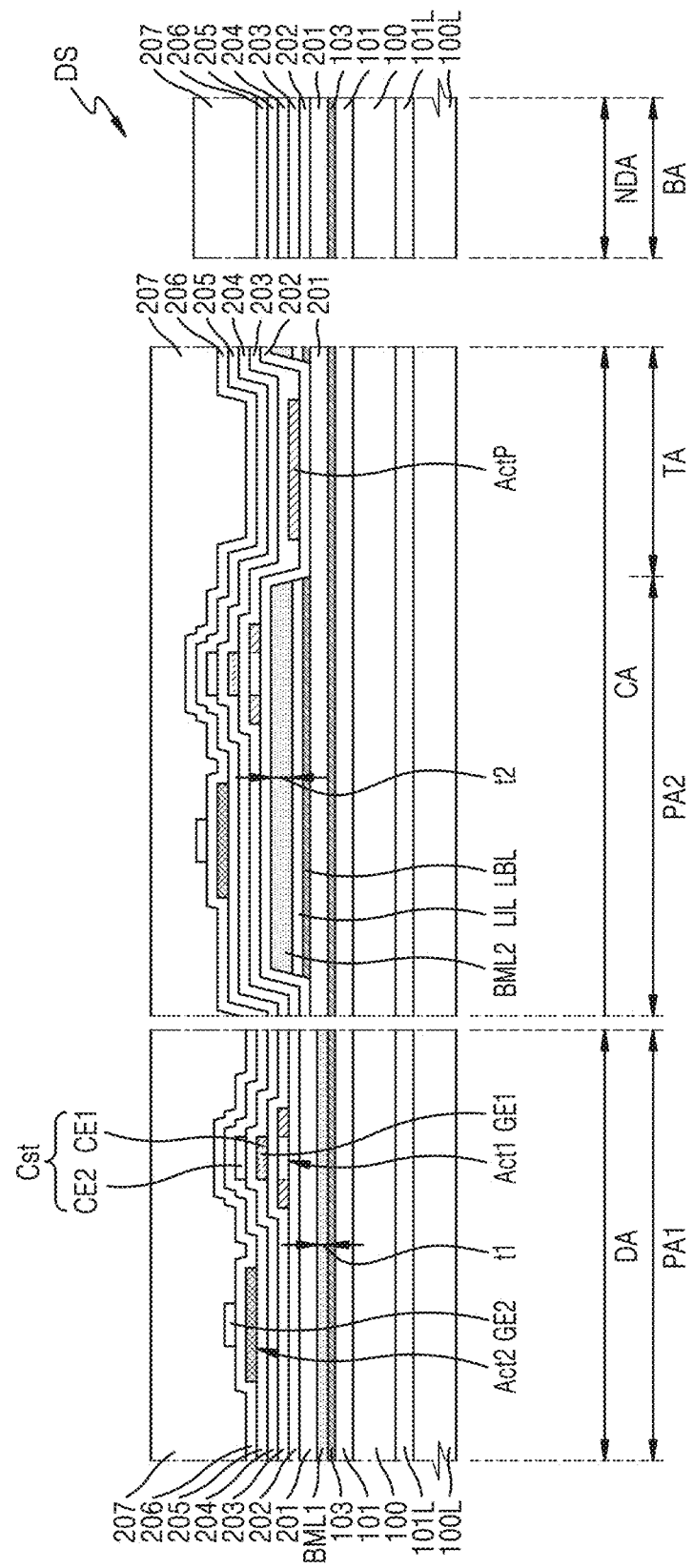

Referring to FIG. 7J, an interlayer insulating layer 207 may be provided or formed. The interlayer insulating layer 207 may be formed on the second inorganic insulating layer 206. The interlayer insulating layer 207 may be continuously or commonly formed in the first pixel area PA1, the second pixel area PA2, the transmission area TA, and the bending area BA. The interlayer insulating layer 207 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 207 may have a single layer structure or a multiple layer structure, each layer therein including at least selected from the above-described inorganic insulating materials.

Figure 7K:
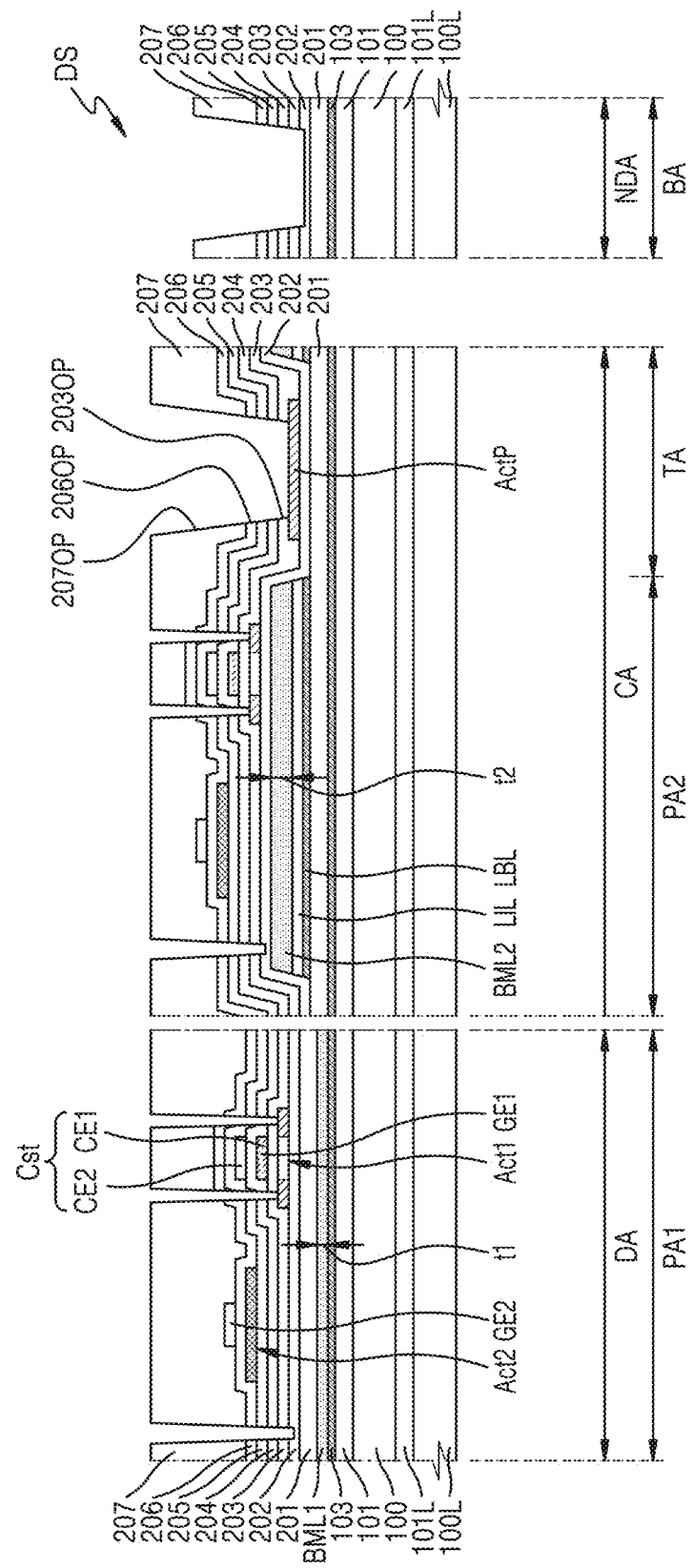

Referring to FIG. 7K, an interlayer insulating layer opening 2070P overlapping the transmission area TA may be formed in the interlayer insulating layer 207. In an embodiment, a process of forming the interlayer insulating layer opening 2070P may be a dry etching process.

In an embodiment, a second insulating layer opening 206OP overlapping the transmission area TA may be formed in the second inorganic insulating layer 206, an intermediate insulating layer opening overlapping the transmission area TA may be formed in the intermediate insulating layer 205, a gate insulating layer opening overlapping the transmission area TA may be formed in the gate insulating layer 204, and a first insulating layer opening 2030P overlapping the transmission area TA may be formed in the first inorganic insulating layer 203.

At least a portion of the semiconductor pattern ActP may be exposed. In an embodiment, at least a portion of each of the interlayer insulating layer 207, the second inorganic insulating layer 206, the intermediate insulating layer 205, the gate insulating layer 204, and the first inorganic insulating layer 203 may be removed to expose at least a portion of the semiconductor pattern ActP.

When the interlayer insulating layer opening 2070P is formed, at least a portion of the first semiconductor layer Act1 may be exposed. In an embodiment, at least a portion of each of the interlayer insulating layer 207, the second inorganic insulating layer 206, the intermediate insulating layer 205, the gate insulating layer 204, and the first inorganic insulating layer 203 may be removed to expose a least a portion of the first semiconductor layer Act1.

When the interlayer insulating layer opening 2070P is formed, an opening of the interlayer insulating layer 207 overlapping the bending area BA, an opening of the second inorganic insulating layer 206 overlapping the bending area BA, an opening of the intermediate insulating layer 205 overlapping the bending area BA, an opening of the gate insulating layer 204 overlapping the bending area BA, an opening of the first inorganic insulating layer 203 overlapping the bending area BA, and a groove of the buffer layer 202 may be formed.

If the semiconductor pattern ActP is omitted, similar to the bending area BA when the interlayer insulating layer opening 207OP is formed, the interlayer insulating layer opening 207OP, the second insulating layer opening 206OP, the opening of the intermediate insulating layer 205 overlapping the transmission area TA, the opening of the gate insulating layer 204 overlapping the transmission area TA, the first insulating layer opening 203OP, and the groove of the buffer layer 202 overlapping the transmission area TA may be formed.

In an embodiment, the semiconductor pattern ActP may be between the buffer layer 202 and the first inorganic insulating layer 203, and the semiconductor pattern ActP may prevent or reduce the removal of the buffer layer 202, the second inorganic layer 201, the blocking layer 103, and the first inorganic layer 101 from the transmission area TA. In such an embodiment, the etching amount of the insulating layers in the transmission area TA may be less than the etching amount of the insulating layers in the bending area BA.

In an embodiment, after the first semiconductor layer Act1 is exposed, the first semiconductor layer Act1 may be wet-etched. In an embodiment, for example, the first semiconductor layer Act1 may be wet-etched by using ammonium fluoride ($NH_4F$) and hydrogen fluoride (HF). Therefore, silicon oxide ($SiO_2$) formed on the upper surface of the first semiconductor layer Act1 may be removed by a dry etching process.

Figure 7L:
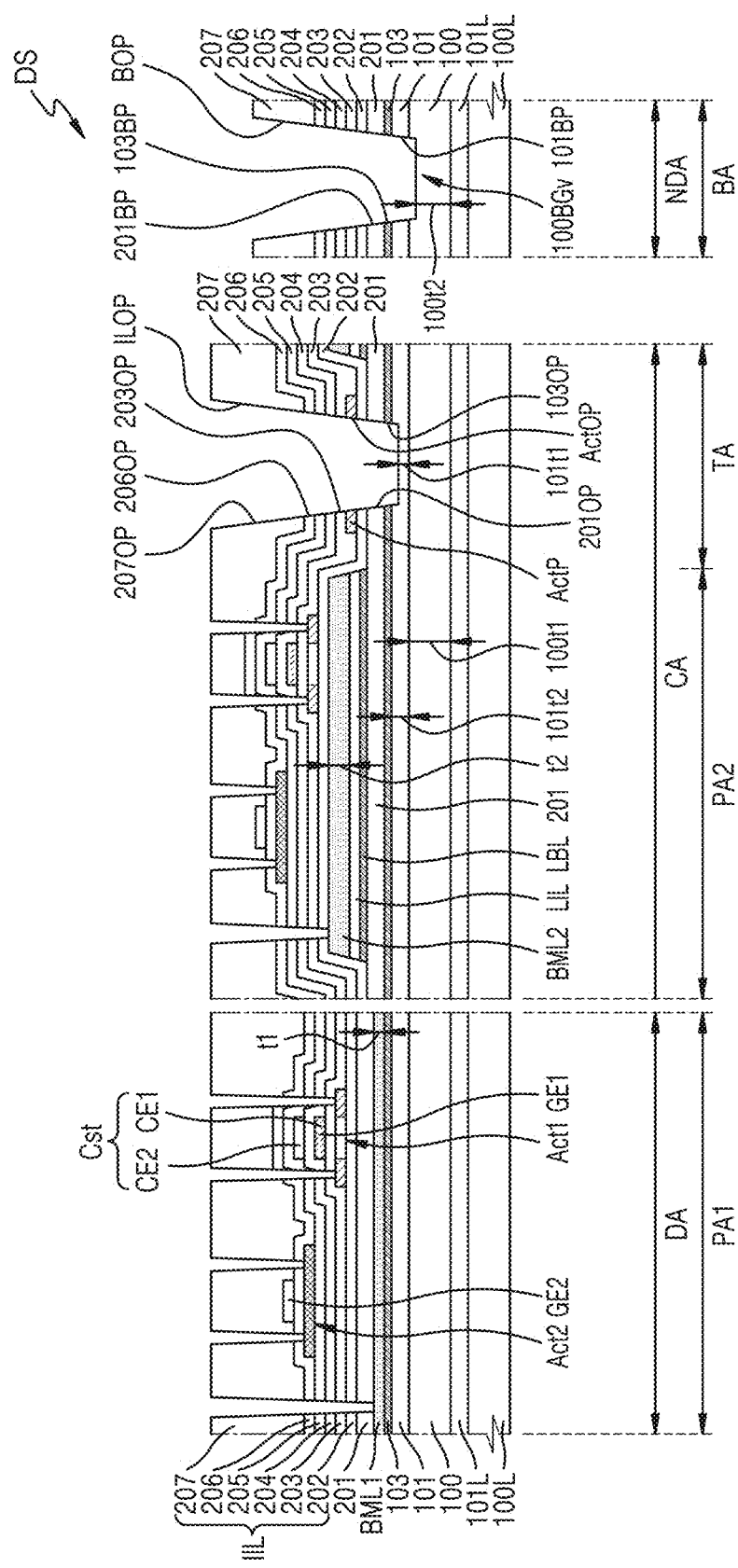

Referring to FIG. 7L, at least a portion of the semiconductor pattern ActP may be removed. The semiconductor pattern ActP may be removed by an etching process. In an embodiment, the etching process may be a dry etching process. In an embodiment, a semiconductor pattern opening ActOP overlapping the transmission area TA may be formed in the semiconductor pattern ActP.

A buffer layer opening overlapping the transmission area TA may be formed in the buffer layer 202. Therefore, a transmission opening ILOP of the inorganic insulating layer IIL overlapping the transmission area TA may be formed. An inorganic layer opening 201OP overlapping the transmission area TA may be formed in the second inorganic layer 201. The inorganic layer opening 201OP may overlap the transmission opening ILOP. A blocking layer opening 103OP overlapping the transmission area TA may be formed in the blocking layer 103. The blocking layer opening 103OP may overlap the inorganic layer opening 201OP.

The first inorganic layer 101 may remain in the transmission area TA. The first inorganic layer 101 may be continuously or commonly arranged in the second pixel area PA2 and the transmission area TA. In an embodiment, a thickness 101t1 of a portion of the first inorganic layer 101 overlapping the transmission area TA may be less than a thickness 101t2 of another portion of the first inorganic layer 101 overlapping the second pixel area PA2. In such an embodiment, the first inorganic layer 101 may have a groove in the transmission area TA.

An opening overlapping the bending area BA may be formed in the buffer layer 202. In such an embodiment, a bending opening BOP of the inorganic insulating layer IIL overlapping the bending area BA may be formed. An upper opening 201BP overlapping the bending area BA may be formed in the second inorganic layer 201. The upper opening 201BP may overlap the bending opening BOP. An intermediate opening 103BP overlapping the bending area BA may be formed in the blocking layer 103. The intermediate opening 103BP may overlap the upper opening 201BP. A lower opening 101BP overlapping the bending area BA may be formed in the first inorganic layer 101. The lower opening 101BP may overlap the intermediate opening 103BP.

In an embodiment, a bending groove 100BGv overlapping the bending area BA may be formed in the substrate 100. In such an embodiment, a thickness 100t2 of a portion of the substrate 100 in the bending area BA may be less than a thickness 100t1 of another portion of the substrate 100 in the component area CA. Alternatively, the thickness 100t2 of the portion of the substrate 100 in the bending area BA may be less than the thickness 100t1 of the other portion of the substrate 100 in the transmission area TA.

When the blocking layer opening 103OP is formed, at least a portion of the second semiconductor layer Act2 may be exposed. In such an embodiment, when the blocking layer opening 103OP and the intermediate opening 103BP are formed in the blocking layer 103 and the lower opening 101BP is formed in the first inorganic layer 101, at least a portion of the interlayer insulating layer 207 may be removed to expose at least a portion of the second semiconductor layer Act2.

In an embodiment, when the blocking layer opening 103OP is formed, at least a portion of the first metal layer BML1 and/or the second metal layer BML2 may be exposed.

In an embodiment, the blocking layer opening 103OP overlapping the transmission area TA and the intermediate opening 103BP overlapping the bending area BA may be formed in the blocking layer 103, and the lower opening 101BP overlapping the intermediate opening 103BP may be formed in the first inorganic layer 101. In such an embodiment, the first inorganic layer 101 may remain in the transmission area TA.

In such an embodiment, the semiconductor pattern ActP may be first removed to form the blocking layer opening 103OP. Therefore, the semiconductor pattern ActP may delay the etching process in the transmission area TA, and the first inorganic layer 101 may remain in the transmission area TA. In such an embodiment, because infiltration of moisture or foreign material into the transmission area TA is prevented or reduced, the light transmittance or sound transmittance of the display panel 10 may be increased in the transmission area TA. In such an embodiment, because the first inorganic layer 101, the blocking layer 103, the second inorganic layer 201, and the inorganic insulating layer IIL may include openings in the bending area BA, respectively, the manufactured display device and/or display panel may be flexible in the bending area BA.

In such an embodiment, while leaving the first inorganic layer 101 in the transmission area TA without an additional process, the blocking layer opening 103OP overlapping the transmission area TA and the intermediate opening 103BP overlapping the bending area BA may be formed in the blocking layer 103, and the lower opening 101BP overlapping the intermediate opening 103BP may be formed in the first inorganic layer 101. Therefore, a display device having high reliability may be efficiently manufactured.

Figure 8A:
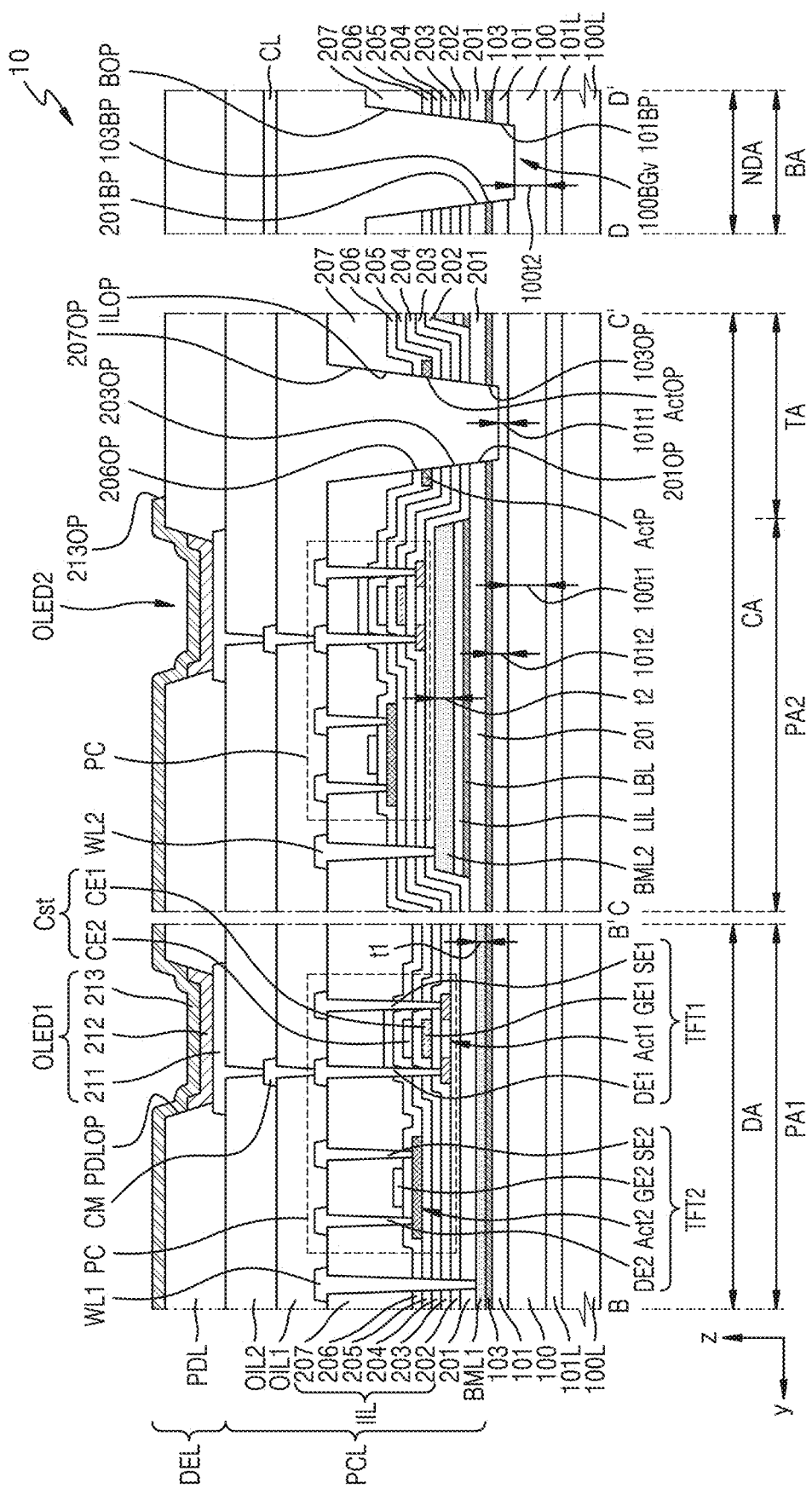
FIGS. 8A and 8B are schematic cross-sectional views of the display panel taken along lines B-B', C-C', and D-D' of FIG. 4, according to various embodiments.
Figure 8B:
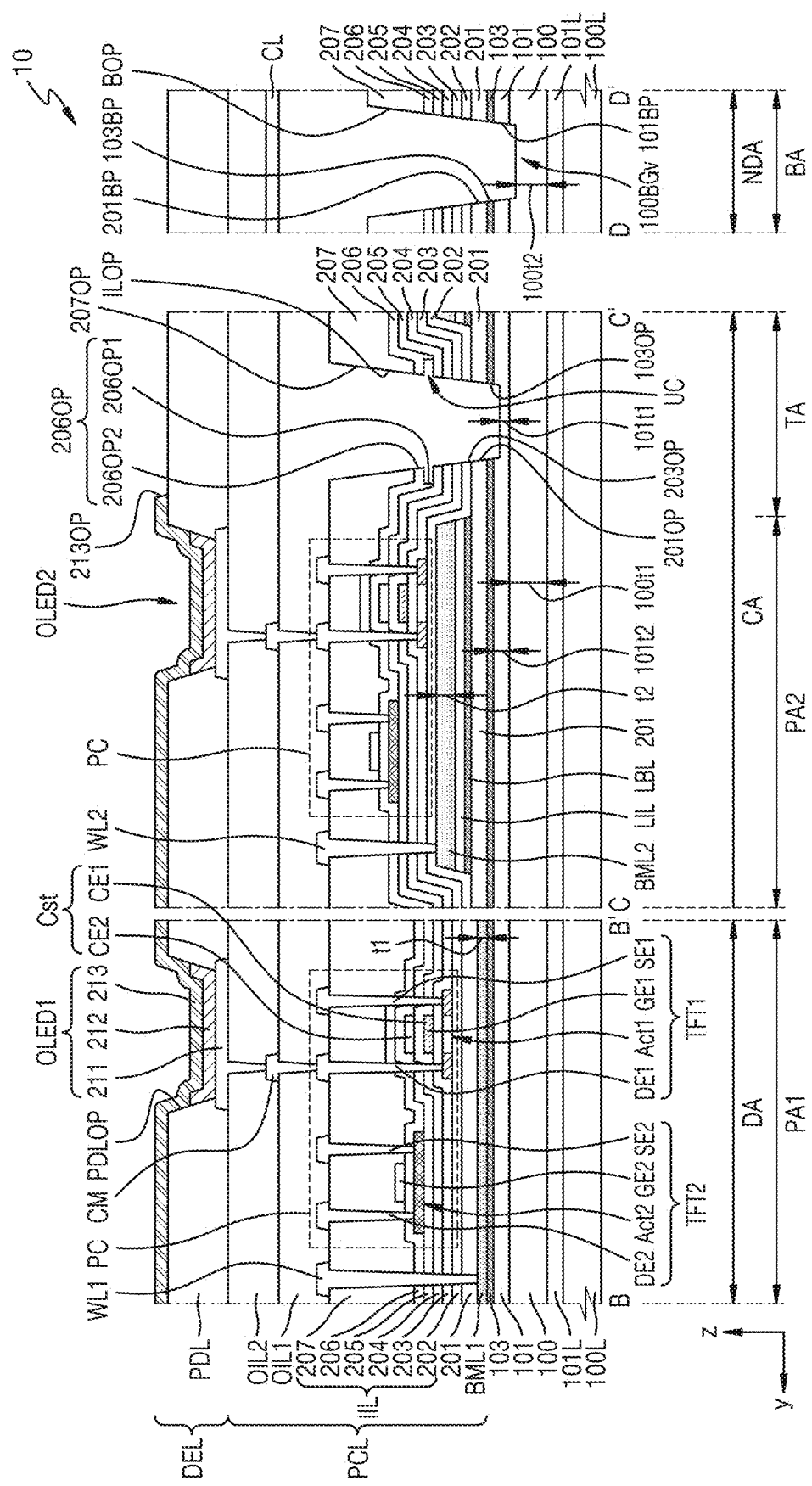

FIGS. 8A and 8B are schematic cross-sectional views of the display panel 10 taken along lines B-B', C-C', and D-D' of FIG. 4, according to various embodiments. In FIGS. 8A and 8B, the same reference numerals as those of FIG. 6 denote the same elements, and thus, any repetitive detailed descriptions thereof may be omitted.

Referring to FIGS. 8A and 8B, an embodiment of the display panel 10 may include a substrate 100, a first inorganic layer 101, an additional organic layer 100L, a first additional inorganic layer 101L, a pixel circuit layer PCL, and a display element layer DEL.

The substrate 100 may include a display area DA, a component area CA, and a non-display area NDA. The display area DA may include a first pixel area PA1. The component area CA may be adjacent to the display area DA. The component area CA may include a second pixel area PA2 and a transmission area TA.

The first inorganic layer 101 may be on the substrate 100. The first inorganic layer 101 may overlap the first pixel area PA1, the second pixel area PA2, and the transmission area TA. In an embodiment, the first inorganic layer 101 may be continuously arranged in the first pixel area PA1, the second pixel area PA2, and the transmission area TA.

The blocking layer 103 may be on the first inorganic layer 101. The blocking layer 103 may include at least one selected from a-Si, poly-Si, crystalline-Si, zinc oxide (ZnO), and IZO.

The blocking layer 103 may include a blocking layer opening 103OP. The blocking layer opening 103OP may overlap the transmission area TA. Because the blocking layer 103 includes the blocking layer opening 103OP overlapping the transmission area TA, the light transmittance of the display panel 10 in the transmission area TA may be increased.

The pixel circuit layer PCL may be on the blocking layer 103. In an embodiment, the pixel circuit layer PCL may be between the blocking layer 103 and the display element layer DEL.

Referring to FIG. 8A, in an embodiment, the pixel circuit layer PCL may include a first metal layer BML1, a second inorganic layer 201, a lower blocking layer LBL, a lower inorganic layer LIL, a second metal layer BML2, a pixel circuit PC, a first line WL1, a second line WL2, a semiconductor pattern ActP, a connection electrode CM, and a plurality of insulating layers. The insulating layers may include an inorganic insulating layer IIL, a first organic insulating layer OIL1, and a second organic insulating layer OIL2. The inorganic insulating layer IIL may include a buffer layer 202, a first inorganic insulating layer 203, a gate insulating layer 204, an intermediate insulating layer 205, a second inorganic insulating layer 206, and an interlayer insulating layer 207.

The semiconductor pattern ActP may overlap the transmission area TA. In an embodiment, the semiconductor pattern ActP may be between the first inorganic insulating layer 203 and the second inorganic insulating layer 206. In an embodiment, the semiconductor pattern ActP may be between the intermediate insulating layer 205 and the second inorganic insulating layer 206. In such an embodiment, the semiconductor pattern ActP and the second semiconductor layer Act2 may be in or directly on a same layer as each other.

In an embodiment, the semiconductor pattern ActP may include a semiconductor pattern opening ActOP. The semiconductor pattern opening ActOP may overlap the blocking layer opening 103OP.

The semiconductor pattern ActP and the second semiconductor layer Act2 may include a same material as each other. The semiconductor pattern ActP may include an oxide semiconductor. In an embodiment, for example, the semiconductor pattern ActP may include a Zn oxide-based material such as Zn oxide, In—Zn oxide, or Ga—In—Zn oxide. Alternatively, the semiconductor pattern ActP may include IGZO, ITZO, or IGTZO semiconductor, in which a metal such as indium (In), gallium (Ga), or tin (Sn) is included in zinc oxide (ZnO). The semiconductor pattern ActP and the second semiconductor layer Act2 may be formed in a same process. When the transmission opening ILOP is formed in the inorganic insulating layer IIL arranged in the transmission area TA, the blocking layer 103 is etched to form the blocking layer opening 103OP. The semiconductor pattern ActP may reduce an etch rate so that the first inorganic layer 101 does not include an opening.

Referring to FIG. 8B, in an alternative embodiment, the pixel circuit layer PCL may include a first metal layer BML1, a second inorganic layer 201, a lower blocking layer LBL, a lower inorganic layer LIL, a second metal layer BML2, a pixel circuit PC, a first line WL1, a second line WL2, a connection electrode CM, and a plurality of insulating layers. The insulating layers may include an inorganic insulating layer IIL, a first organic insulating layer OIL1, and a second organic insulating layer OIL2. The inorganic insulating layer IIL may include a buffer layer 202, a first inorganic insulating layer 203, a gate insulating layer 204, an intermediate insulating layer 205, a second inorganic insulating layer 206, and an interlayer insulating layer 207.

The second inorganic insulating layer 206 may include a second insulating layer opening 206OP overlapping the transmission area TA. In an embodiment, the second insulating layer opening 206OP may overlap the blocking layer opening 103OP. In an embodiment, the second insulating layer opening 206OP may include a lower insulating layer opening 206OP1 and an upper insulating layer opening 206OP2. The lower insulating layer opening 206OP1 may be closer to the first inorganic layer 101 than the upper insulating layer opening 206OP2. In such an embodiment, the size of the upper insulating layer opening 206OP2 may be less than the size of the lower insulating layer opening 206OP1. The size of the upper insulating layer opening 206OP2 may be the area occupied by the upper insulating layer opening 206OP2. The size of the lower insulating layer opening 206OP1 may be the area occupied by the lower insulating layer opening 206OP1. In such an embodiment, the second inorganic insulating layer 206 may have an undercut shape UC overlapping the transmission area TA. The undercut shape UC may be a shape provided in the second inorganic insulating layer 206 after the removal of the semiconductor pattern including the oxide semiconductor and delaying the etching of the insulating layers overlapping the transmission area TA.

In an embodiment, the lower insulating layer opening 206OP1 and the upper insulating layer opening 206OP2 may overlap the first organic insulating layer OIL1. In such an embodiment, the first organic insulating layer OIL1 may fill the lower insulating layer opening 206OP1 and the upper insulating layer opening 206OP2.

FIGS. 9A to 9G are cross-sectional views schematically illustrating a display device that is manufactured by a method of manufacturing a display device, according to an alternative embodiment. In FIGS. 9A to 9G, the same reference numerals as those of FIGS. 7A to 7L denote the same elements, and thus, any repetitive detailed descriptions thereof may be omitted.

Figure 9A:
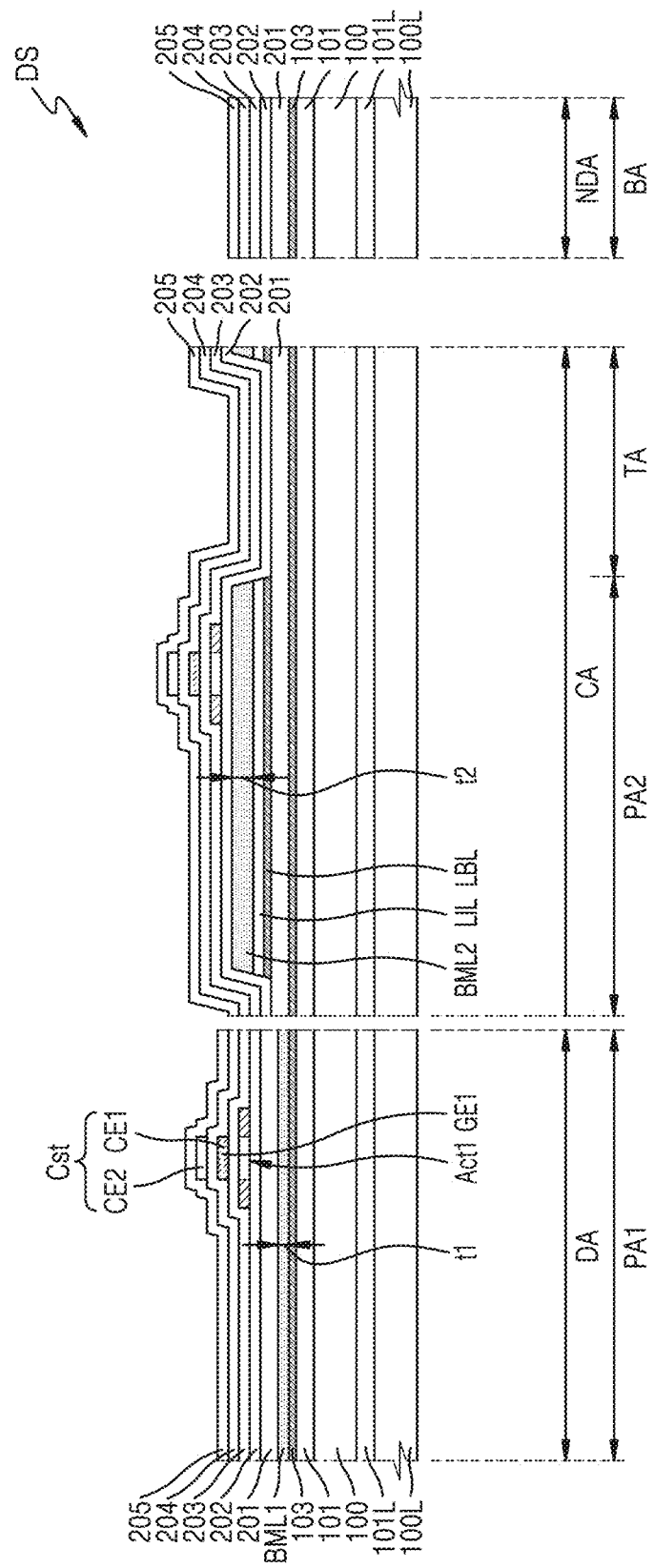
FIGS. 9A to 9G are cross-sectional views schematically illustrating a display device that is manufactured by a method of manufacturing a display device, according to an alternative embodiment.

Referring to FIG. 9A, a display substrate DS may be prepared. The display substrate DS may include a substrate 100, a first inorganic layer 101, an additional organic layer 100L, and a first additional inorganic layer 101L.

The substrate 100 may include a display area DA, a component area CA, and a non-display area NDA. The display area DA may include a first pixel area PA1. The component area CA may include a second pixel area PA2 and a transmission area TA. The non-display area NDA may include a bending area BA. In an embodiment, the substrate 100 may include an organic material.

The first inorganic layer 101 may be on the substrate 100. The first inorganic layer 101 may be continuously or commonly arranged in the first pixel area PA1, the second pixel area PA2, the transmission area TA, and the bending area BA.

A blocking layer 103 may be provided or formed on the first inorganic layer 101. The blocking layer 103 may be on the first inorganic layer 101.

A first metal layer BML1 may be provided or formed on the blocking layer 103. The first metal layer BML1 may overlap the first pixel area PA1.

A second inorganic layer 201 may be provided or formed on the blocking layer 103. The second inorganic layer 201 may be completely formed in the first pixel area PA1, the second pixel area PA2, the transmission area TA, and the bending area BA. In an embodiment, after the first metal layer BML1 is formed, the second inorganic layer 201 may be formed.

A lower blocking layer LBL, a lower inorganic layer LIL, and a second metal layer BML2 may be provided or formed on the second inorganic layer 201. The lower blocking layer LBL, the lower inorganic layer LIL, and the second metal layer BML2 may overlap the second pixel area PA2. The second metal layer BML2 may have a second thickness t2. In an embodiment, the second thickness t2 may be different from a first thickness t1 of the first metal layer BML1.

A buffer layer 202 may be provided or formed. The buffer layer 202 may be formed on the first metal layer BML1 and the second metal layer BML2.

A first semiconductor layer Act1 may be provided or formed. The first semiconductor layer Act1 may be provided or formed on the blocking layer 103. In an embodiment, the first semiconductor layer Act1 may be formed on the buffer layer 202. The first semiconductor layer Act1 may include a silicon semiconductor.

A first inorganic insulating layer 203 may be provided or formed on the first semiconductor layer Act1. The first inorganic insulating layer 203 may be continuously or commonly formed in the first pixel area PA1, the second pixel area PA2, the transmission area TA, and the bending area BA.

A first gate electrode GE1 may be provided or formed on the first inorganic insulating layer 203.

A gate insulating layer 204 may be provided or formed on the first gate electrode GE1.

The gate insulating layer 204 may be continuously or commonly formed in the first pixel area PA1, the second pixel area PA2, the transmission area TA, and the bending area BA.

A second electrode CE2 may be provided or formed on the gate insulating layer 204. The second electrode CE2 may overlap the first gate electrode GE1. The second electrode CE2 may constitute a storage capacitor Cst with the first gate electrode GE1 overlapping the second electrode CE2 with the gate insulating layer 204 therebetween.

An intermediate insulating layer 205 may be provided or formed on the second electrode CE2. The intermediate insulating layer 205 may be continuously or commonly formed in the first pixel area PA1, the second pixel area PA2, the transmission area TA, and the bending area BA.

Figure 9B:
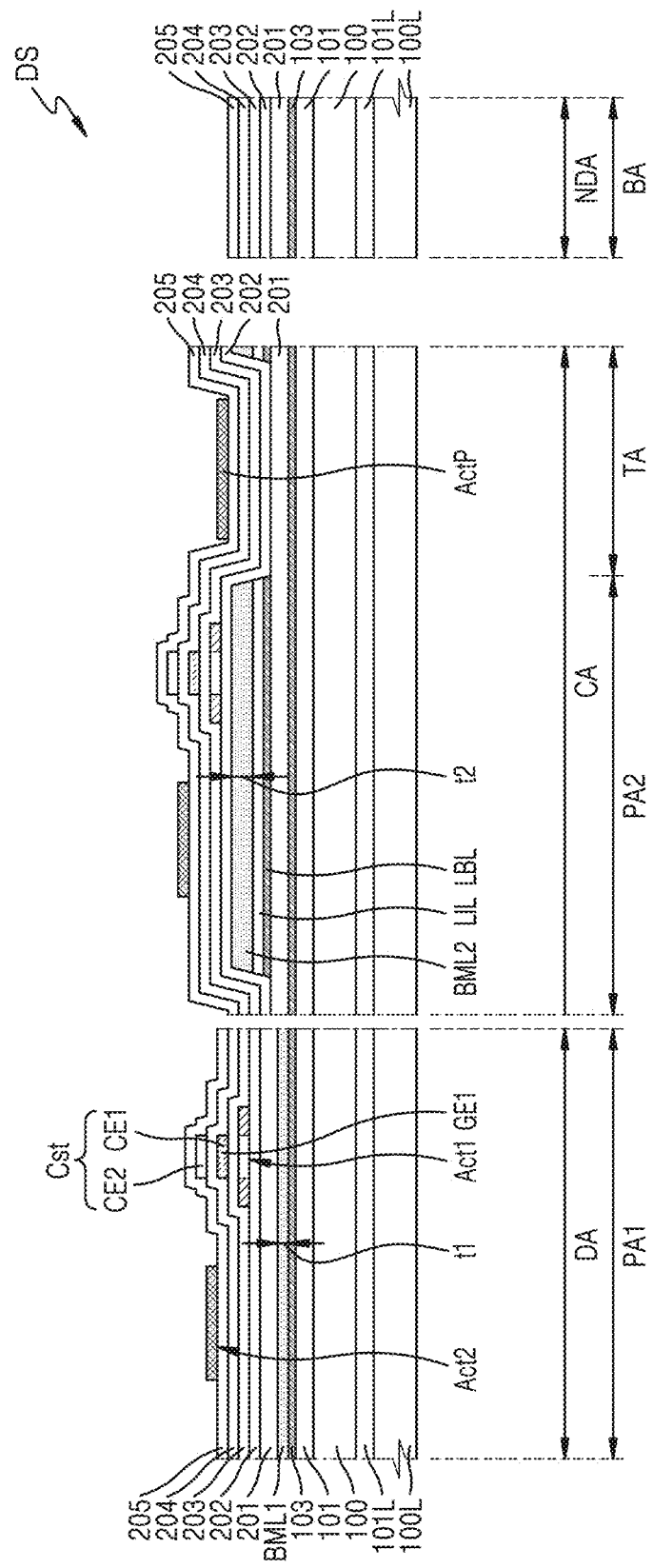

Referring to FIG. 9B, a second semiconductor layer Act2 may be provided or formed. The second semiconductor layer Act2 may be formed on the first inorganic insulating layer 203. In an embodiment, the second semiconductor layer Act2 may be formed on the intermediate insulating layer 205. The second semiconductor layer Act2 may include an oxide semiconductor.

A semiconductor pattern ActP may be provided or formed on the blocking layer 103. In an embodiment, the semiconductor pattern ActP may be formed on the intermediate insulating layer 205. The semiconductor pattern ActP may overlap the transmission area TA. The semiconductor pattern ActP may be formed in a same process as the second semiconductor layer Act2 without an additional process. The semiconductor pattern ActP and the second semiconductor layer Act2 may include a same material as each other. The semiconductor pattern ActP may include an oxide semiconductor.

Figure 9C:
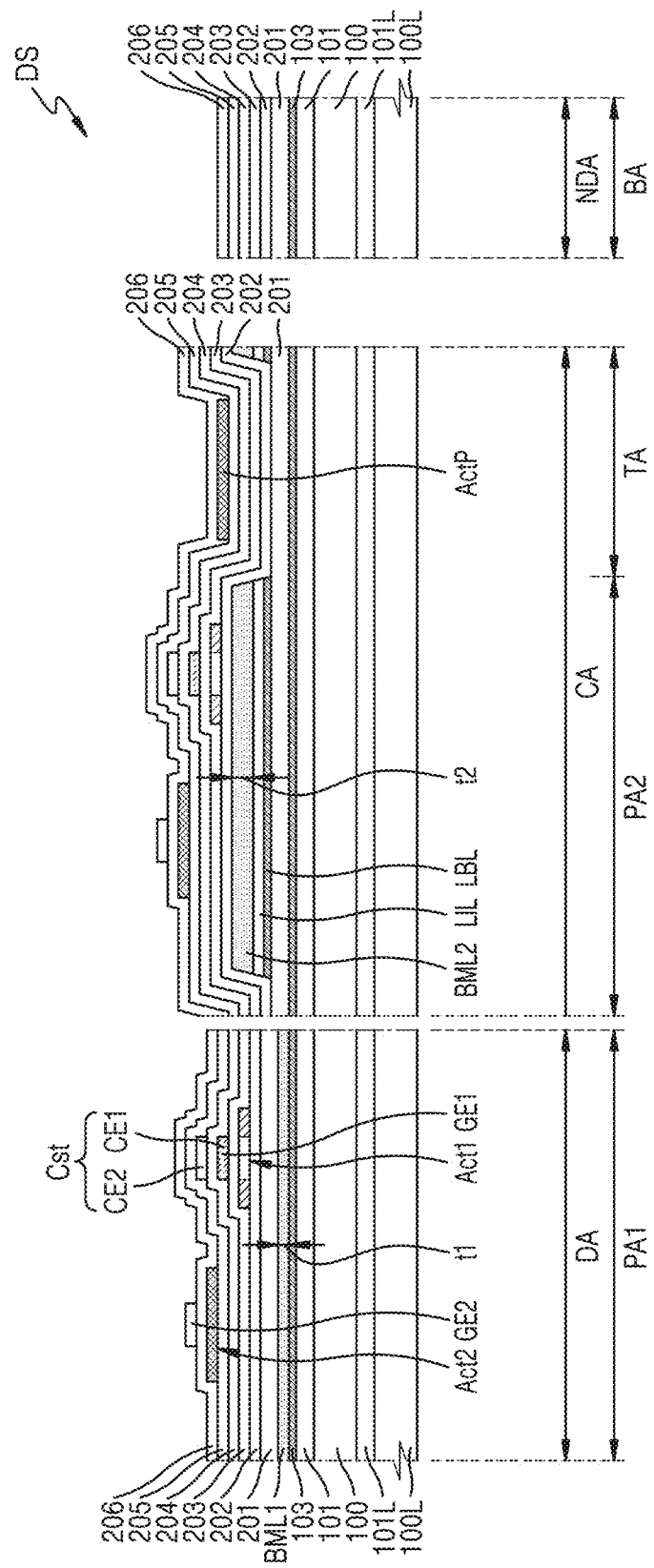

Referring to FIG. 9C, a second inorganic insulating layer 206 may be provided or formed on the second semiconductor layer Act2. In an embodiment, a second inorganic insulating layer 206 may be formed on the semiconductor pattern ActP. The second inorganic insulating layer 206 may be continuously or commonly formed in the first pixel area PA1, the second pixel area PA2, the transmission area TA, and the bending area BA.

A second gate electrode GE2 may be provided or formed on the second inorganic insulating layer 206. The second gate electrode GE2 may overlap the second semiconductor layer Act2.

Figure 9D:
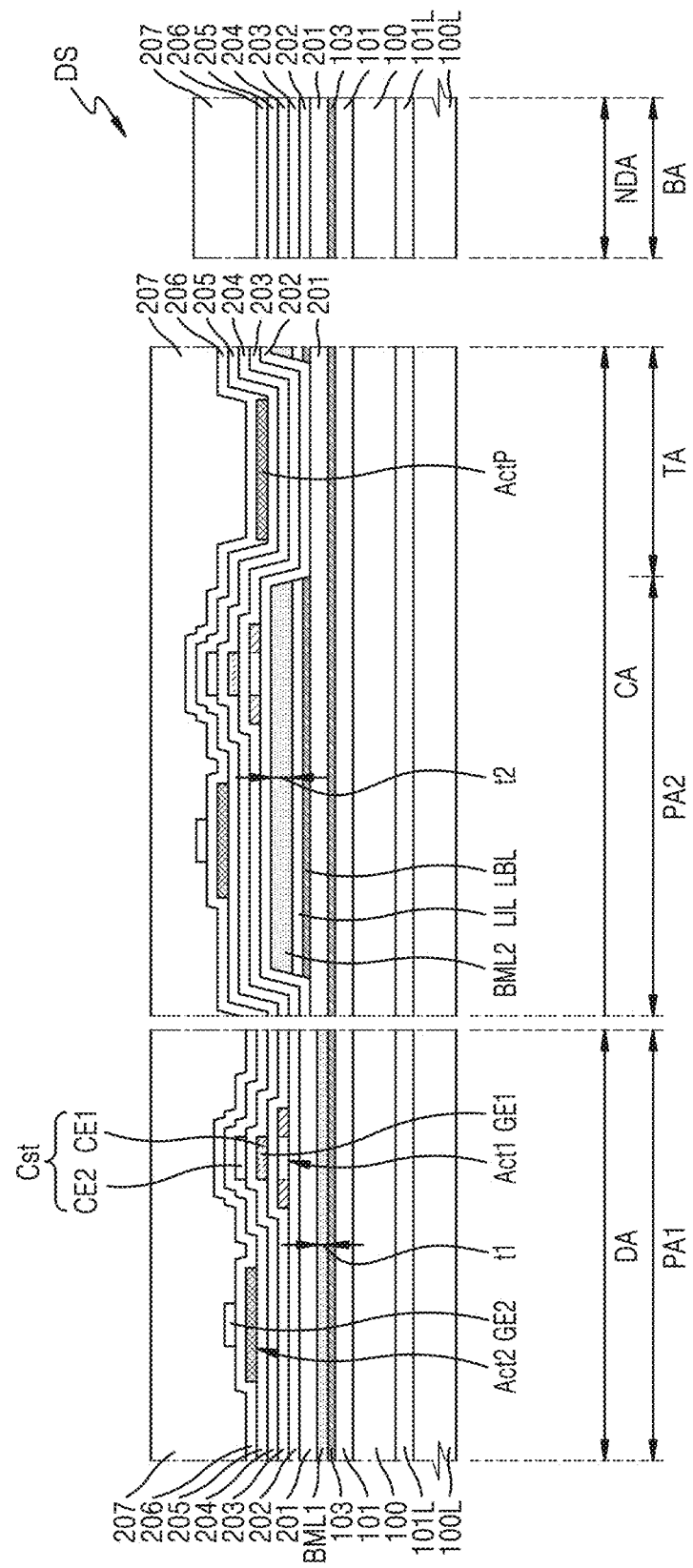

Referring to FIG. 9D, an interlayer insulating layer 207 may be formed. The interlayer insulating layer 207 may be provided or formed on the second inorganic insulating layer 206. The interlayer insulating layer 207 may be continuously or commonly formed in the first pixel area PA1, the second pixel area PA2, the transmission area TA, and the bending area BA.

Figure 9E:
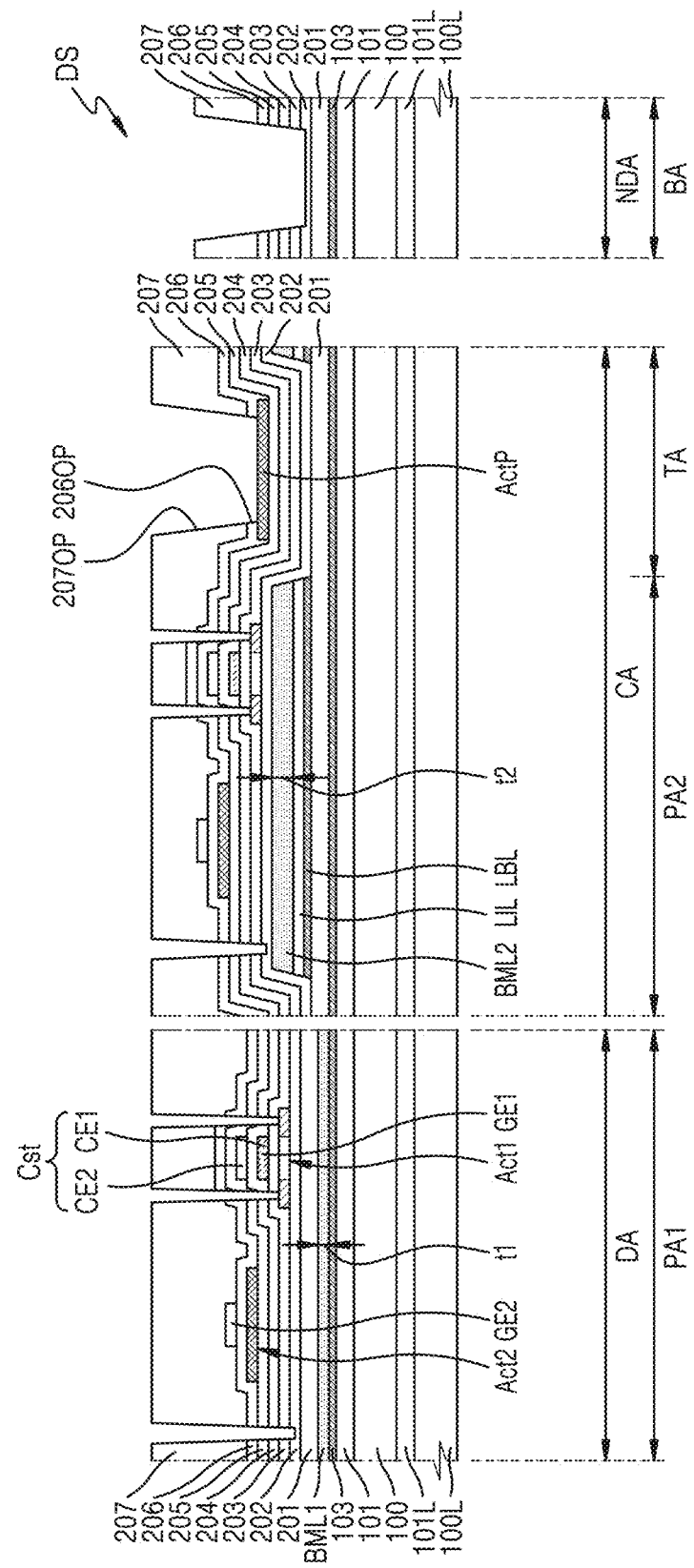

Referring to FIG. 9E, an interlayer insulating layer opening 2070P overlapping the transmission area TA may be formed in the interlayer insulating layer 207. In an embodiment, the process of forming the interlayer insulating layer opening 2070P may be a dry etching process.

Also, a second insulating layer opening 206OP overlapping the transmission area TA may be formed in the second inorganic insulating layer 206.

In an embodiment, at least a portion of the semiconductor pattern ActP may be exposed. In an embodiment, at least a portion of each of the interlayer insulating layer 207 and the second inorganic insulating layer 206 may be removed to expose at least a portion of the semiconductor pattern ActP. In an embodiment, in the case of using gas in which a selectivity ratio of at least one of the interlayer insulating layer 207 and the second inorganic insulating layer 206 with respect to the semiconductor pattern ActP is 30 or more, at least a portion of the semiconductor pattern ActP may be exposed.

In an alternative embodiment, at least a portion of the semiconductor pattern ActP may be removed. In an embodiment, in the case of using gas in which a selectivity ratio of at least one of the interlayer insulating layer 207 and the second inorganic insulating layer 206 with respect to the semiconductor pattern ActP is less than 30, a semiconductor pattern opening may be formed in the semiconductor pattern ActP. Hereinafter, an embodiment in which at least a portion of the semiconductor pattern ActP is exposed will be mainly described in detail.

When the interlayer insulating layer opening 2070P is formed, an opening of the interlayer insulating layer 207 overlapping the bending area BA, an opening of the second inorganic insulating layer 206 overlapping the bending area BA, an opening of the intermediate insulating layer 205 overlapping the bending area BA, an opening of the gate insulating layer 204 overlapping the bending area BA, an opening of the first inorganic insulating layer 203 overlapping the bending area BA, and a groove of the buffer layer 202 may be formed.

In a case in which the semiconductor pattern ActP is omitted, similar to the bending area BA when the interlayer insulating layer opening 207OP is formed, the interlayer insulating layer opening 207OP, the second insulating layer opening 206OP, the opening of the intermediate insulating layer 205 overlapping the transmission area TA, the opening of the gate insulating layer 204 overlapping the transmission area TA, the first insulating layer opening 203OP, and the groove of the buffer layer 202 overlapping the transmission area TA may be formed.

In an embodiment, the semiconductor pattern ActP may be between the intermediate insulating layer 205 and the second inorganic insulating layer 206, and the semiconductor pattern ActP may prevent or reduce the removal of the intermediate insulating layer 205, the gate insulating layer 204, the first inorganic insulating layer 203, the buffer layer 202, the second inorganic layer 201, the blocking layer 103, and the first inorganic layer 101 from the transmission area TA. Therefore, the etching amount of the insulating layers in the transmission area TA may be less than the etching amount of the insulating layers in the bending area BA.

Figure 9F:
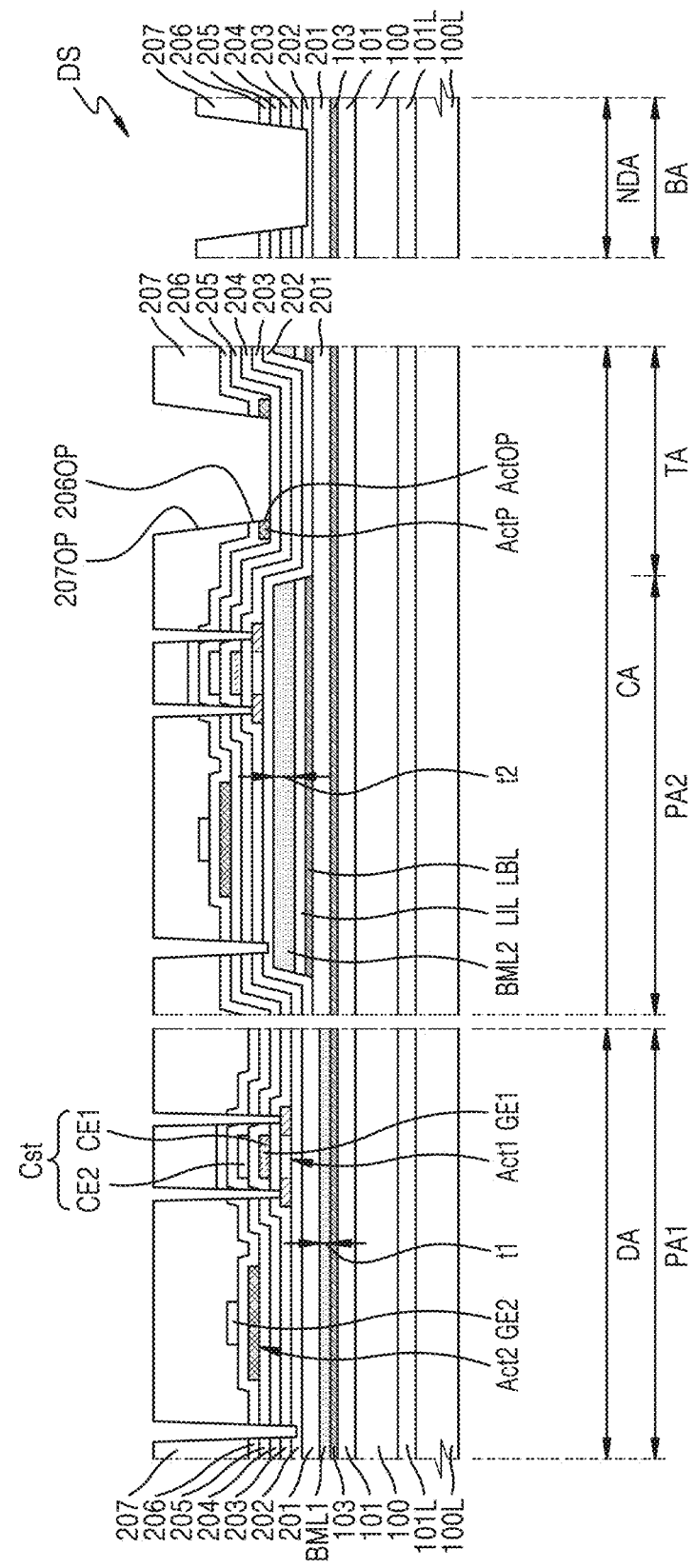

Referring to FIG. 9F, at least a portion of the semiconductor pattern ActP may be removed by wet etching. In an embodiment, for example, the semiconductor pattern ActP may be wet-etched by using ammonium fluoride (NH$_4$F) and hydrogen fluoride (HF). In an embodiment, a semiconductor pattern opening ActOP overlapping the transmission area TA may be formed in the semiconductor pattern ActP.

Figure 9G:
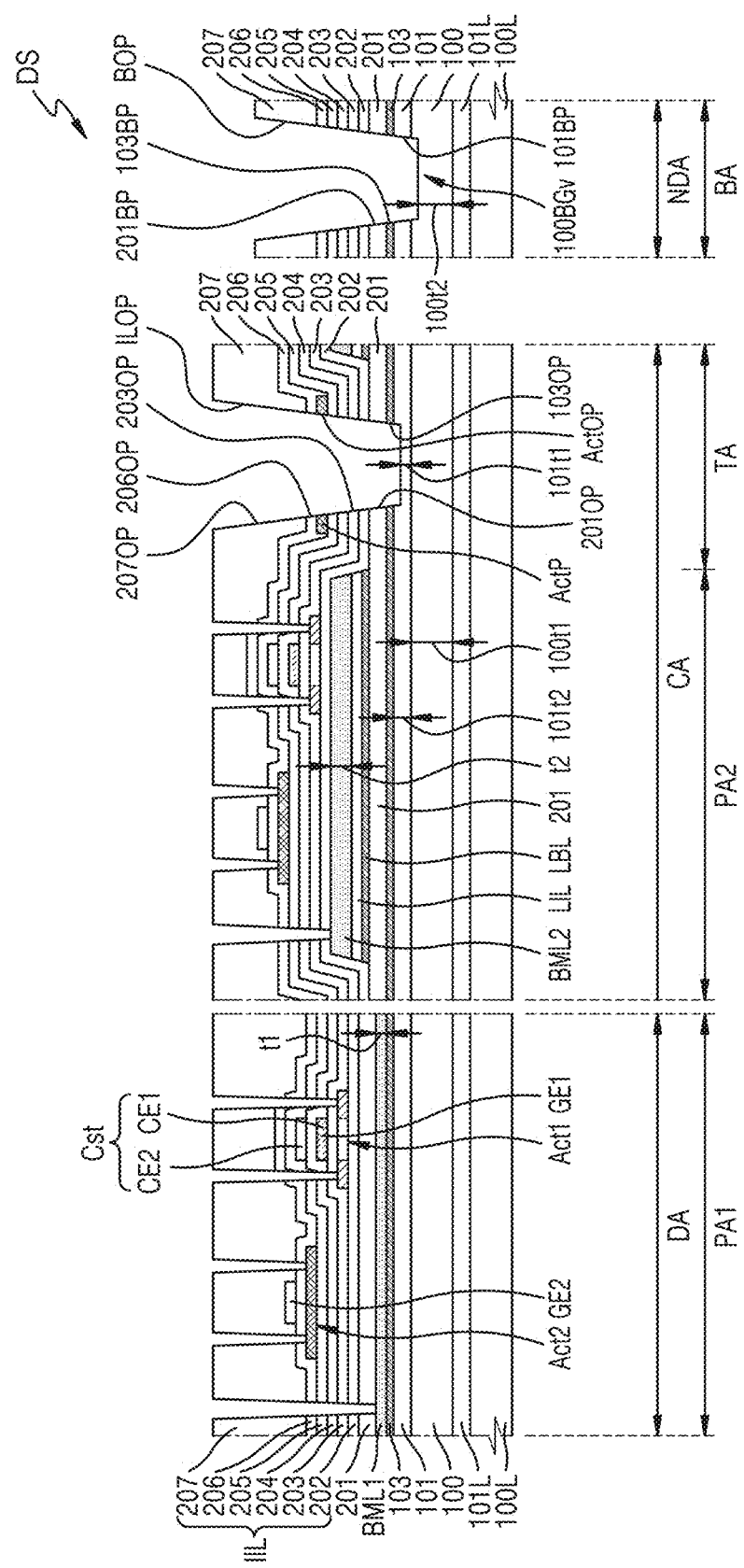

Referring to FIG. 9G, an intermediate insulating layer opening overlapping the transmission area TA may be formed in the intermediate insulating layer 205, a gate insulating layer opening overlapping the transmission area TA may be formed in the gate insulating layer 204, a first insulating layer opening 203P overlapping the transmission area TA may be formed in the first inorganic insulating layer 203, and a buffer layer opening overlapping the transmission area TA may be formed in the buffer layer 202. Therefore, a transmission opening ILOP of the inorganic insulating layer IIL overlapping the transmission area TA may be formed.

An inorganic layer opening 201OP overlapping the transmission area TA may be formed in the second inorganic layer 201. The inorganic layer opening 201OP may overlap the transmission opening ILOP. A blocking layer opening 103OP overlapping the transmission area TA may be formed in the blocking layer 103. The blocking layer opening 103OP may overlap the inorganic layer opening 201OP.

The first inorganic layer 101 may remain in the transmission area TA. The first inorganic layer 101 may be continuously arranged in the second pixel area PA2 and the transmission area TA. In an embodiment, a thickness 101t1 of a portion of the first inorganic layer 101 overlapping the transmission area TA may be less than a thickness 101t2 of another portion of the first inorganic layer 101 overlapping the second pixel area PA2. In such an embodiment, the first inorganic layer 101 may have a groove in the transmission area TA.

An opening overlapping the bending area BA may be formed in the buffer layer 202. In such an embodiment, a bending opening BOP of the inorganic insulating layer IIL overlapping the bending area BA may be formed. An upper opening 201BP overlapping the bending area BA may be formed in the second inorganic layer 201. The upper opening 201BP may overlap the bending opening BOP. An intermediate opening 103BP overlapping the bending area BA may be formed in the blocking layer 103. The intermediate opening 103BP may overlap the upper opening 201BP. A lower opening 101BP overlapping the bending area BA may be formed in the first inorganic layer 101. The lower opening 101BP may overlap the intermediate opening 103BP.

In an embodiment, a bending groove 100BGv overlapping the bending area BA may be formed in the substrate 100. In such an embodiment, a thickness 100t2 of the substrate 100 in the bending area BA may be less than a thickness 100t1 of the substrate 100 in the component area CA. Alternatively, the thickness 100t2 of the substrate 100 in the bending area BA may be less than the thickness 100t1 of the substrate 100 in the transmission area TA.

When the blocking layer opening 103OP is formed, at least a portion of the second semiconductor layer Act2 may be exposed. In such an embodiment, when the blocking layer opening 103OP and the intermediate opening 103BP are formed in the blocking layer 103 and the lower opening 101BP is formed in the first inorganic layer 101, at least a portion of the interlayer insulating layer 207 may be removed to expose at least a portion of the second semiconductor layer Act2.

In an embodiment, when the blocking layer opening 103OP is formed, at least a portion of the first metal layer BML1 and/or the second metal layer BML2 may be exposed.

In an embodiment, the blocking layer opening 103OP overlapping the transmission area TA and the intermediate opening 103BP overlapping the bending area BA may be formed in the blocking layer 103, and the lower opening 101BP overlapping the intermediate opening 103BP may be formed in the first inorganic layer 101. In such an embodiment, the first inorganic layer 101 may remain in the transmission area TA.

The semiconductor pattern ActP may delay the etching process in the transmission area TA, and the first inorganic layer 101 may remain in the transmission area TA. In such an embodiment, because infiltration of moisture or foreign material into the transmission area TA is prevented or reduced, the light transmittance or sound transmittance of the display panel 10 may be increased in the transmission area TA. In such an embodiment, because the first inorganic layer 101, the blocking layer 103, the second inorganic layer 201, and the inorganic insulating layer IL may include openings in the bending area BA, respectively, the manufactured display device and/or display panel may be flexible in the bending area BA.

In such an embodiment, while leaving the first inorganic layer 101 in the transmission area TA without an additional process, the blocking layer opening 103OP overlapping the transmission area TA and the intermediate opening 103BP overlapping the bending area BA may be formed in the blocking layer 103, and the lower opening 101BP overlapping the intermediate opening 103BP may be formed in the first inorganic layer 101. Therefore, a display device having high reliability may be efficiently manufactured.

Figure 10:
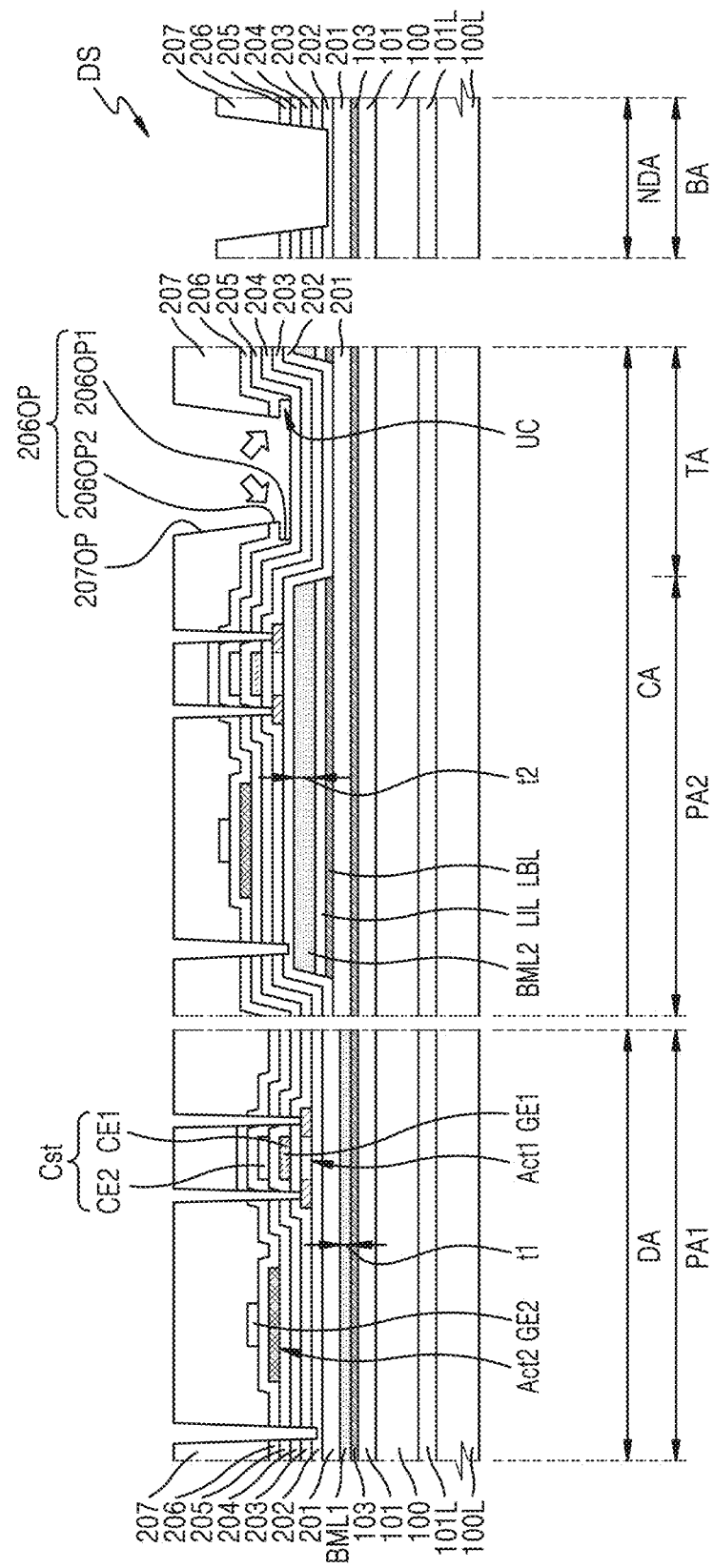
FIG. 10 is a cross-sectional view schematically illustrating a display device that is manufactured by a method of manufacturing a display device, according to an alternative embodiment.

FIG. 10 is a cross-sectional view schematically illustrating a display device that is manufactured by a method of manufacturing a display device, according to an alternative other embodiment. In FIG. 10, the same reference numerals as those of FIG. 9F denote the same elements, and thus, any repetitive detailed descriptions thereof may be omitted.

Referring to FIG. 10, at least a portion of the semiconductor pattern may be removed by wet etching. In an embodiment, for example, the semiconductor pattern may be wet-etched by using ammonium fluoride ($NH_4F$) and hydrogen fluoride (HF). In this case, the semiconductor pattern may be completely removed.

A second insulating layer opening 206OP overlapping the transmission area TA may be formed in the second inorganic insulating layer 206. In an embodiment, the second insulating layer opening 206OP may include a lower insulating layer opening 206OP1 and an upper insulating layer opening 206OP2. The lower insulating layer opening 206OP1 may be closer to the first inorganic layer 101 than the upper insulating layer opening 206OP2. In such an embodiment, the size of the upper insulating layer opening 206OP2 may be less than the size of the lower insulating layer opening 206OP1.

In such an embodiment, the second inorganic insulating layer 206 may be formed to have an undercut shape UC overlapping the transmission area TA. The undercut shape UC may be a shape provided in the second inorganic insulating layer 206 after the removal of the semiconductor pattern including the oxide semiconductor and delaying the etching of the insulating layers overlapping the transmission area TA.

Figure 11A:
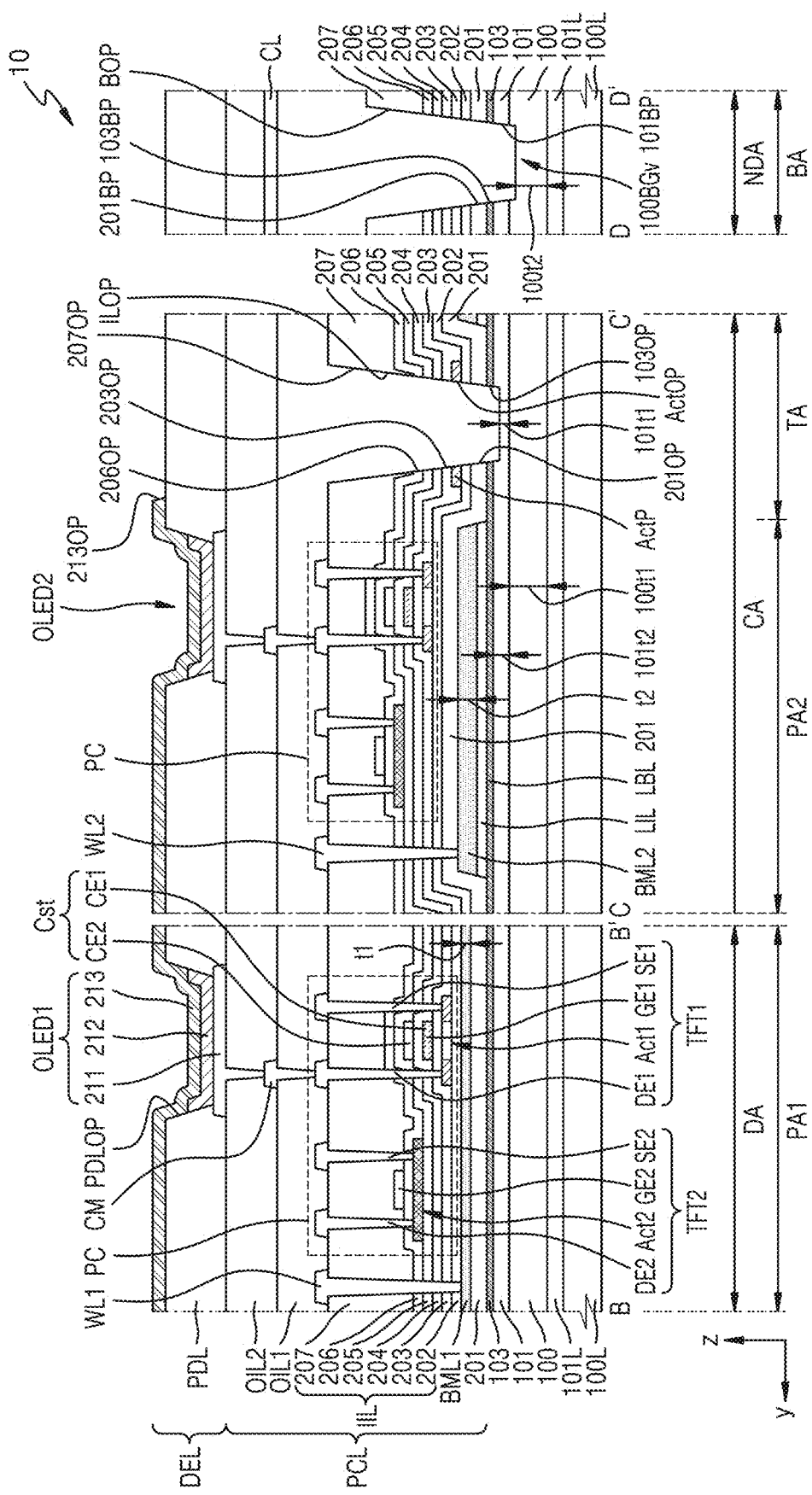
FIGS. 11A and 11B are schematic cross-sectional views of the display panel taken along lines B-B', C-C', and D-D' of FIG. 4, according to various embodiments.
Figure 11B:
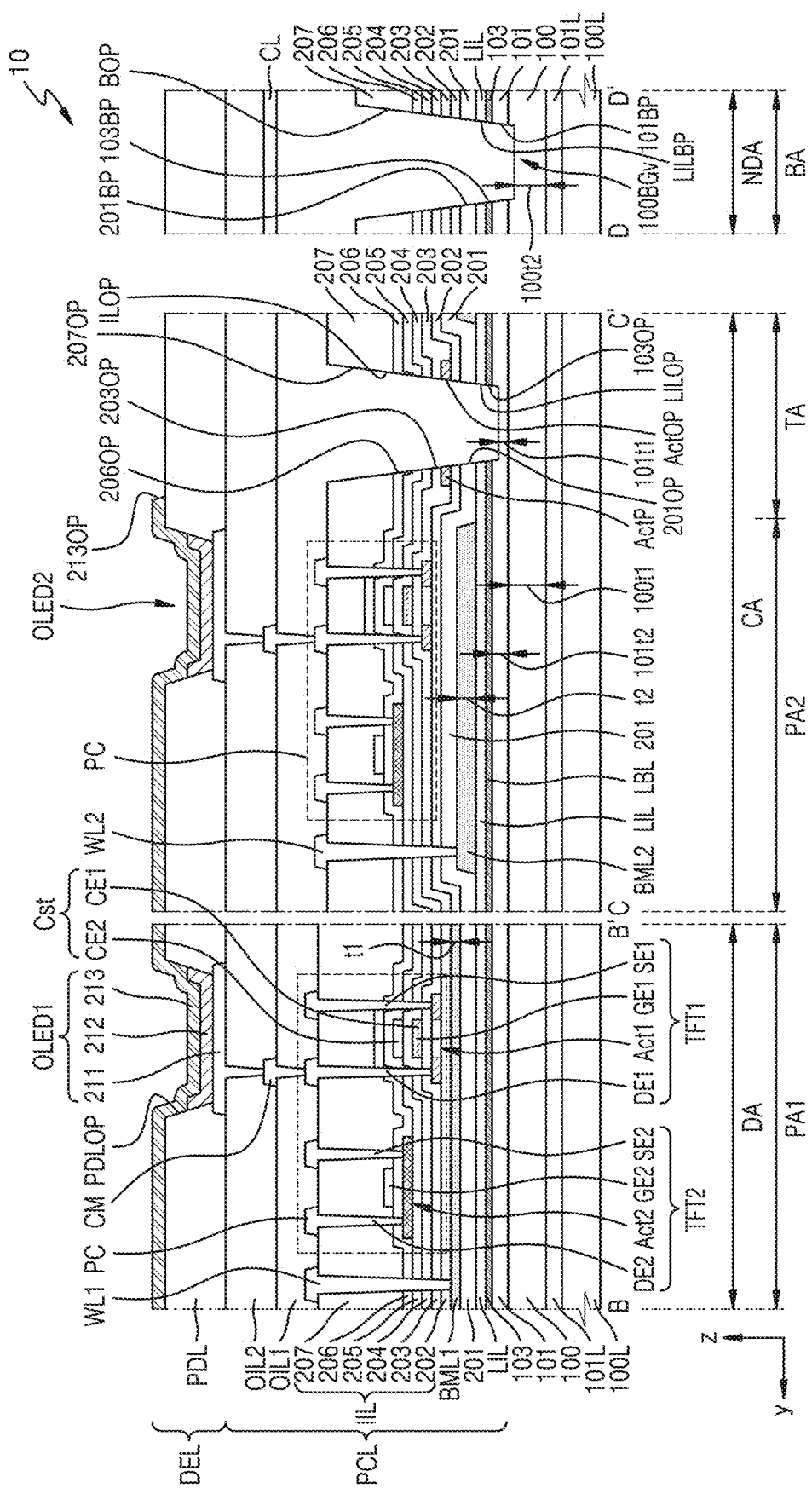

FIGS. 11A and 11B are schematic cross-sectional views of the display panel 10 taken along lines B-B', C-C', and D-D' of FIG. 4, according to various embodiments. In FIGS. 11A and 11B, the same reference numerals as those of FIG. 6 denote the same elements, and thus, any repetitive detailed descriptions thereof may be omitted.

Referring to FIGS. 11A and 11B, an embodiment of the display panel 10 may include a substrate 100, a first inorganic layer 101, an additional organic layer 100L, a first additional inorganic layer 101L, a blocking layer 103, a pixel circuit layer PCL, and a display element layer DEL.

The first inorganic layer 101 may be on the substrate 100. The first inorganic layer 101 may overlap the first pixel area PA1, the second pixel area PA2, and the transmission area TA. In an embodiment, the first inorganic layer 101 may be continuously arranged in the first pixel area PA1, the second pixel area PA2, and the transmission area TA. In such an embodiment, the first inorganic layer 101 may not include an opening in the transmission area TA. Therefore, infiltration of moisture or foreign material into the second pixel area PA2 through the transmission area TA may be prevented or reduced.

The blocking layer 103 may be on the first inorganic layer 101. The blocking layer 103 may include at least one selected from a-Si, poly-Si, crystalline-Si, zinc oxide (ZnO), and IZO. The blocking layer 103 may prevent transmission of light such as ultraviolet rays.

The blocking layer 103 may include a blocking layer opening 103OP overlapping the transmission area TA. In an embodiment, the blocking layer opening 103OP may overlap the groove of the first inorganic layer 101. Because the blocking layer 103 includes the blocking layer opening 103OP overlapping the transmission area TA, the light transmittance of the display panel 10 in the transmission area TA may be increased.

The first metal layer BML1 may overlap the first pixel area PA1. The first metal layer BML1 may have a first thickness t1. The first metal layer BML1 may prevent external light from reaching the thin-film transistor TFT. In an embodiment, a constant voltage or a signal may be applied to the first metal layer BML1, and the first metal layer BML1 may prevent or reduce damage to the pixel circuit PC due to electrostatic discharge. FIGS. 11A and 11B illustrate an embodiment where the first metal layer BML1 overlaps the first thin-film transistor TFT1 and the second thin-film transistor TFT2, but in an alternative embodiment, the first metal layer BML1 may overlap the first thin-film transistor TFT1 and may not overlap the second thin-film transistor TFT2.

The second metal layer BML2 may overlap the second pixel area PA2. In an embodiment, the transmission area TA may be defined as a portion of the component area CA in which the second metal layer BML2 is not arranged. The second metal layer BML2 may have a second thickness t2. In an embodiment, the second thickness t2 may be different from the first thickness t1. In an embodiment, for example, the second thickness t2 may be greater than the first thickness t1. In an alternative embodiment, the second thickness t2 may be less than the first thickness t1. In an alternative embodiment, the second thickness t2 may be equal to the first thickness t1. The second metal layer BML2 may prevent external light from reaching the thin-film transistor TFT. In an embodiment, a constant voltage or a signal may be applied to the second metal layer BML2, and the second metal layer BML2 may prevent or reduce damage to the pixel circuit PC due to electrostatic discharge.

The second inorganic layer 201 may be on the blocking layer 103. The second inorganic layer 201 may overlap the first pixel area PA1 and the second pixel area PA2. In an embodiment, the second inorganic layer 201 may include an inorganic layer opening 201OP overlapping the transmission area TA. The inorganic layer opening 201OP may overlap the blocking layer opening 103OP.

One of the first metal layer BML1 and the second metal layer BML2 may be between the blocking layer 103 and the second inorganic layer 201. Also, the other one of the first metal layer BML1 and the second metal layer BML2 may be on the second inorganic layer 201. In an embodiment, for example, the first metal layer BML1 may be on the second inorganic layer 201. The second metal layer BML2 may be between the blocking layer 103 and the second inorganic layer 201.

A lower blocking layer LBL may be under the second metal layer BML2. In an embodiment, the lower blocking layer LBL and the blocking layer 103 may be provided or integrally formed as a single unitary body. In such an embodiment, the blocking layer 103 may function as the lower blocking layer LBL, such that the lower blocking layer LBL may not be separately formed.

A lower inorganic layer LIL may be between the lower blocking layer LBL and the second metal layer BML2. The lower blocking layer LBL, the lower inorganic layer LIL, and the second metal layer BML2 may prevent or reduce light reflection or scattering in the component area CA.

Referring to FIG. 11A, the lower inorganic layer LIL may overlap the second pixel area PA2 and may not overlap the transmission area TA. In such an embodiment, the lower inorganic layer LIL and the second metal layer BML2 may be formed by patterning in a same process.

Referring to FIG. 11B, the lower inorganic layer LIL may be continuously arranged in the first pixel area PA1 and the second pixel area PA2. The lower inorganic layer LIL may include a lower inorganic layer opening LILOP overlapping the transmission area TA. The lower inorganic layer opening LILOP may overlap the blocking layer opening 103OP. The lower inorganic layer LIL may include a lower inorganic layer bending opening LILBP overlapping the bending area BA. The lower inorganic layer bending opening LILBP may overlap the lower opening 101BP. In such an embodiment, the lower inorganic layer LIL may not be patterned in the process of patterning the second metal layer BML2, and the display panel 10 may be efficiently manufactured.

FIGS. 12A to 12F are cross-sectional views schematically illustrating a display device that is manufactured by a method of manufacturing a display device, according to an alternative embodiment. In FIGS. 12A to 12E, the same reference numerals as those of FIGS. 7A to 7E denote the same elements, and thus, any repetitive detailed descriptions thereof may be omitted.

Figure 12A:
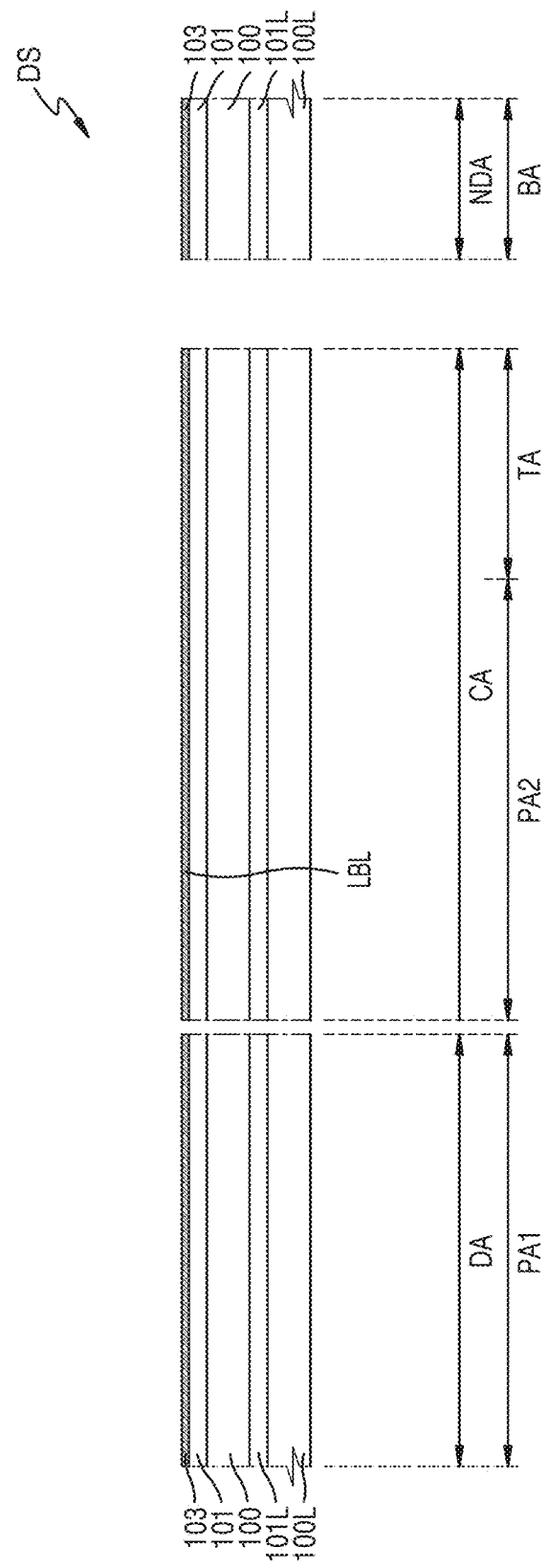
FIGS. 12A to 12F are cross-sectional views schematically illustrating a display device that is manufactured by a method of manufacturing a display device, according to an alternative embodiment.

Referring to FIG. 12A, a display substrate DS may be prepared. The display substrate DS may include a substrate 100, a first inorganic layer 101, an additional organic layer 100L, and a first additional inorganic layer 101L. In an embodiment, the additional organic layer 100L, the first additional inorganic layer 101L, the substrate 100, and the first inorganic layer 101 may be sequentially stacked one on another.

The substrate 100 may include a display area DA, a component area CA, and a non-display area NDA. The display area DA may include a first pixel area PA1. The component area CA may include a second pixel area PA2 and a transmission area TA. The non-display area NDA may include a bending area BA. In an embodiment, the substrate 100 may include an organic material.

The first inorganic layer 101 may be on the substrate 100. The first inorganic layer 101 may be continuously arranged in the first pixel area PA1, the second pixel area PA2, the transmission area TA, and the bending area BA.

A blocking layer 103 may be provided or formed on the first inorganic layer 101. The blocking layer 103 may be formed in the first pixel area PA1, the second pixel area PA2, the transmission area TA, and the bending area BA. The blocking layer 103 may be on the first inorganic layer 101. The blocking layer 103 may include a material capable of blocking light.

The lower blocking layer LBL may be formed in the second pixel area PA2. In an embodiment, the lower blocking layer LBL and the blocking layer 103 may be simultaneously formed in a same process. In such an embodiment, the lower blocking layer LBL and the blocking layer 103 may be provided or integrally formed as a sing unitary body. In such an embodiment, the blocking layer 103 may function as the lower blocking layer LBL. In such an embodiment, a process of separately forming the lower blocking layer LBL may be omitted.

Figure 12B:
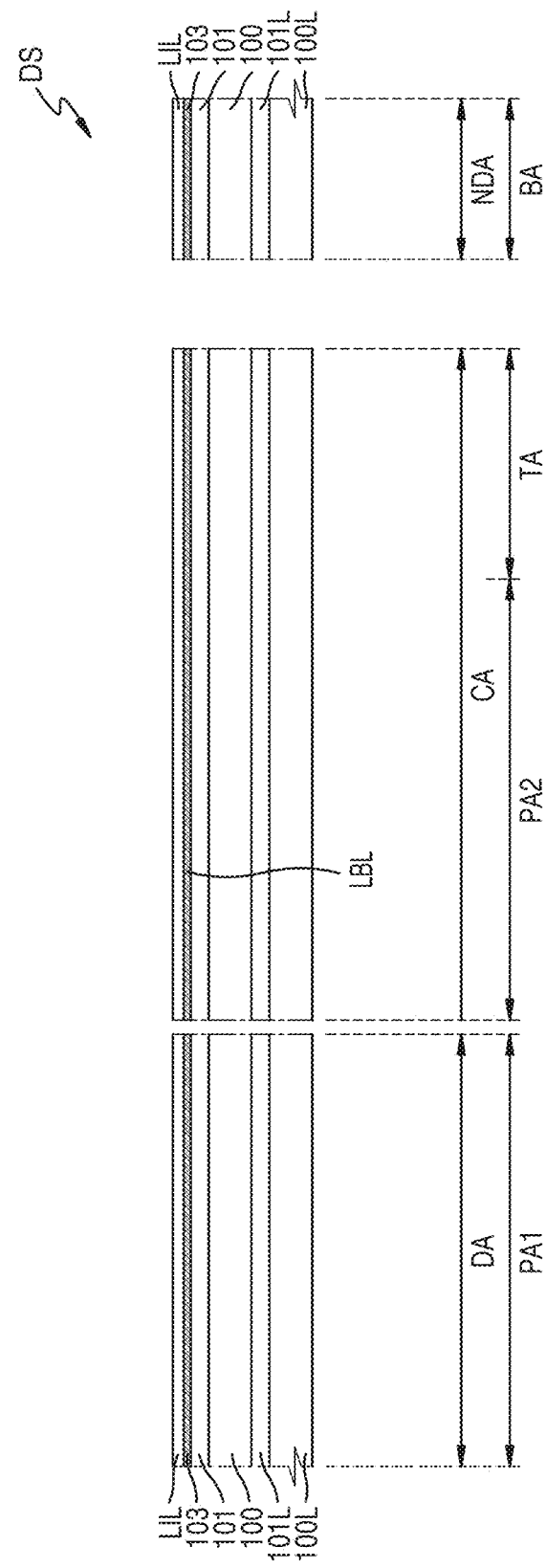

Referring to FIG. 12B, a lower inorganic layer LIL may be provided or formed on the blocking layer 103. The lower inorganic layer LIL may be formed on the lower blocking layer LBL. In an embodiment, the lower inorganic layer LIL may be formed on the blocking layer 103 and the lower blocking layer LBL. The lower inorganic layer LIL may overlap the first pixel area PA1, the second pixel area PA2, the transmission area TA, and the bending area BA.

Figure 12C:
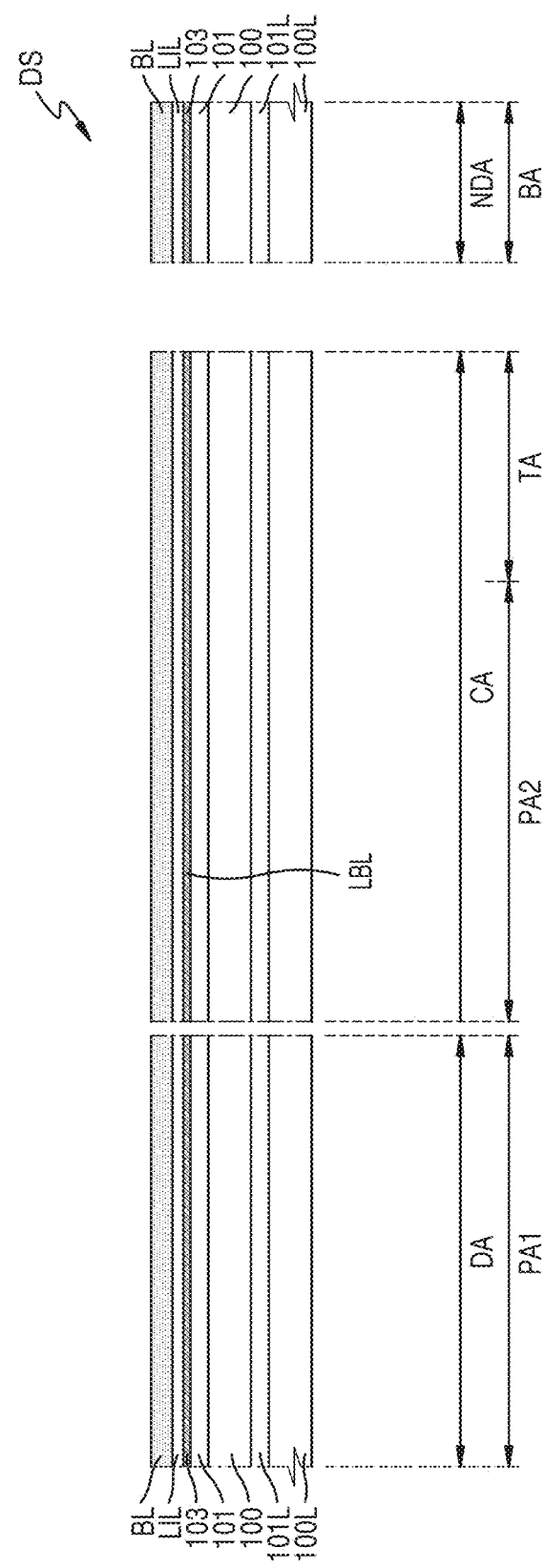
Figure 12D:
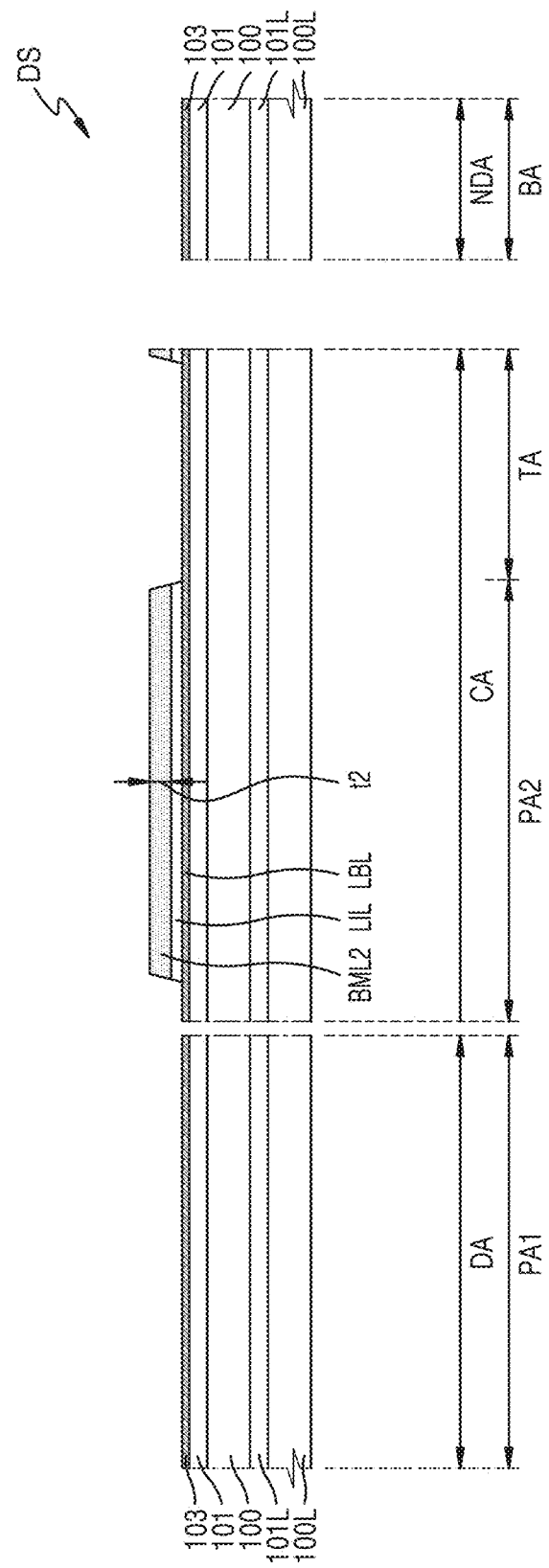

Referring to FIGS. 12C and 12D, a second metal layer BML2 may be provided or formed on the lower inorganic layer LIL. In an embodiment, a metal material-containing layer BL may be formed on the lower inorganic layer LIL. In an embodiment, the metal material may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

At least a portion of the metal material-containing layer BL may be removed. In an embodiment, at least a portion of the lower inorganic layer LIL may be removed. In such an embodiment, at least a portion of the upper surface of the blocking layer 103 may be exposed.

Figure 12E:
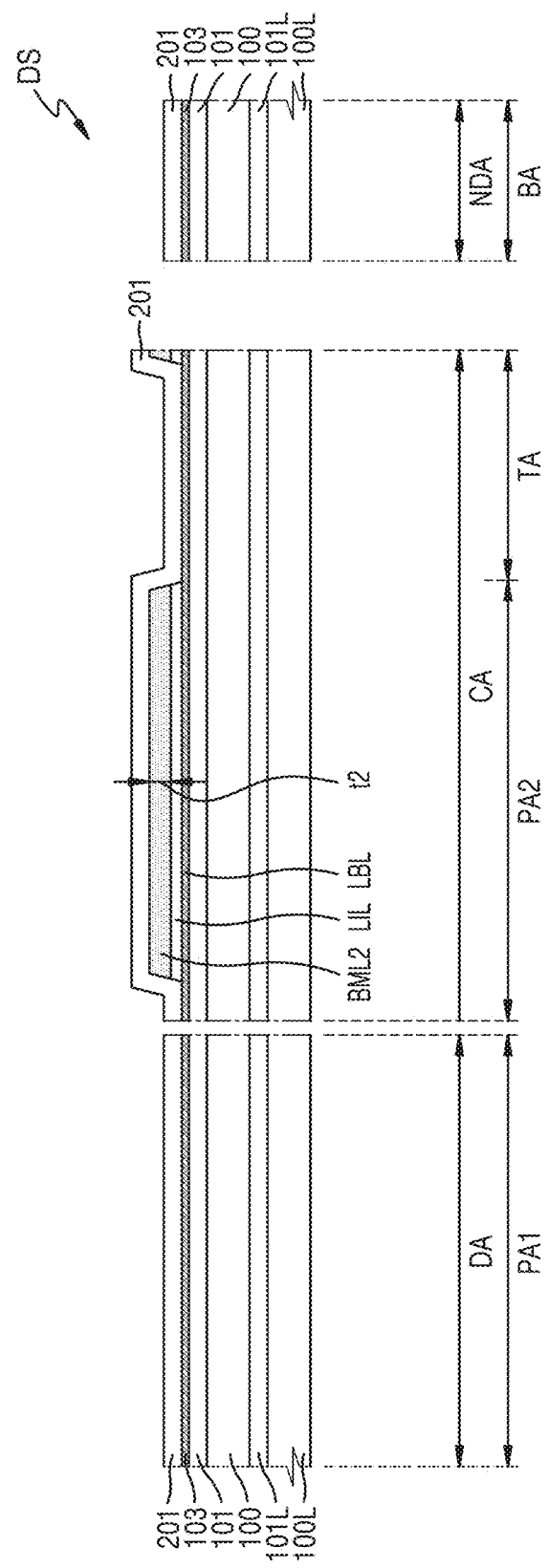

Referring to FIG. 12E, a second inorganic layer 201 may be formed. The second inorganic layer 201 may be completely formed in the first pixel area PA1, the second pixel area PA2, the transmission area TA, and the bending area BA. In an embodiment, after the second metal layer BML2 is formed, the second inorganic layer 201 may be formed. Therefore, the second inorganic layer 201 may cover the second metal layer BML2.

Figure 12F:
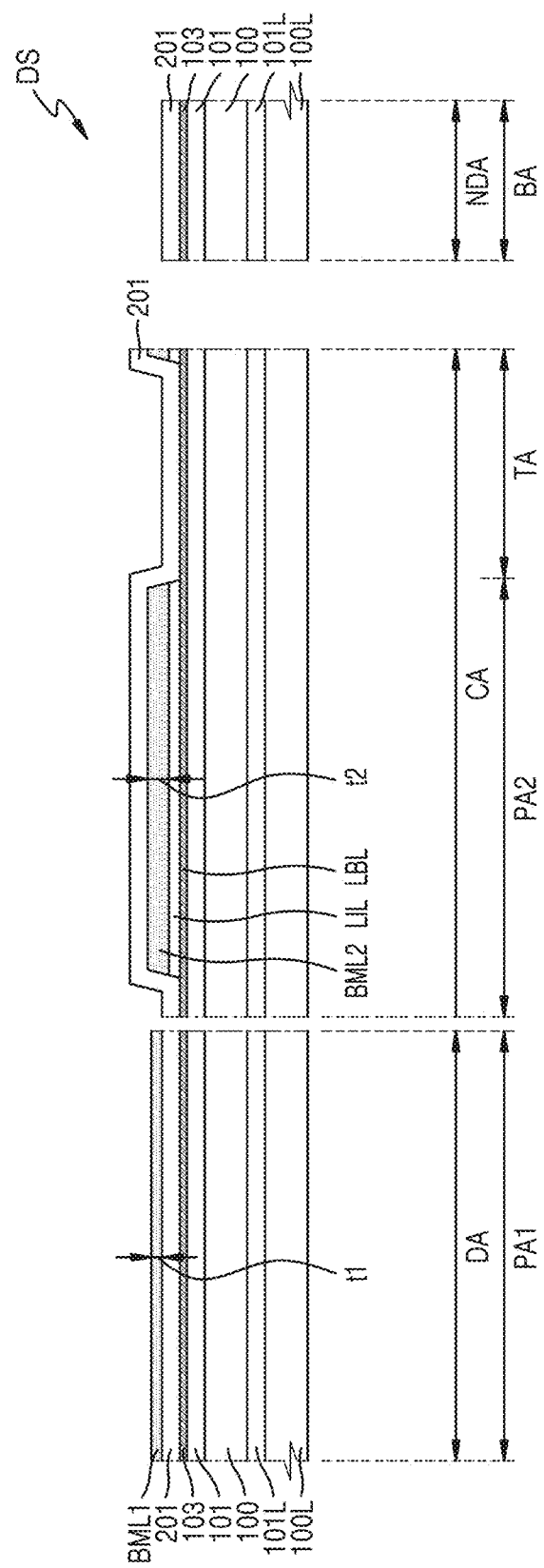

Referring to FIG. 12F, a first metal layer BML1 may be provided or formed. After the second inorganic layer 201 is formed, the first metal layer BML1 may be formed. Therefore, the first metal layer BML1 may be on the second inorganic layer 201. FIG. 12F illustrates an embodiment where the first metal layer BML1 is completely in the display area DA, but in an alternative embodiment, the first metal layer BML1 may be only in a portion of the display area DA.

Figure 13A:
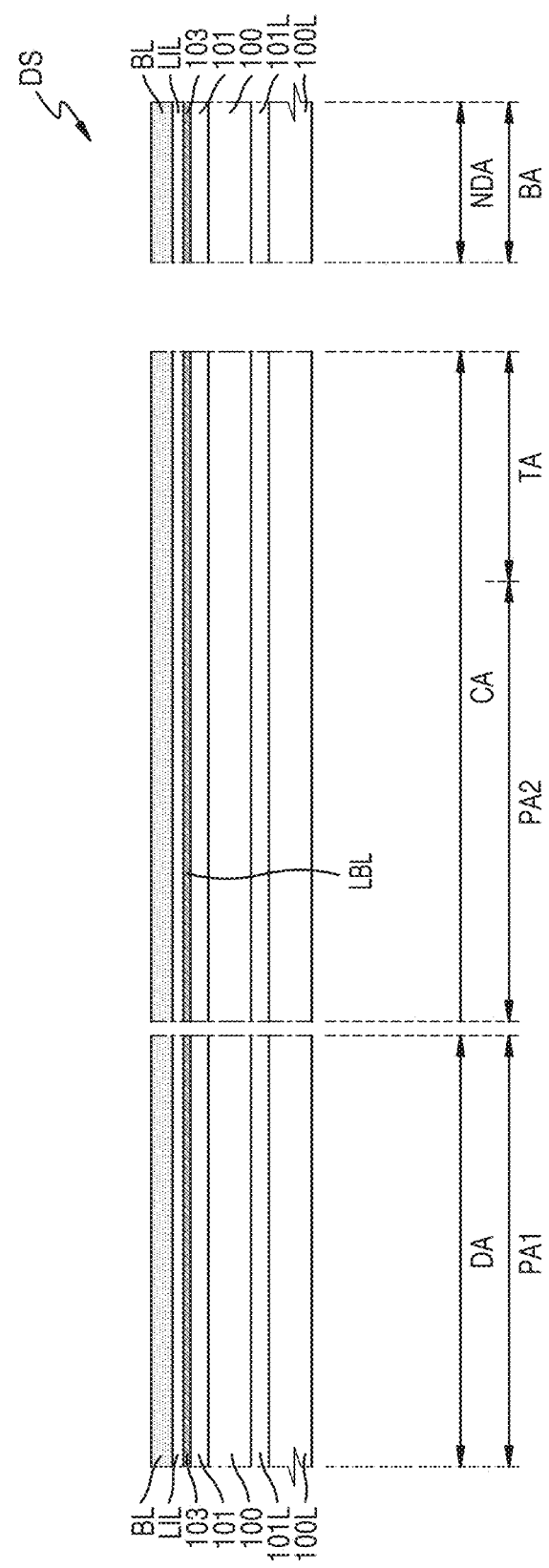
FIGS. 13A and 13B are cross-sectional views schematically illustrating a display device that is manufactured by a method of manufacturing a display device, according to an alternative embodiment.
Figure 13B:
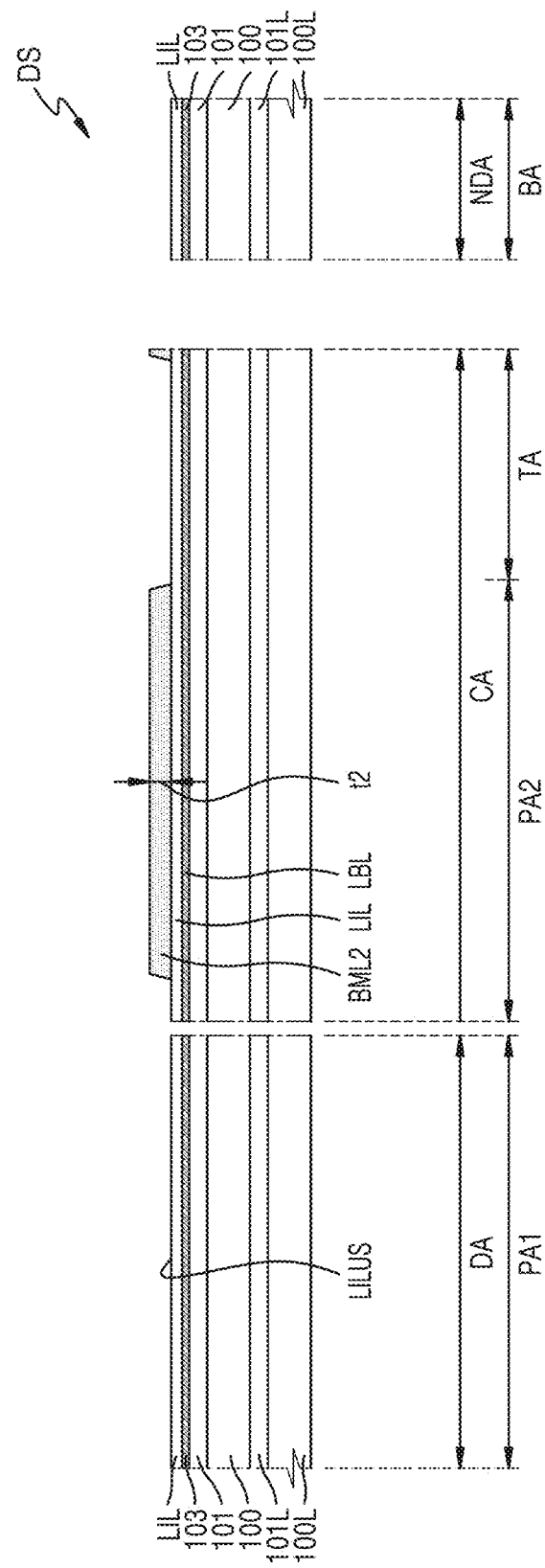

FIGS. 13A and 13B are cross-sectional views schematically illustrating a display device that is manufactured by a method of manufacturing a display device, according to an alternative embodiment. In FIGS. 13A and 13B, the same reference numerals as those of FIGS. 12C and 12D denote the same elements, and thus, any repetitive detailed descriptions thereof may be omitted.

Referring to FIGS. 13A and 13B, a second metal layer BML2 may be provided or formed on a lower inorganic layer LIL. In an embodiment, a metal material-containing layer BL may be formed on the lower inorganic layer LIL.

At least a portion of the metal material-containing layer BL may be removed. In an embodiment, after the second metal layer BML2 is formed, at least a portion of an upper surface LILUS of the lower inorganic layer LIL may be exposed. In such an embodiment, the process time may be reduced, and the display panel and/or the display device may be efficiently manufactured.

As described above, embodiments of the display device according to the invention may include the first inorganic layer continuously in the transmission area and including the lower opening overlapping the bending area, the blocking layer opening on the first inorganic layer and overlapping the transmission area, and the intermediate opening overlapping the lower opening. Therefore, because the display device prevents or reduces infiltration of moisture or foreign material in the transmission area, the light transmittance may be increased in the transmission area and the display device may be flexible in the bending area.

Embodiments of the method of manufacturing the display device, according to the invention, may include forming the blocking layer opening overlapping the transmission area and the intermediate opening overlapping the bending area through the blocking layer, and forming the lower opening overlapping the intermediate opening through the first inorganic layer. The first inorganic layer may remain in the transmission area. Therefore, because infiltration of moisture or foreign material in the transmission area is prevented or reduced without adding a process, the light transmittance in the transmission area may be increased.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate comprising a display area including a first pixel area, a component area adjacent to the display area, and a non-display area adjacent to the display area, wherein the component area includes a second pixel area and a transmission area, and the non-display area includes a bending area;
a first inorganic layer continuously arranged in the transmission area on the substrate, wherein a lower opening overlapping the bending area of the non-display area is defined through the first inorganic layer;
a blocking layer on the first inorganic layer, wherein the blocking layer overlaps the display area, the component area and the bending area, a blocking layer opening overlapping the transmission area, and an intermediate opening overlapping the lower opening are defined through the blocking layer; and
a display element layer on the blocking layer, wherein the display element layer comprises a first display element overlapping the first pixel area, and a second display element overlapping the second pixel area.

2. The display device of claim 1, wherein the blocking layer comprises amorphous silicon.

3. The display device of claim 1, wherein a thickness of the first inorganic layer overlapping the transmission area is less than a thickness of the first inorganic layer overlapping the second pixel area.

4. The display device of claim 1, further comprising:
a pixel circuit layer between the blocking layer and the display element layer, wherein the pixel circuit layer comprises:
a first semiconductor layer on the blocking layer, wherein the first semiconductor layer comprises a silicon semiconductor;
a first inorganic insulating layer on the first semiconductor layer, wherein a first insulating layer opening overlapping the blocking layer opening is defined through the first inorganic insulating layer;
a second semiconductor layer on the first inorganic insulating layer, wherein the second semiconductor layer comprises an oxide semiconductor; and
a second inorganic insulating layer on the second semiconductor layer, wherein a second insulating layer opening overlapping the blocking layer opening is defined through the second inorganic insulating layer.

5. The display device of claim 4, wherein
the pixel circuit layer further comprises a semiconductor pattern between the blocking layer and the first inorganic insulating layer and overlapping the transmission area, and
the semiconductor pattern and the first semiconductor layer comprise a same material as each other.

6. The display device of claim 4, wherein
the pixel circuit layer further comprises a semiconductor pattern between the first inorganic insulating layer and the second inorganic insulating layer and overlapping the transmission area, and
the semiconductor pattern and the second semiconductor layer comprise a same material as each other.

7. The display device of claim 4, wherein
the second insulating layer opening comprises an upper insulating layer opening and a lower insulating layer opening closer to the first inorganic layer than the upper insulating layer opening, and
a size of the upper insulating layer opening is less than a size of the lower insulating layer opening.

8. The display device of claim 1, further comprising:
a pixel circuit layer between the blocking layer and the display element layer, wherein the pixel circuit layer comprises:
a first metal layer overlapping the first pixel area and having a first thickness;
a second metal layer overlapping the second pixel area and having a second thickness which is different from the first thickness;
a lower blocking layer under the second metal layer; and
a second inorganic layer through which an inorganic layer opening overlapping the transmission area is defined,
wherein one of the first metal layer and the second metal layer is between the blocking layer and the second inorganic layer, and
the other of the first metal layer and the second metal layer is on the second inorganic layer.

9. The display device of claim 8, wherein
the first metal layer is on the second inorganic layer,
the second metal layer is between the blocking layer and the second inorganic layer, and
the lower blocking layer and the blocking layer are provided as a single unitary body.

10. The display device of claim 9, wherein
the pixel circuit layer further comprises a lower inorganic layer between the lower blocking layer and the second metal layer, wherein a lower inorganic layer opening overlapping the transmission area is defined through the lower inorganic layer, and
the lower inorganic layer is between the blocking layer and the second inorganic layer in the first pixel area.

11. The display device of claim 1, further comprising:
a component overlapping the component area.

* * * * *